(12) United States Patent
Xu et al.

(10) Patent No.: US 12,410,537 B2
(45) Date of Patent: Sep. 9, 2025

(54) FABRICATION PROCESS FOR FLEXIBLE SINGLE-CRYSTAL PEROVSKITE DEVICES

(71) Applicant: THE REGENTS OF THE UNIVERSITY OF CALIFORNIA, Oakland, CA (US)

(72) Inventors: Sheng Xu, La Jolla, CA (US); Yusheng Lei, La Jolla, CA (US); Yimu Chen, La Jolla, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 219 days.

(21) Appl. No.: 18/010,335

(22) PCT Filed: Jun. 24, 2021

(86) PCT No.: PCT/US2021/038803
§ 371 (c)(1),
(2) Date: Dec. 14, 2022

(87) PCT Pub. No.: WO2021/262923
PCT Pub. Date: Dec. 30, 2021

(65) Prior Publication Data
US 2023/0250548 A1     Aug. 10, 2023

Related U.S. Application Data

(60) Provisional application No. 63/043,961, filed on Jun. 25, 2020.

(51) Int. Cl.
*C30B 7/06*     (2006.01)
*C30B 7/00*     (2006.01)
*C30B 29/12*    (2006.01)

(52) U.S. Cl.
CPC ............... *C30B 7/06* (2013.01); *C30B 7/005* (2013.01); *C30B 29/12* (2013.01)

(58) Field of Classification Search
CPC ............ C30B 7/06; C30B 7/005; C30B 29/12
See application file for complete search history.

(56) References Cited

U.S. PATENT DOCUMENTS 5,073,230 A    12/1991   Maracas
6,210,592 B1    4/2001   Hunt
(Continued)

FOREIGN PATENT DOCUMENTS

WO       2019/100041 A1    5/2019

OTHER PUBLICATIONS

Fu et al., Compositionally Graded Absorber for Efficient and Stable Near-Infrared-Transparent Perovskite Solar Cells, Advanced Science, Jan. 5, 2018, vol. 5, No. 3.

*Primary Examiner* — Robert M Kunemund
(74) *Attorney, Agent, or Firm* — Stuart H. Mayer; Kaplan Breyer Schwarz LLP

(57) ABSTRACT

A method of fabricating an ionic crystal includes providing a single crystal substrate of an ionic crystal material is provided. A patterned mask is applied over the single crystal substrate A growth solution is introduced over the single crystal substrate. The growth solution includes precursors for epitaxial growth of the ionic crystal material on the single crystal substrate such that epitaxial crystals grow over time through pattern openings in the patterned mask into a crystal structure with one or more morphologies.

16 Claims, 75 Drawing Sheets

STEP 1

STEP 2

EPITAXIAL CRYSTALS $L_{x-y}=L_z$
FILL OUT THE MASK.

STEP 3

THE MINIMAL CONTROLLED THICKNESS EQUALS TO THE HALF VALUE OF THE PATTERN DISTANCE.
THICKNESS=$L_z=L_{x-y}=L_p/2$
CRYSTAL 1  CRYSTAL 2

STEP 4

THE CRYSTALS CAN ONLY GROW VERTICALLY AFTER MERGING.
GROWTH DIRECTION

(56) References Cited

U.S. PATENT DOCUMENTS

| | | | |
|---|---|---|---|
| 11,572,035 B2* | 2/2023 | Galan-Oliveras | G06V 20/593 |
| 2014/0370647 A1 | 12/2014 | Garnett | |
| 2017/0288159 A1 | 10/2017 | Ko et al. | |
| 2020/0299861 A1* | 9/2020 | Xu | H10K 50/115 |

* cited by examiner

FABRICATION PROCESS FOR FLEXIBLE SINGLE-CRYSTAL PEROVSKITE DEVICES

BACKGROUND

Organic—inorganic hybrid perovskites have electronic and optoelectronic properties that make them appealing in many device applications such as photovoltaics. Compared to their well-studied polycrystalline counterpart, single-crystal perovskites have shown higher carrier transport efficiency and stability due to lower defect concentrations. Besides, their uniform orientations provide possible approaches to understand the orientation-dependent carrier behaviors, where the variations are ascribed to anisotropically distributed trap densities. Highly oriented near-single-crystal polycrystalline perovskite photovoltaics with enhanced performance have been reported, indicating an exquisite control of crystal orientation can be an effective strategy to boost the photovoltaic efficiency, which is impossible to achieve in polycrystalline photovoltaics due to the random grain.

However, challenges for single-crystal perovskite photovoltaics remain in terms of material growth: no growth method has demonstrated simultaneous control over material thickness and area, or growth of a single crystal with a composition gradient, yet these are closely tied to photovoltaic performance. For optimal charge carrier collection efficiency in hybrid perovskite devices, a film needs to be sufficiently thin; for practical device integration, the thin film needs to be grown over a reasonably large area.

So far, several attempts have been reported to control the crystal dimensions, such as mechanical cutting, roll-imprinting, and space confinement. However, those methods either lack precisely control in both the thickness and area or have strict substrate condition requirements. single-crystal $MAPbI_3$ based photovoltaics was reported with 21% efficiency by the space confinement method. However, clamping growth solutions between two holders for the crystal growth into the nano/micro scale in a controllable way is challenging. Crystallization will always happen at the interface with the air by solvent evaporation, which disturbs the following thin crystal growth. Any solvent residues can result in serious interface hydration formation and dissolve the charge transport layers assembled during the thin film growth process. The roll-imprinting method for fabricating single-crystal $MAPbI_3$ photovoltaics was reported with 4% efficiency. Even though the thickness of as-fabricated single-crystal $MAPbI_3$ can reach 500 nm, the requirements on the printing substrate restrict the device structure to be lateral, which limits the performance of subsequent devices. Thin single-crystal $MAPbI_3$ films could also be fabricated by mechanical cutting and etching. However, the thickness is still not considered to be sufficiently thin, and the wet chemical etching may damage the perovskites as well. More importantly, none of the existing crystal growth methods have achieved the material composition gradient, and thus the graded bandgap in hybrid perovskite crystals, despite its potential ability to maximize light absorption and enhance carrier collection efficiency.

SUMMARY

In accordance with one aspect of the subject matter described herein, a method of fabricating an ionic crystal is provided. In accordance with the method, a single crystal substrate of an ionic crystal material is provided. A patterned mask is applied over the single crystal substrate A growth solution is introduced over the single crystal substrate. The growth solution includes precursors for epitaxial growth of the ionic crystal material on the single crystal substrate such that epitaxial crystals grow over time through pattern openings in the patterned mask into a crystal structure with one or more morphologies.

In accordance with another aspect, the patterned mask and the crystal structure grown on the substrate are removed from the growth solution as an assembled unit.

In accordance with another aspect, the single crystal substrate is detached from the patterned mask and the crystal structure so that a subassembly of the patterned mask and the crystal structure remains. The subassembly is transferred onto a second substrate.

In accordance with another aspect, the patterned mask is removed from the subassembly so that the crystal structure remains attached to the second substrate.

In accordance with another aspect, an antisolvent is applied to a surface of the second substrate or a surface of the crystal structure prior to the transferring.

In accordance with another aspect, a layer of the growth solution is applied onto a surface of the second substrate prior to the transferring.

In accordance with another aspect, the second substrate is heated after the transferring to facilitate a secondary re-growth process of crystals from the growth solution.

In accordance with another aspect, a concentration of the precursors in the growth solution is changed while the crystal structure is growing to thereby form a compositionally graded crystal structure.

In accordance with another aspect, the concentration of the precursors is continuously changed during at least a portion of time that the crystal structure is growing.

In accordance with another aspect, the ionic crystal material includes a perovskite.

In accordance with another aspect, the perovskite includes an organic-inorganic hybrid perovskite.

In accordance with another aspect, a rate of growth of the crystals in different directions is adjusted by adjusting a growth capping agent, growth temperature, and/or a concentration of the precursors.

In accordance with another aspect, the growth solution is a supersaturated growth solution.

In accordance with another aspect, the patterned mask is formed from a polymer or metal.

In accordance with another aspect, the patterned mask is flexible.

In accordance with another aspect, the patterned mask is rigid.

In accordance with another aspect, the one or more morphologies of the crystal structure are selected from the group consisting of a thin film, a cubic structure and a pyramidal structure.

In accordance with another aspect, an ionic crystal structure is formed in accordance with any of the aspects of the methods described herein.

In accordance with another aspect, the ionic crystal structure forms a part of a device selected from the group consisting of a photodetector, laser, memory device, light emitting diode (LED) or LED array.

In accordance with another aspect, the ionic crystal structure forms a part of an LED array having a pixel size between 100 nm and 1 mm.

In accordance with another aspect, the ionic crystal structure forms a part of a photovoltaic device.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Furthermore, the claimed subject matter is not limited to implementations that solve any or all disadvantages noted in any part of this disclosure. These and various other features will be apparent from a reading of the following Detailed Description and a review of the associated drawings.

BRIEF DESCRIPTION OF THE DRAWINGS

16b shows interfacial Hall mobility results.

DETAILED DESCRIPTION

Overview

As described in more detail below, a solution-based lithography-assisted-epitaxial-growth-transfer method is provided for fabricating ionic crystals such as, for example, single-crystal hybrid perovskites, on arbitrary substrates, with precise control over their thickness (e.g., from about 600 nm to about 100 µm), area (e.g., continuous thin films up to about 5.5 cm by 5.5 cm), and composition gradient in the thickness direction (e.g., from MAPbI$_3$ to MAPb$_{0.5}$Sn$_{0.5}$I$_3$). The transferred single-crystal hybrid perovskites are of comparable quality to those directly grown on epitaxial substrates and are mechanically flexible depending on thickness. Pb—Sn gradient alloying allows the formation of a graded electronic bandgap, which increases the carrier mobility and impedes carrier recombination. Devices based on these single-crystal hybrid perovskites exhibit not only high stability against various degradation factors but also good performance (e.g., solar cells based on Pb—Sn-gradient structures with an average efficiency of 18.77%).

Figure 1A:
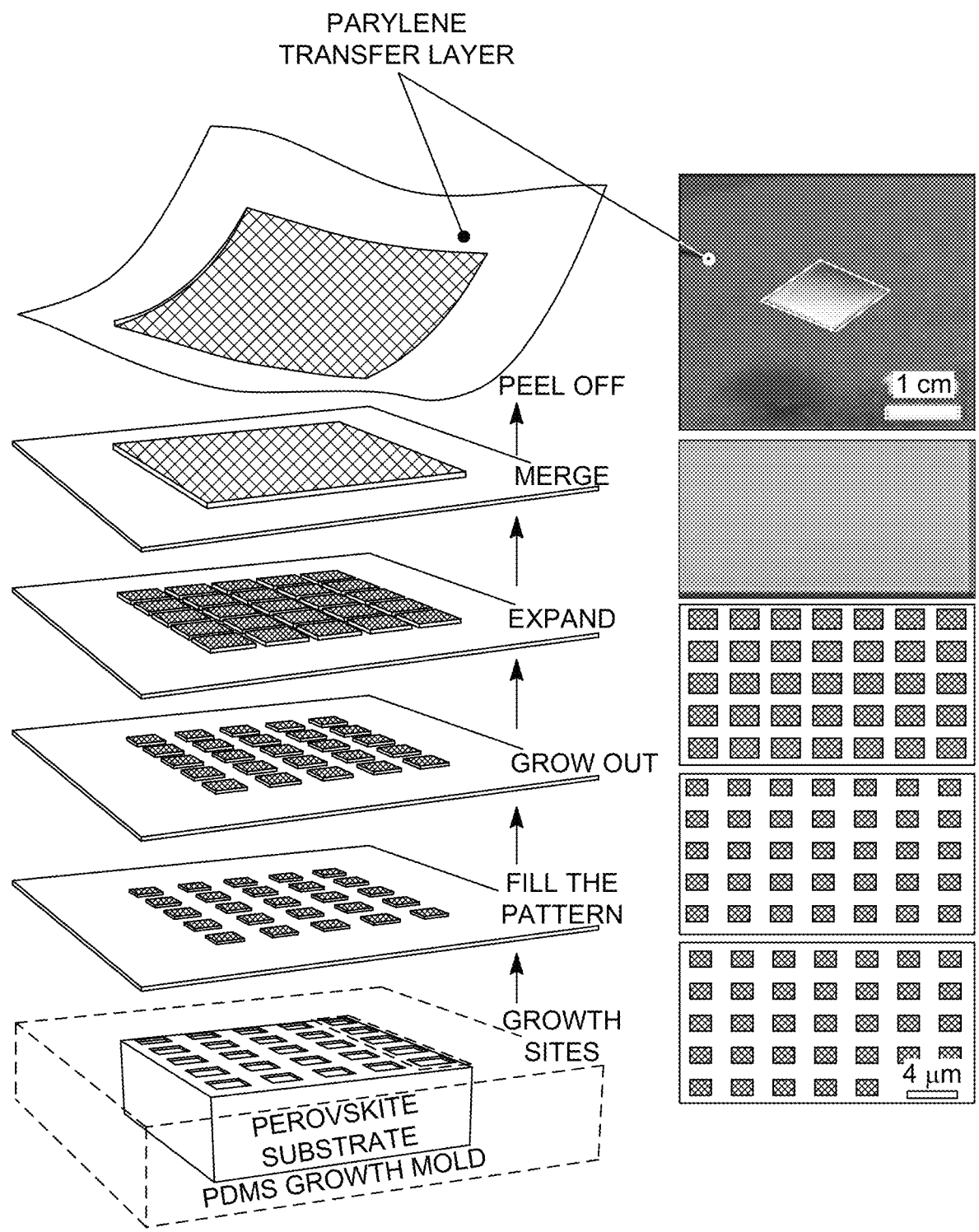
FIG. 1a shows schematics (left) and corresponding optical images (right) of the overall solution-based epitaxial growth, merging, and transferring processes of the single-crystal perovskite thin film.
Figure 1B:
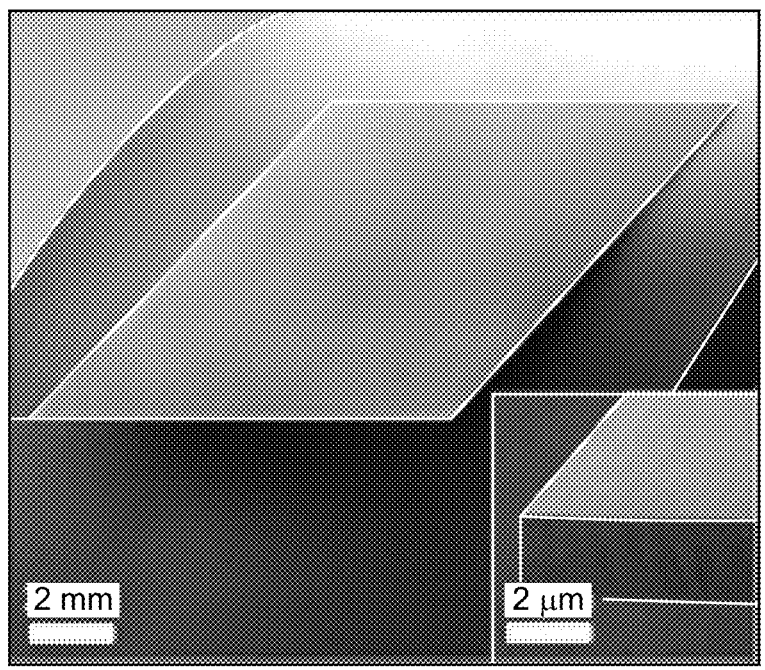
FIG. 1b shows scanning electron microscope (SEM) images of an intact single-crystal $MAPbI_3$ thin film transferred onto a curved general substrate.

FIG. 1a shows the overall lithography-assisted-epitaxial-growth-transfer method for fabricating single-crystal hybrid perovskite thin films. In particular FIG. 1a shows schematics (left) and corresponding optical images (right) showing the solution-based epitaxial growth, merging, and transferring processes of the single-crystal perovskite thin film. In one particular example, a bulk crystal of a hybrid perovskite (e.g., methylammonium lead iodide, MAPbI$_3$) serves as the substrate to epitaxially grow single-crystal hybrid perovskites. A 2 µm layer of patterned polymer (e.g., parylene) serves as the growth mask. The as-grown epitaxial single-crystal film can be transferred to an arbitrary substrate, maintaining a good crystallinity and a strong adhesion to the substrates. FIG. 1b shows scanning electron microscope (SEM) images of an intact single-crystal MAPbI$_3$ thin film transferred onto a curved general substrate, with a dimension of ~1 cm×1 cm×2 µm and a monolithic cross section without any grain boundaries that are typically seen in polycrystalline MAPbI$_3$. With a more rigid growth mask, a scaled single-crystal MAPbI$_3$ thin film with a dimension of about 5.5 cm×5.5 cm×20 µm can be achieved.

Figure 1C:
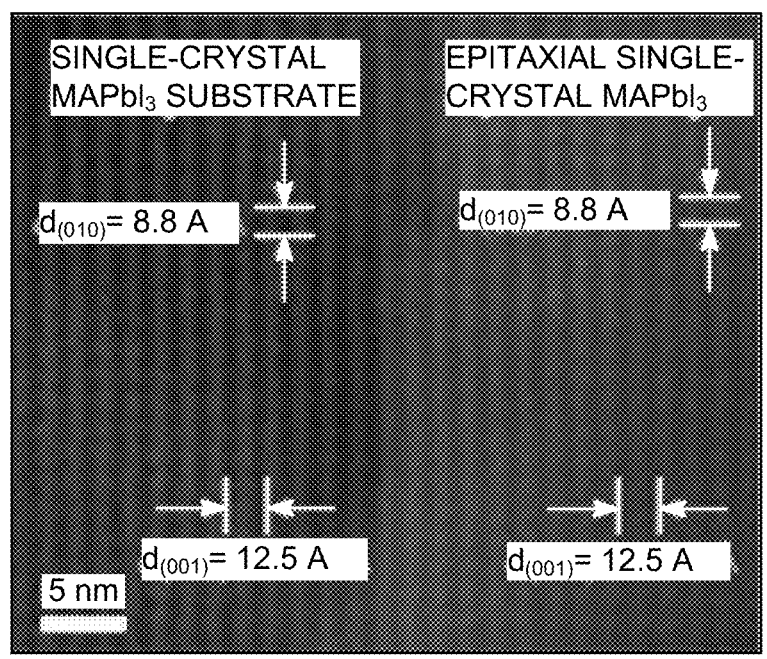
FIG. 1c is a high-resolution transmission electron microscope (TEM) image, further revealing the epitaxial relationship and an absence of dislocations in the as-grown $MAPbI_3$ single-crystal thin film.
Figure 1D:
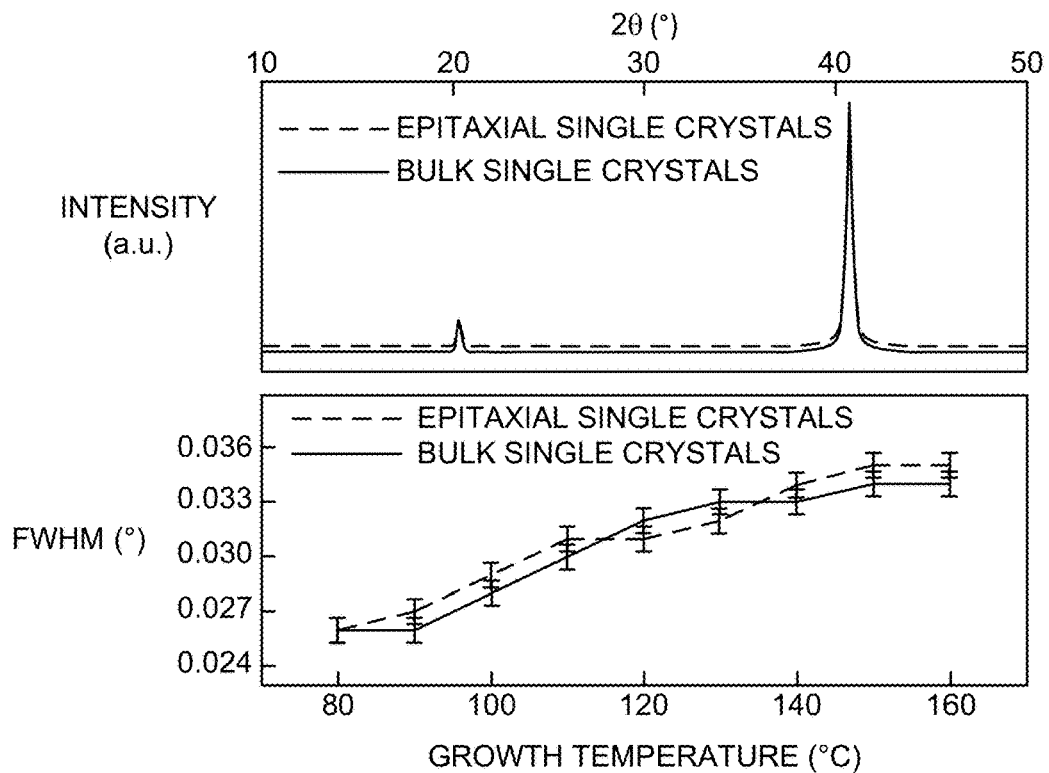
FIG. 1d shows a θ-2θ XRD comparison between the bulk single-crystal and the transferred epitaxial single-crystal thin film on a PDMS substrate.
Figure 1E:
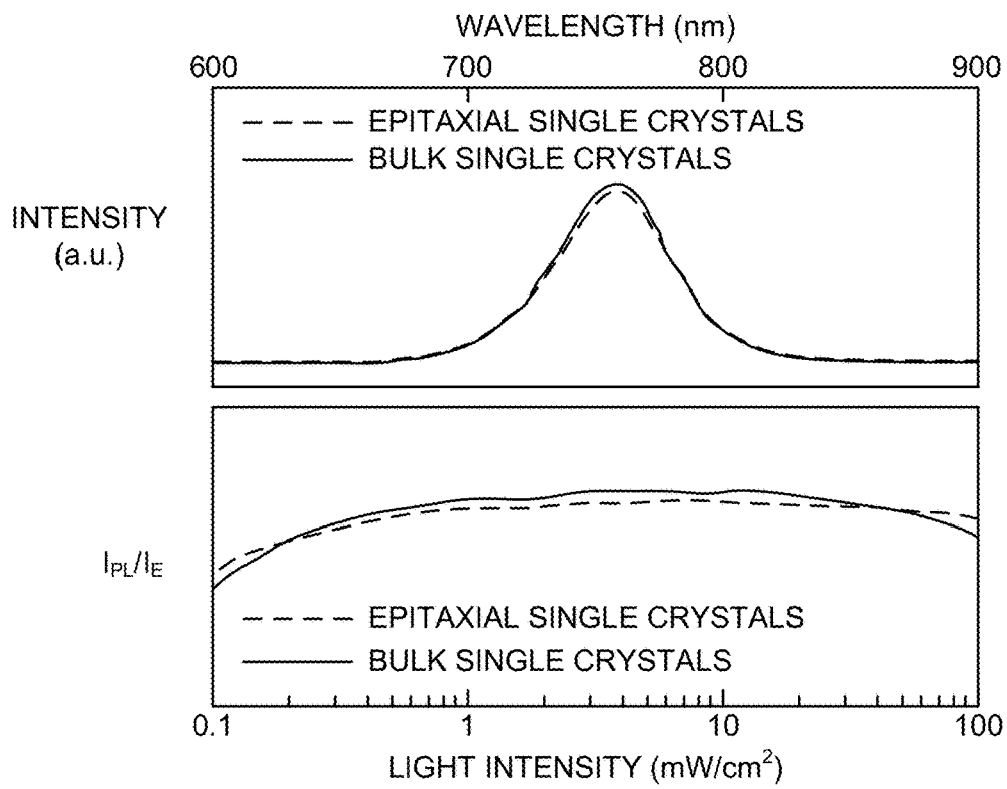
FIG. 1e shows PL and PL intensity comparisons between bulk single-crystals and transferred epitaxial single-crystal thin films.

FIG. 1c is a high-resolution transmission electron microscope (TEM) image, further revealing the epitaxial relationship and an absence of dislocations in the as-grown MAPbI$_3$ single-crystal thin film. The epitaxial layer shows a well-aligned tetragonal lattice structure without dislocations. Contrast across the interface comes from different batches of growth solutions. FIG. 1d shows a θ-2θ XRD comparison between the bulk single-crystal and the transferred epitaxial single-crystal thin film (on a PDMS substrate), showing that this growth/transfer method does not degrade the material crystallinity. The full width at half maximum (FWHM) of the (400) peak in XRD ω-scan suggests high-quality single-crystal perovskite thin films can be grown over a wide range of temperatures, which is applicable for different materials in the perovskite family. FIG. 1e shows PL and PL intensity comparisons between bulk single-crystals and transferred epitaxial single-crystal thin films, showing the high quality of the transferred single-crystal thin films. These θ-2θ X-ray Diffraction (XRD) and photoluminescence (PL) studies prove the high crystallinity of the single-crystal MAPbI$_3$ thin films fabricated by this growth/transfer method. Similar FWHM of the XRD ω-scan (400) and PL peaks of the as-fabricated single-crystal MAPbI$_3$ thin films to those of the bulk single-crystals indicate their comparably high crystal quality. The high crystal quality is attainable over a growth temperature ranging from 80° C. to 160° C. (see FIG. 1d bottom), indicating the potential broad applicability of this growth/transfer method to other perovskites with different growth temperatures and crystallization conditions. Furthermore, the ratio of the PL intensity (I$_{PL}$) of the transferred epitaxial single-crystal thin film to the excitation intensity (I$_E$) exhibits a close tendency to that ratio of the bulk single-crystal (FIG. 1e bottom), providing additional evidence that this growth/transfer method will not cause noticeable nonradiative recombination/quenching in the transferred epitaxial single-crystal thin film.

Carrier diffusion length of the single-crystal thin film with different thicknesses has been calculated by measuring the carrier mobility and carrier lifetime using time of flight (ToF) and time-resolved PL (TRPL). Results show that the carrier mobility and carrier lifetime increase with the crystal thickness. This can be attributed to the better crystal quality of the larger thickness, where there are a lower surface-to-volume ratio, a lower trap density, and smaller XRD/PL FWHM values in thicker films as evidenced by thickness-dependent crystal quality studies. The carrier diffusion length is estimated to saturate at about 5-7 µm, indicating that most charge carriers in thicker films are more likely to recombine rather than being collected.

Figure 2A:
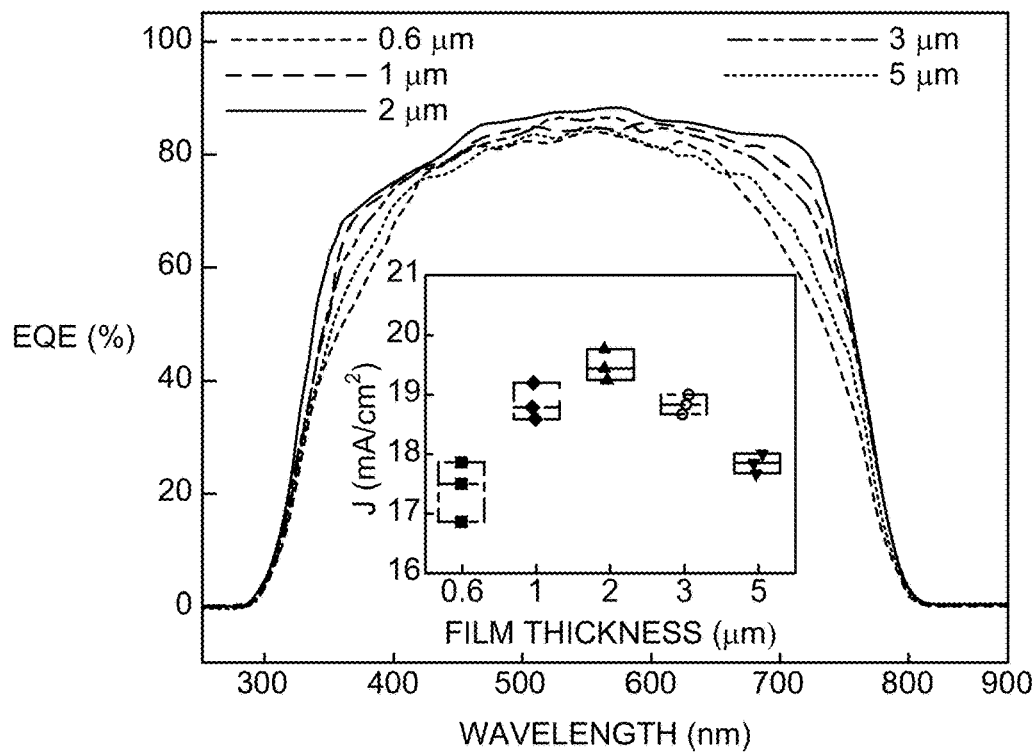
FIG. 2a shows EQE measurements of single-crystal hybrid perovskite of different thicknesses.
Figure 2B:
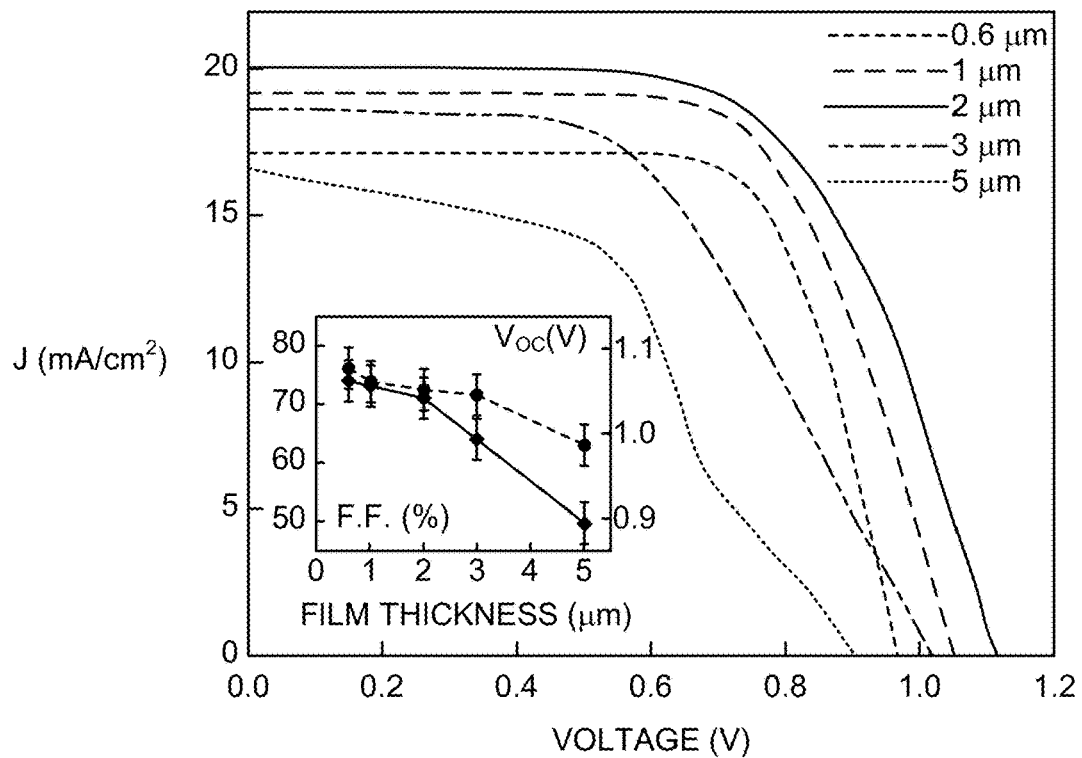
FIG. 2b shows J-V measurements of single-crystal $MAPbI_3$ photovoltaics with different absorber thicknesses.

Thickness-dependent external quantum efficiency (EQE) spectra have been measured. In particular, FIG. 2a shows EQE measurements of single-crystal hybrid perovskite of different thicknesses. Efficiency loss is observed if the film is either too thin or too thick, due to insufficient absorption or carrier collection, respectively. The inset figure shows the integrated current density from the EQE measurements, the efficiency loss leads to a low J$_{SC}$. For a film thickness in the range of about 600 nm to ~2 µm, increasing the thickness improves the EQE, which should be because of the enhanced light harvesting and better crystal quality of thick materials. In the range of about 2 µm to 5 µm, even though the crystal quality is still improved, the carrier collection efficiency becomes the dominant limiting factor, and EQE drops as thickness increases. Current density-voltage (J-V) measurements under 1-Sun illumination of single-crystal MAPbI$_3$ based photovoltaic devices in FIG. 2b show a similar trend, where FIG. 2b shows J-V measurements of single-crystal MAPbI$_3$ photovoltaics with different absorber thicknesses fabricated by this growth/transfer method. The inset shows a decrease in both F.F. and V$_{OC}$ with increasing the absorber thickness; specifically, the inset V$_{OC}$ results come from in-situ devices. When it is below 2 µm, increasing the single-crystal absorber thickness can enhance light absorption and therefore current density. When the single-crystal absorber thickness is above 2 µm, the light absorption saturates. Further increasing the single-crystal absorber thickness will only reduce the fill factor (F.F.) and open circuit voltage (V$_{OC}$) (inset of FIG. 2b), which is due to interfacial charge accumulation caused by the weaker build-in filed in the thicker films. Note that the source of V$_{OC}$ data in the FIG. 2b J-V curves are different from that of the V$_{OC}$ data in the inset. The inset data are from in-situ fabricated devices with un-transferred single-crystal films, where any possible confounding factors from the transfer steps besides the thickness can be minimized.

Figure 2C:
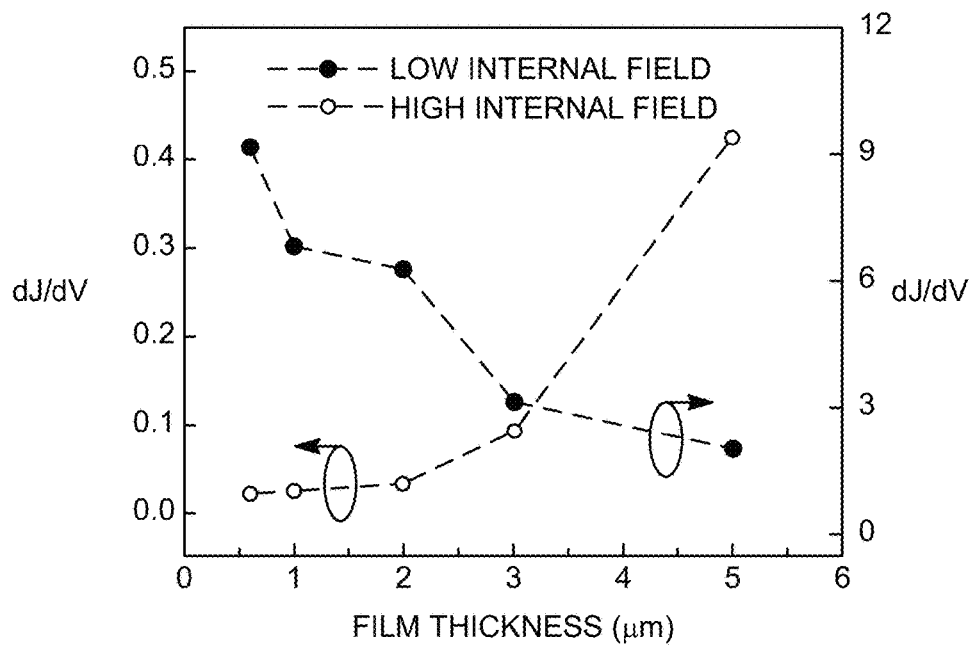
FIG. 2c show the slope of the J-V curve near the high internal field region (i.e., the short circuit current condition) and the low internal field region (i.e., the open circuit voltage condition) as a function of the absorber thickness.

FIG. 2c shows the slope of the J-V curve near the high internal field region (i.e., the short circuit current condition) and the low internal field region (i.e., the open circuit voltage condition) as a function of the absorber thickness. Increasing the absorber thickness will cause a field dependent charge collection at both V$_{OC}$ and J$_{SC}$ regions. Because of the small contributions from extrinsic resistance, the slopes near those two regions can serve as an indication of charge collection efficiency. Ideally, a steep slope near the low internal field region and a close to zero slope near the high internal field region represent fast carrier transport and efficient charge collection. We find that devices with a thickness of 600 nm to 2 µm present efficient charge extraction: further increasing the film thickness will reduce the net field across the film. Therefore, the collection has to rely more on the carrier self-diffusion rather than field-driven drifting, where any potential barriers from trap states will significantly decrease the collection efficiency. Consideration of all the factors discussed leads to the conclusion that the optimal thickness for the single-crystal MAPbI$_3$ thin film used in this study is about 2 µm.

Controlling the thickness of a single-crystal hybrid perovskite thin film can also tailor its mechanical properties. For a general material:

$$\sigma_{st} \propto \frac{E \cdot h}{2R}$$

where $\sigma_{st}$ is the maximum stress of the material, E is the Young's modulus, h is the thickness, and R is the bending radius. Reducing the material thickness offers clear benefits in flexibility. Further enhancing the device integrity can be achieved by placing the film on the neutral mechanical plane (NMP), and the minimal bending radius for a ~2 µm thick single-crystal film can reach ~2.5 mm.

Figure 2D:
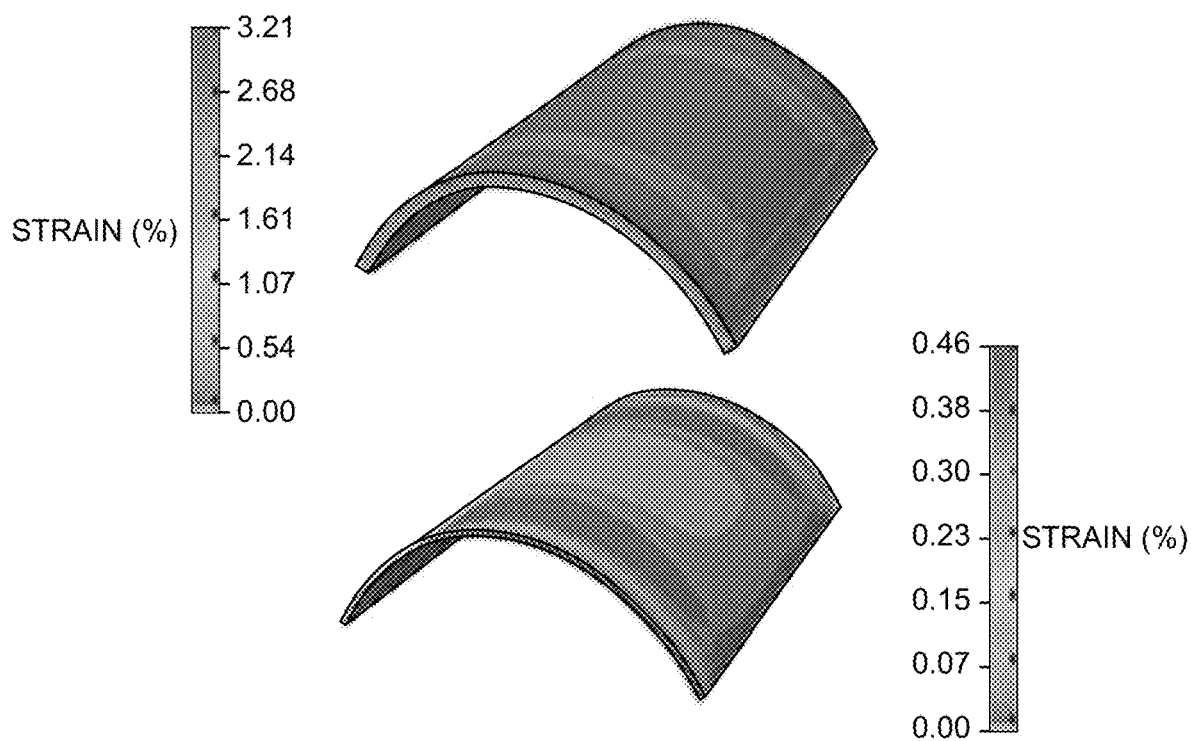
FIG. 2d shows a finite element analysis of the single-crystal perovskite thin film with an NMP design at a bending radius of 2.5 mm.
Figure 2E:
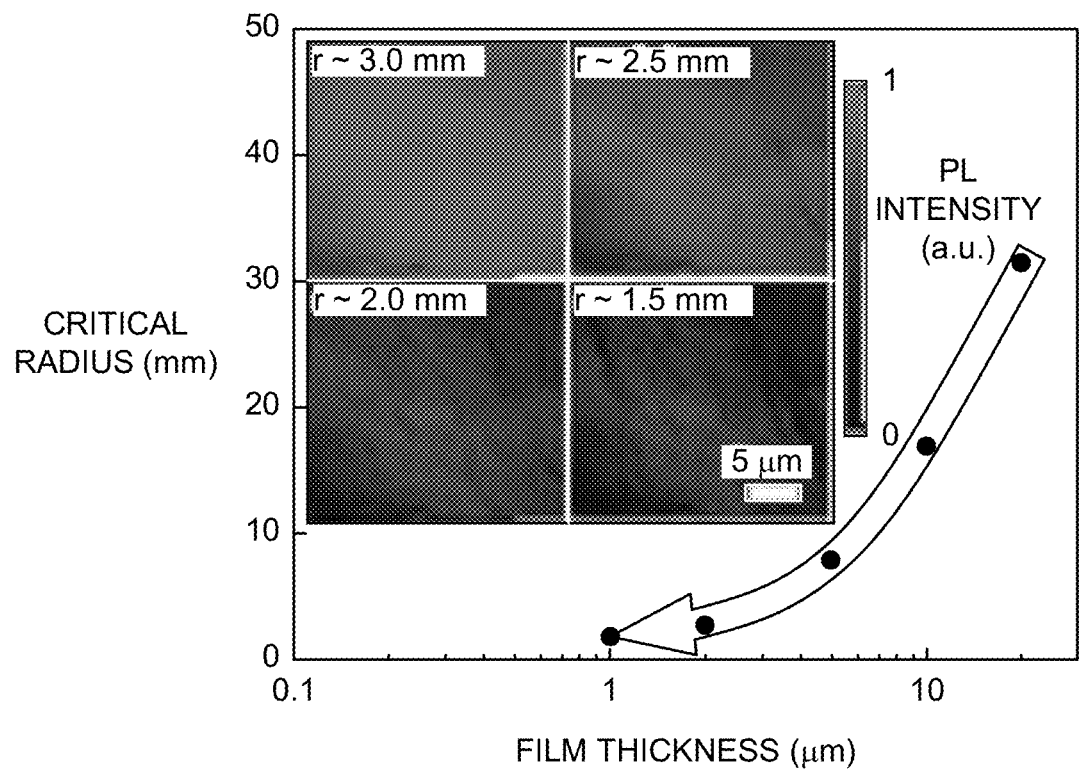
FIG. 2e shows flexibility test results of the NMP design with different single-crystal perovskite film thicknesses.
Figure 2F:
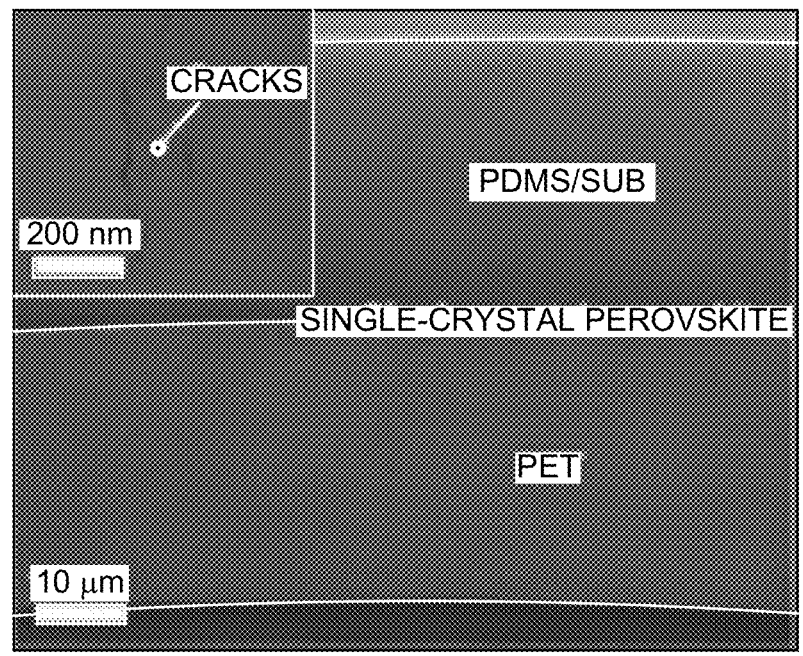
FIG. 2f shows SEM images at a bending radius r of about 2.5 mm, showing the relative thickness of different layers in the NMP design.

FIG. 2d shows a finite element analysis of the single-crystal perovskite thin film with an NMP design at a bending radius of 2.5 mm. The top image shows strain distribution in the entire sandwich structure, where the bending strain mostly occurs in the PET and SU8/PDMS layers. The bottom image shows the strain distribution in the sandwiched single-crystal perovskite layer with all other layers hidden, where the maximum strain in the single-crystal perovskite layer is around 0.36%. The maximum principal strain in the majority of the single-crystal MAPbI$_3$ is less than 0.25%; the largest value occurs near the edge due to Poisson effects with a value of about 0.36%, which is close to the fracture strain of this material. Mechanical tests clearly show the outstanding flexibility of single-crystal MAPbI$_3$ thin films under the NMP design. In particular, FIG. 2e shows flexibility test results of the NMP design with different single-crystal perovskite film thicknesses. A smaller thickness leads to a smaller bending radius, which exhibits a remarkable flexibility of those brittle crystals. Inset PL images show morphologies and cracks of the film at different bending radii. PL mapping of a 2 µm thick single-crystal MAPbI$_3$ with the NMP design under different bending radii shows that cracks begin to appear when the bending radius reaches about 2.5 mm (see FIG. 2e inset). FIG. 2f shows SEM images at a bending radius r of about 2.5 mm, showing the relative thickness of different layers in the NMP design. The inset shows a zoomed-in cross-section image of the single-crystal MAPbI$_3$, illustrating the onset of fracture. The onset of the fractures is further confirmed by the I-V measurements under different bending radii, demonstrating the excellent flexibility and agreement with the simulations.

Figure 3A:
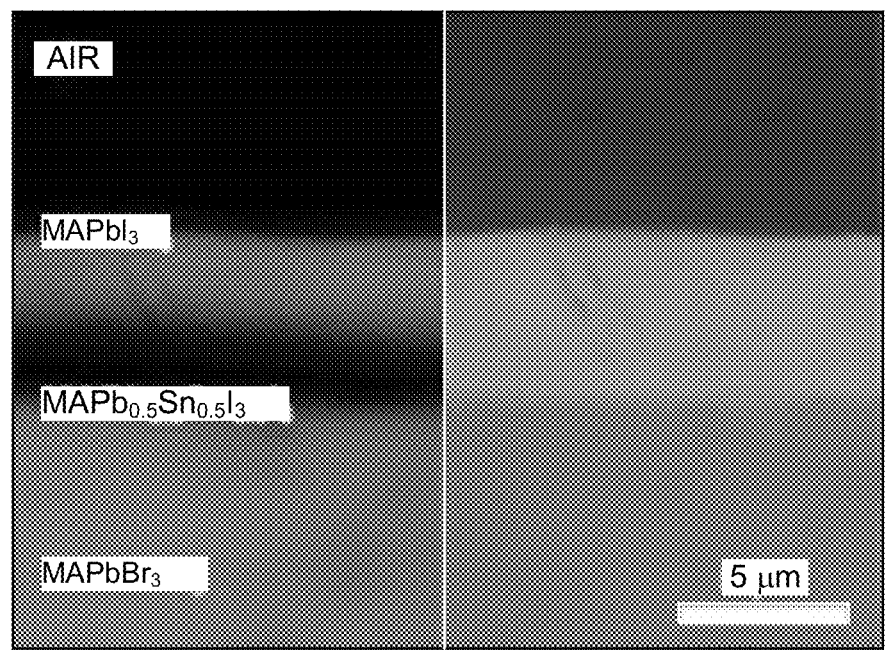
FIG. 3a shows a PL image (left) of the graded single-crystal $MAPb_{0.5+x}Sn_{0.5-x}I_3$ grown on a $MAPbBr_3$ substrate.

As further explained in more detail below, by feeding a continuous flow of precursors of different compositions, we achieve bandgap-graded single-crystal hybrid perovskite thin films. In this particular example MAPb$_{0.5}$Sn$_{0.5}$I$_3$ is chosen as the upper limit of Sn doping concentration. The resulting graded bandgap, gradually transitioning from MAPb$_{0.5}$Sn$_{0.5}$I$_3$ to MAPbI$_3$, is evidenced by the clear red-infrared interface in the PL image illustrated in FIG. 3a, which shows a PL image (left) of the graded single-crystal MAPb$_{0.5+x}$Sn$_{0.5-x}$I$_3$ grown on a MAPbBr$_3$ substrate. The MAPbBr$_3$ here is chosen as a representative example to show the compatibility of this growth/transfer method in the perovskite family. The dark Sn rich area is because of the infrared emission of the Sn-alloyed MAPbI$_3$ being invisible on the camera. The contrast has been enhanced to better show the color difference. A corresponding optical image (right) shows the graded MAPb$_{0.5+x}$Sn$_{0.5-x}$I$_3$ without noticeable structural interfaces. The bandgap-graded single-crystal is stable without noticeable Pb/Sn ion migration driven under electrical field or concentration-gradient. Note that unlike conventional heterojunctions, no structural interface exists in the graded layer (FIG. 3a right). The trap density in the graded single-crystal is comparable to that in the pure MAPbI$_3$ single-crystal and almost two orders of magnitude lower than that of a heterojunction with an abrupt interface.

Figure 3B:
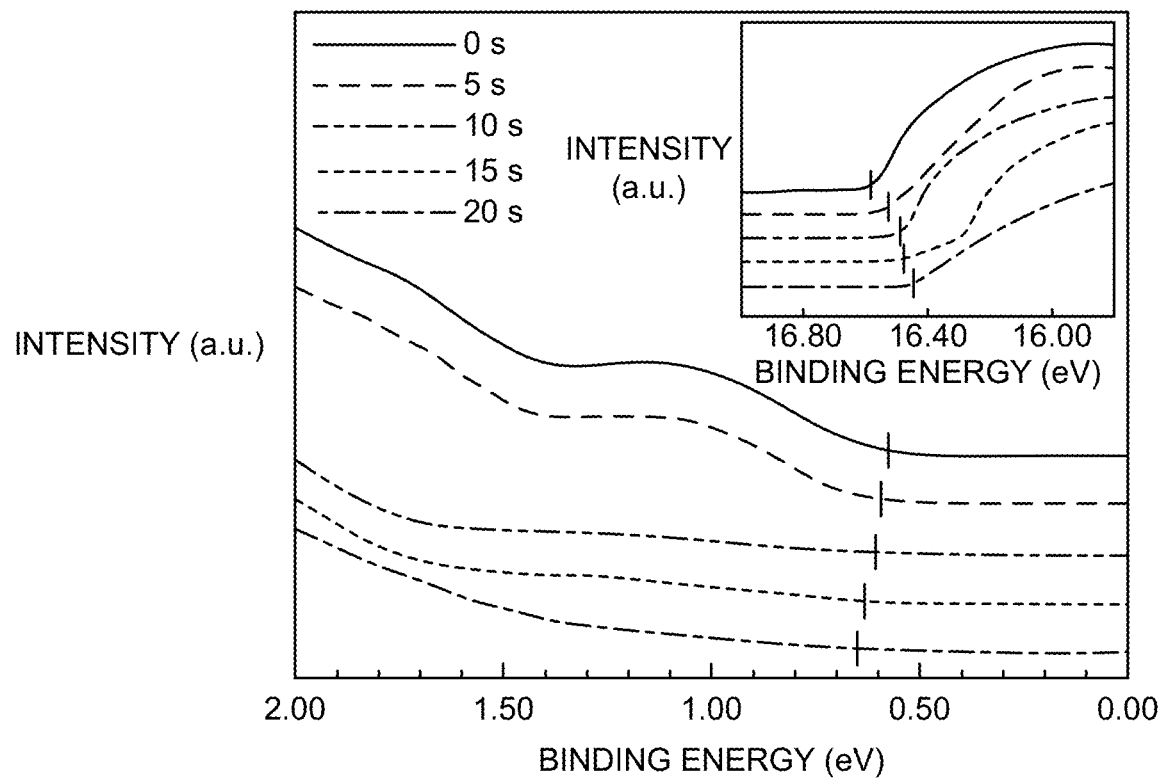
FIG. 3b shows UPS measurements on samples at different growth time during the alloyed growth process.
Figure 3C:
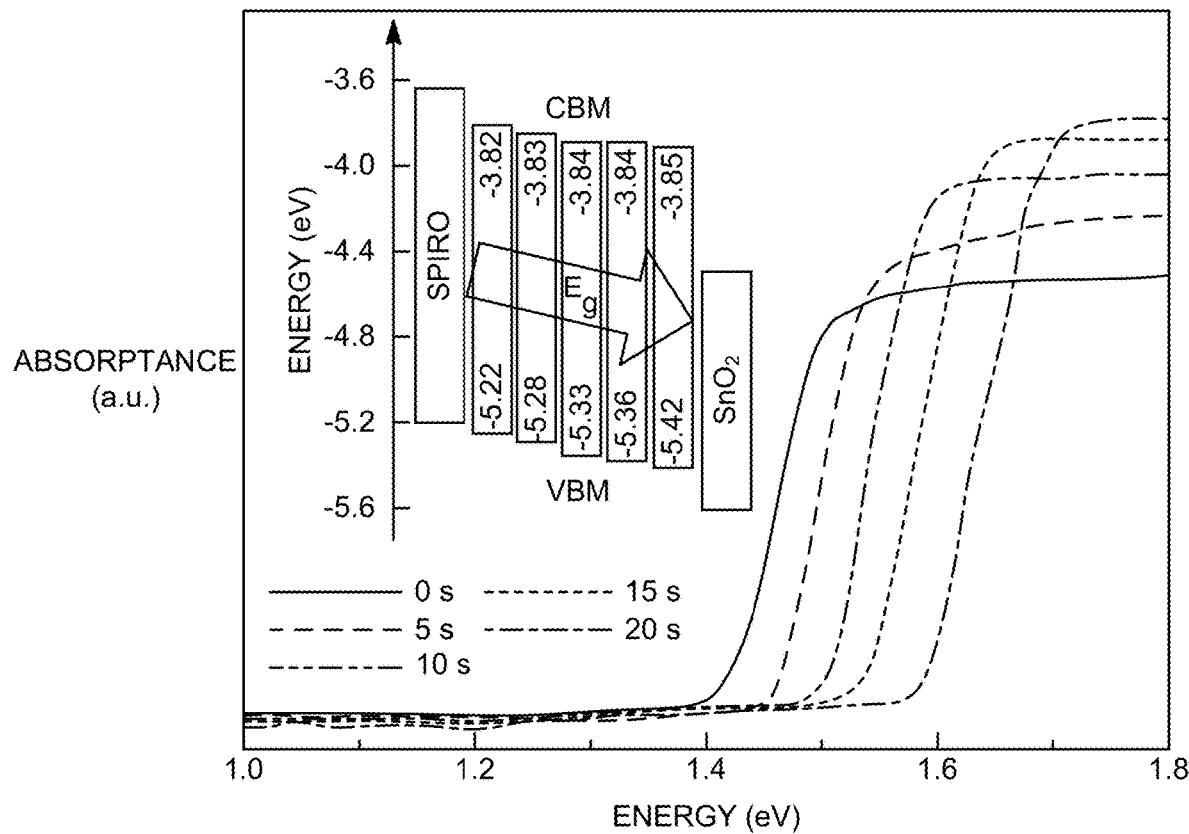
FIG. 3c shows ultraviolet-visible spectroscopy (UV-vis) absorption of single-crystal thin films with the same composition as the surface composition of the graded structure at different growth times.

We combine ultraviolet photoelectron spectroscopy (UPS) and ultraviolet-visible spectroscopy (UV-Vis) to characterize the energy band structure of the graded single crystal in the growth process. FIG. 3b shows UPS measurements on samples at different growth time during the alloyed growth process: the bottom being MAPb$_{0.5}$Sn$_{0.5}$I$_3$ and the top being MAPbI$_3$. The VBM position is calculated from the low binding energy cutoff and the high binding energy cutoff (inset). FIG. 3c shows ultraviolet-visible spectroscopy (UV-vis) absorption of single-crystal thin films with the same composition as the surface composition of the graded structure at different growth times. Replacing Sn with Pb in the perovskite increases the bandgap. Inset schematics show the energy diagram by calculations from the UPS and UV-vis data. The UPS data show that the VBM position becomes lower while the UV-Vis results reveal that the bandgap becomes larger as the growth continues. The summarized band structure of the MAPb$_{0.5+x}$Sn$_{0.5-x}$I$_3$ graded single-crystal is presented by the inset schematics in FIG. 3c. As the growth progresses and more Pb is incorporated in the crystal, the position of the VBM becomes lower, and the position of the conduction band minimum (CBM) also becomes lower, but not as dramatically as the VBM. The result is a gradually increasing bandgap from the bottom (MAPb$_{0.5}$Sn$_{0.5}$I$_3$) to the surface (MAPbI$_3$), whose band structure is also supported by first-principle calculations.

Figure 3D:
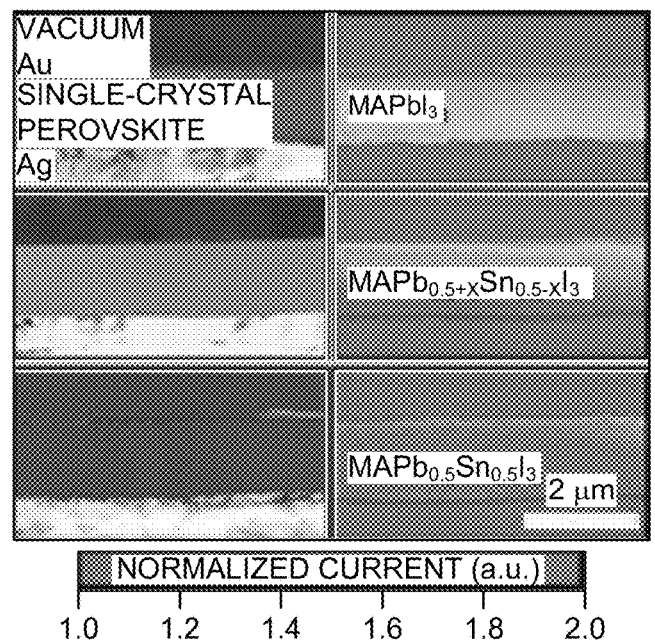
FIG. 3d shows electron beam induced current (EBIC) mapping results along the cross-sections of three different single-crystal perovskites.
Figure 3E:
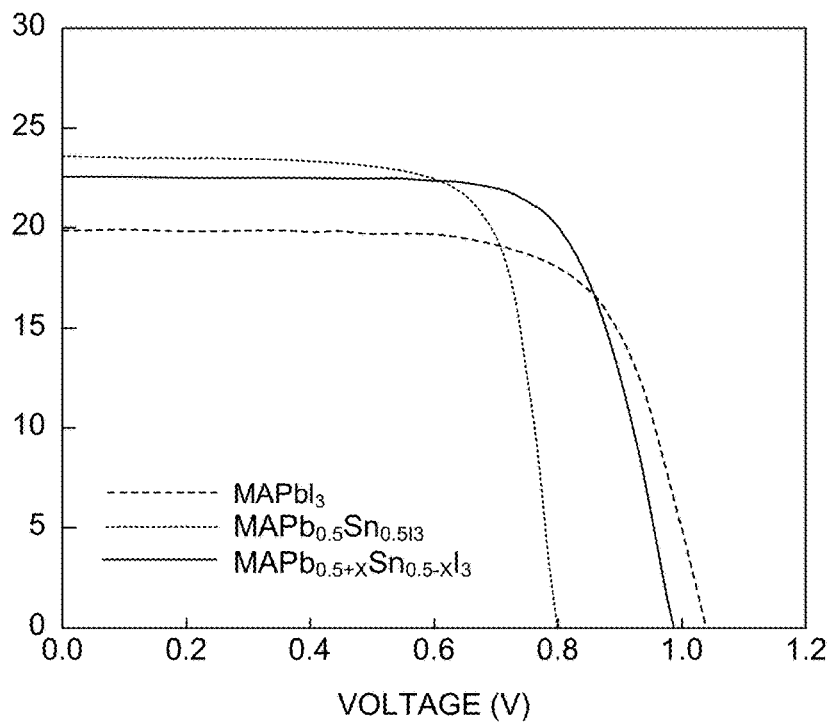
FIG. 3e shows representative J-V curves of $MAPbI_3$, $MAPb_{0.5}Sn_{0.5}I_3$, and graded $MAPb_{0.5+x}Sn_{0.5-x}I_3$ single-crystal photovoltaic devices.

FIG. 3d shows electron beam induced current (EBIC) mapping results along the cross-sections of three different single-crystal perovskites. The compositionally uniform MAPb$_{0.5}$Sn$_{0.5}$I$_3$ (FIG. 3d bottom) generates a higher current than the compositionally uniform MAPbI$_3$ (FIG. 3d top), indicating easier exciton formation, charge dissociation, and charge collection in MAPb$_{0.5}$Sn$_{0.5}$I$_3$ due to its lower bandgap and weaker exciton binding. The graded MAPb$_{0.5+x}$Sn$_{0.5-x}$I$_3$ (FIG. 3d middle) shows a gradually decreasing current when the Sn content is reduced from 50% at the bottom to 0% at the surface. Any possible contribution from the top Au electrode that may have introduced a higher recombination rate has been excluded. EQE measurements show the median average current density in the graded absorber compared with the MAPbI$_3$ and MAPb$_{0.5}$Sn$_{0.5}$I$_3$, indicating the existence of an engineered bandgap. FIG. 3e shows representative J-V curves of MAPbI$_3$, MAPb$_{0.5}$Sn$_{0.5}$I$_3$, and graded MAPb$_{0.5+x}$Sn$_{0.5-x}$I$_3$ single-crystal photovoltaic devices. The J-V measurements reveal the overall performance of these three different absorbers. Both the MAPb$_{0.5}$Sn$_{0.5}$I$_3$ and the graded MAPb$_{0.5+x}$Sn$_{0.5-x}$I$_3$ absorbers give a higher $J_{SC}$ than MAPbI$_3$, as alloying Sn with the Pb decreases the bandgap and the exciton binding energy. On the other hand, the MAPb$_{0.5}$Sn$_{0.5}$I$_3$ shows a much lower $V_{OC}$ compared to MAPbI$_3$, because of the its higher defect concentrations, shorter carrier lifetimes, and lower bandgap. Surprisingly, the graded MAPb$_{0.5+x}$Sn$_{0.5-x}$I$_3$ gives a relatively high $V_{OC}$ and has the best overall performance among the three absorbers.

Figure 3F:
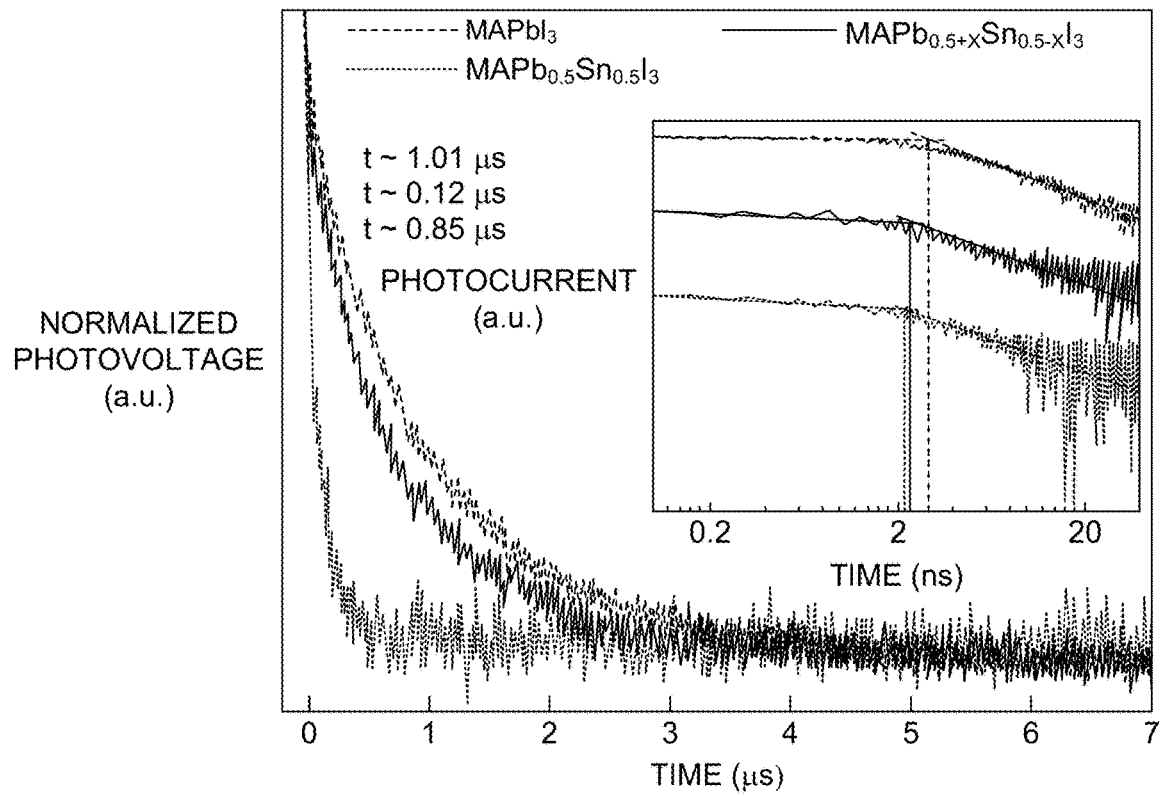
FIG. 3f shows transient photovoltage measurements, illustrating that the graded single-crystal $MAPb_{0.5+x}Sn_{0.5-x}I_3$ exhibits the longest carrier lifetime due to the easier exciton separation and charged carrier collection facilitated by the graded bandgap.

We combine calculations and experiments to understand the high $V_{OC}$ of the graded $MAPb_{0.5+x}Sn_{0.5-x}I_3$. Calculation results show a decrease in carrier effective mass (for both electrons and holes) when more Sn is incorporated into Pb perovskites. FIG. 3f shows transient photovoltage measurements show that the graded single-crystal $MAPb_{0.5+x}Sn_{0.5-x}I_3$ exhibits the longest carrier lifetime due to the easier exciton separation and charged carrier collection facilitated by the graded bandgap. ToF measurements (inset) show the carrier mobility in graded single-crystal $MAPb_{0.5+x}Sn_{0.5-x}I_3$ is close to that in the compositionally uniform single-crystal $MAPb_{0.5}Sn_{0.5}I_3$. However, transient photovoltage measurements show that the carrier lifetime in the graded structure is much higher than that in the $MAPb_{0.5}Sn_{0.5}I_3$, contradictory to our understanding that adding Sn into Pb perovskites normally result in a lower carrier lifetime because of the high recombination rate in Sn perovskites. We ascribe the measured high carrier lifetime in the $MAPb_{0.5+x}Sn_{0.5-x}I_3$ to its graded bandgap, which is similar to the built-in field of a p-n junction. The graded bandgap of the $MAPb_{0.5+x}Sn_{0.5-x}I_3$ facilitates carrier separation, transport, and collection with extended carrier lifetime, resulting a relatively high $V_{OC}$.

The single-crystal thin films described herein have been integrated in various devices. For instance, single-crystal perovskite light-emitting diodes have been demonstrated by this growth/transfer method. The pixel size can be anywhere from 1 μm to 100 μm, with potential applications for flexible displays with tunable color, high resolution, high stability, and high quantum efficiency. Furthermore, this growth/transfer method allows engineering the material morphology/orientation. A textured antireflective single-crystal perovskite photodetector exhibits improved performances over one with a flat surface.

Figure 4A:
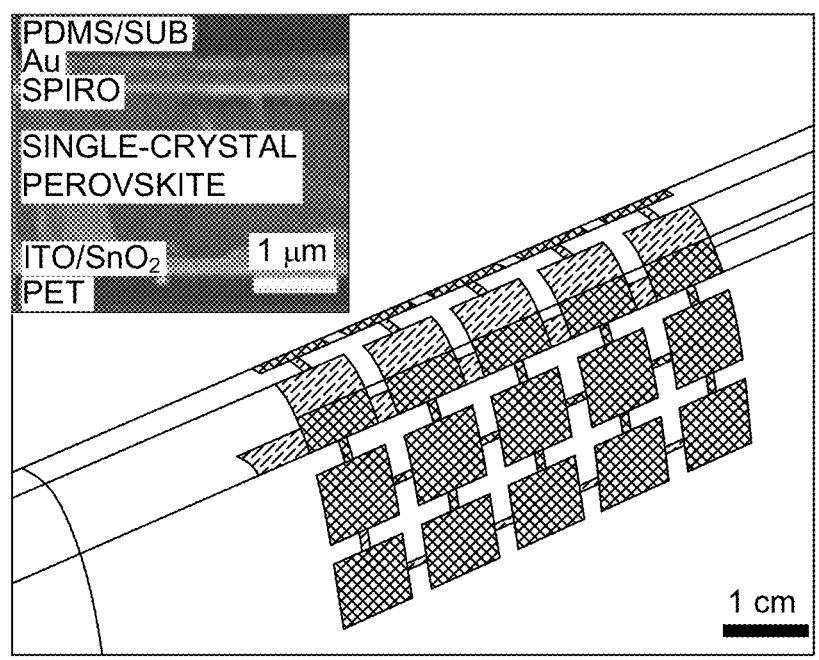
FIG. 4a shows an optical image of an array of flexible single-crystal photovoltaic islands in an island-bridge layout, with each island a single-crystal perovskite photovoltaic device interconnected by the metal bridges.
Figure 4B:
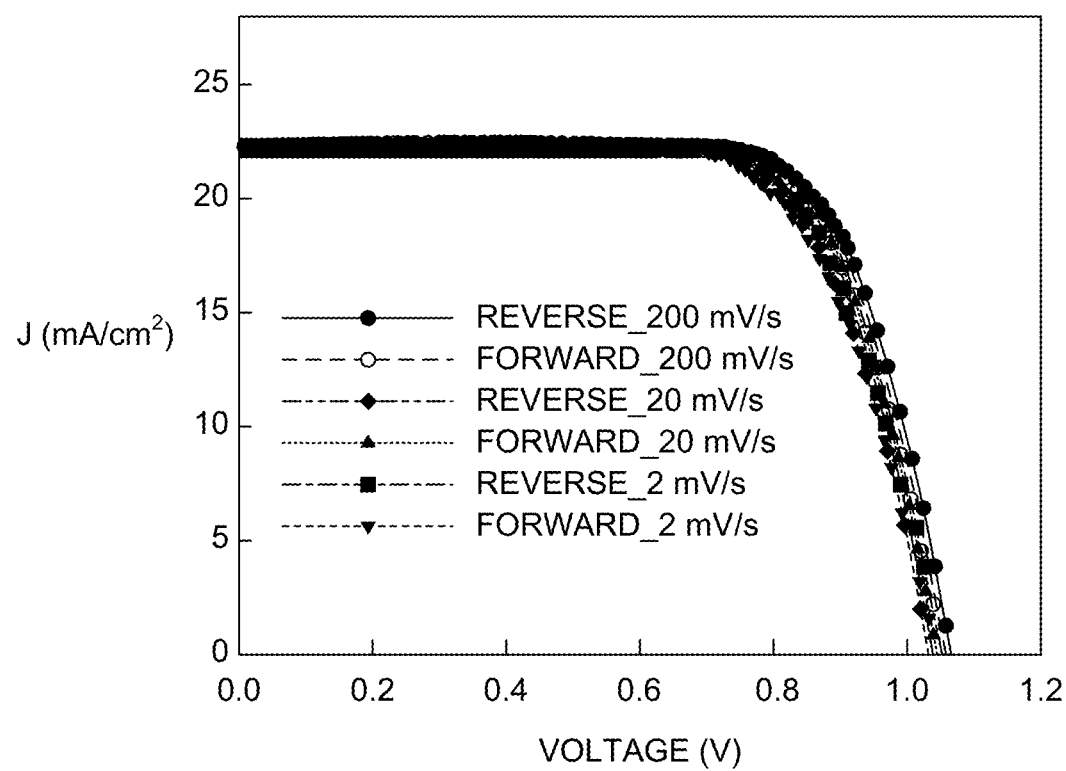
FIG. 4b shows J-V hysteresis at different scan rates and directions.

FIG. 4a shows an optical image showing an array of flexible single-crystal photovoltaic islands with a total working area of 6.25 cm² (0.5 cm×0.5 cm×25) in an island-bridge layout, with each island a single-crystal perovskite photovoltaic device interconnected by the metal bridges. The corresponding cross-sectional structure of an island is illustrated in the inset of FIG. 4a. The mode value of power conversion efficiency (PCE) of a 0.5 cm×0.5 cm island under a 3 mm×3 mm mask is 15-17% for single-crystal $MAPbI_3$, and 17-19% for graded single-crystal $MAPb_{0.5+x}Sn_{0.5}I_3$. The highest PCE that has been measured is 20.04% under initial reverse scanning. To further improve the single-crystal device performance, surface/interface passivation and/or strategic layer design are needed. The entire array of graded single-crystal $MAPb_{0.5+x}Sn_{0.5-}$ Most devices show negligible J-V hysteresis at different scan rates and directions (FIG. 4b). $_xI_3$ photovoltaics shows an overall PCE of ~10.3% with a working area of ~9 cm².

Figure 4C:
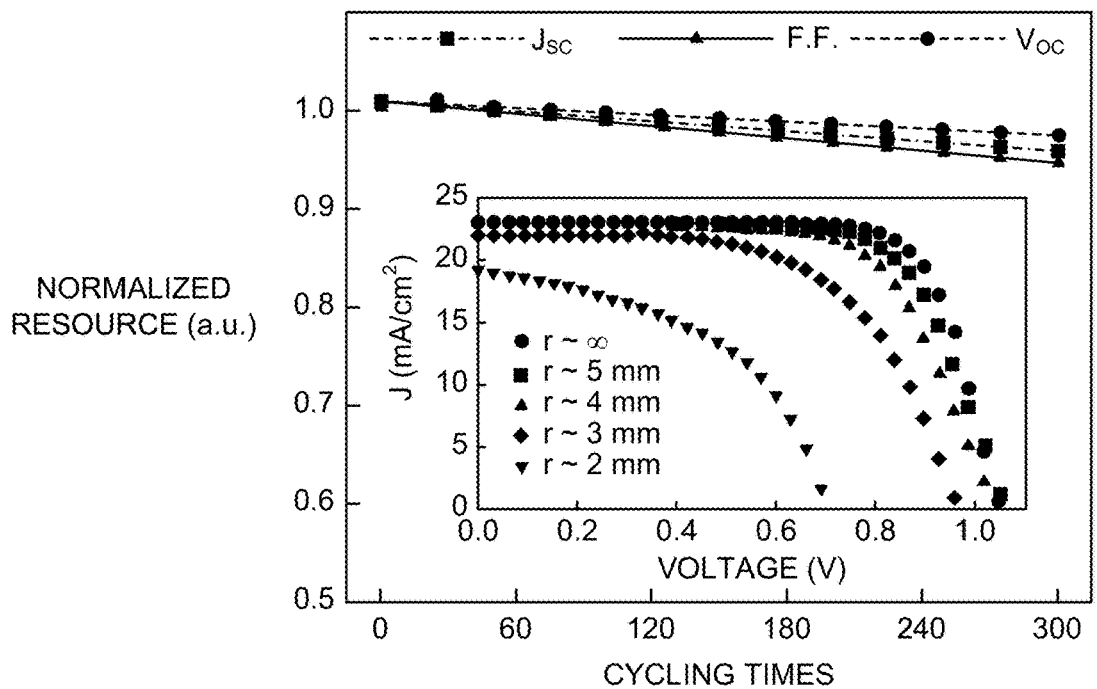
FIG. 4c shows cycling test results of the graded photovoltaic device at a radius of about 5 mm.

In mechanical testing, the flexible photovoltaic device undergoes bending-straightening cycles. FIG. 4c shows cycling test results of the graded photovoltaic device at a radius of about 5 mm. The inset shows J-V curves at different bending radii. The islands in the middle of the array experience the most bending and are therefore selected to demonstrate the mechanical stability of the entire array. At a radius of 5 mm, a small decrease in $V_{OC}$ (from 100% to 96.5%) and $J_{SC}$ (from 100% to 94.9%), and a decay on F.F. (from 100% to 93.7%) are observed after 300 cycles. The decrease may be due to the increase in series resistance caused by interfacial delamination. Further decreasing the bending radius causes a significant drop in $V_{OC}$, $J_{SC}$, and F.F., which possibly results from the material failure (e.g., cracks in the absorber) (FIG. 4c inset). Polycrystalline photovoltaics of the same device configuration show significant performance degradation under the same cyclic bending tests, which may be caused by fast material and device degradation at the grain boundaries during bending.

Figure 4D:
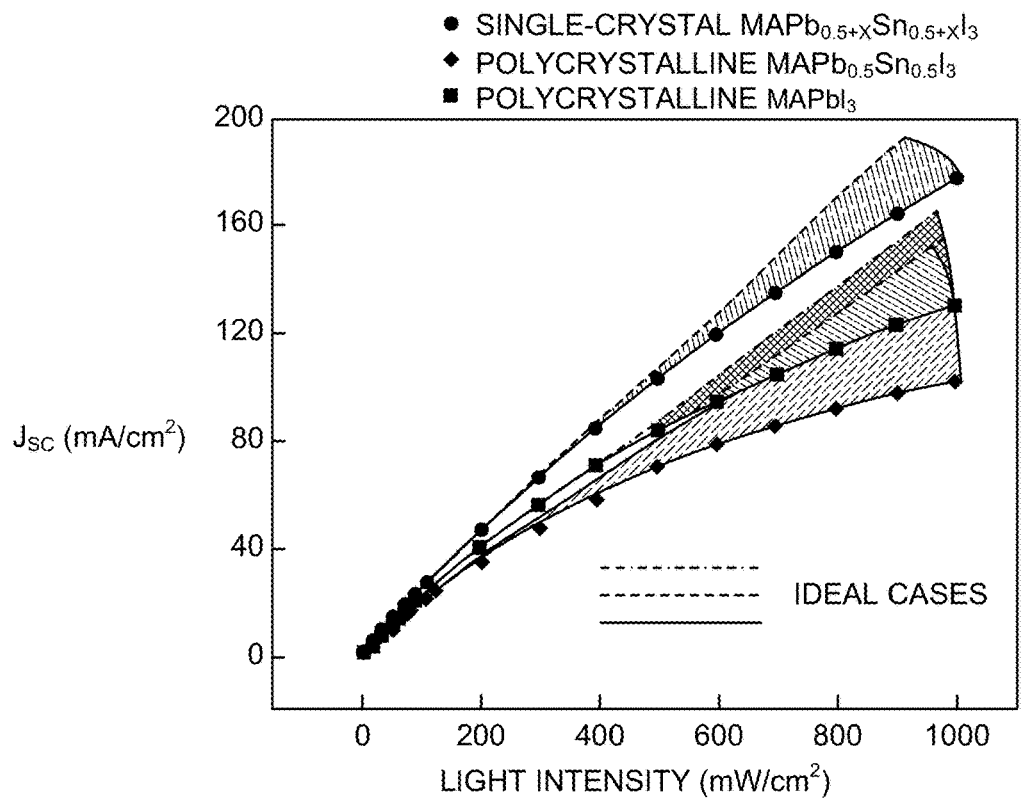
FIG. 4d show stress stability test results for graded single-crystal $MAPb_{0.5+x}Sn_{0.5-x}I_3$, polycrystalline $MAPb_{0.5}Sn_{0.5}I_3$, and polycrystalline $MAPbI_3$ based photovoltaic devices.

FIG. 4d show stress stability test results for graded single-crystal $MAPb_{0.5+x}Sn_{0.5-x}I_3$, polycrystalline $MAPb_{0.5}Sn_{0.5}I_3$, and polycrystalline $MAPbI_3$ based photovoltaic devices, in which the $J_{SC}$ is measured as a function of light intensity. Because of the lack of a way to realize Pb—Sn composition gradients in the polycrystalline structure without junction formation, only $MAPb_{0.5}Sn_{0.5}I_3$ and $MAPbI_3$ have been fabricated in polycrystalline photovoltaics for comparison. The relationship between $J_{SC}$ and light intensity for the graded single-crystal $MAPb_{0.5+x}Sn_{0.5-x}I_3$ photovoltaics is close to linear, indicating good charge collection. Single-crystal photovoltaics of graded $MAPb_{0.5+x}Sn_{0.5-x}I_3$, $MAPb_{0.5}Sn_{0.5}I_3$, and the $MAPbI_3$ show similar stress stability. However, the $J_{SC}$-light intensity curves for polycrystalline $MAPb_{0.5}Sn_{0.5}I_3$ and $MAPbI_3$ photovoltaics tend to deviate from the linear relationship at higher light intensities, likely due to degradation facilitated by the presence of grain boundaries.

Figure 4E:
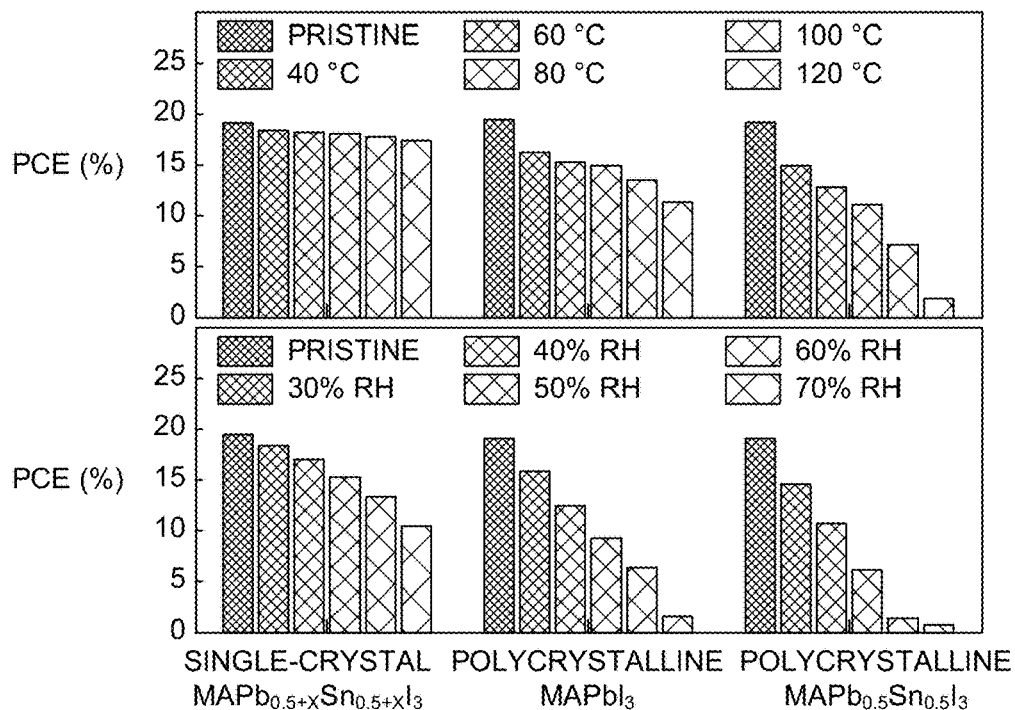
FIG. 4e shows thermal and humidity stability test results of the graded single-crystal $MAPb_{0.5+x}Sn_{0.5-x}I_3$, polycrystalline $MAPb_{0.5}Sn_{0.5}I_3$, and polycrystalline $MAPbI_3$.

FIG. 4e shows thermal and humidity stability test results of the graded single-crystal $MAPb_{0.5+x}Sn_{0.5-x}I_3$, polycrystalline $MAPb_{0.5}Sn_{0.5}I_3$, and polycrystalline $MAPbI_3$, unencapsulated devices are used only in the humidity stability test. The aging time for thermal and humidity stability tests is 2 hours and 30 min, respectively. FIG. 4e shows that single-crystal photovoltaic devices have better stability than polycrystalline devices under different thermal and humidity conditions. Thermogravimetric analysis (TGA) confirms that the single-crystal film decomposes at a higher temperature than the polycrystalline film. In-situ XPS results reveal that degradation factors (e.g., pinholes and grain boundaries) in the polycrystalline structure facilitate oxygen/moisture diffusion, leading to a rapid oxidization of Sn' and overall degradation rate. Besides, single-crystal devices show a slower decay than polycrystalline devices with the same measurement condition and encapsulation in 1000-hours continuous illumination stability tests under 1-Sun intensity by tracking the maximum power point. Such a difference is attributed to the suppressed ion migration and the intrinsic slow self-doping effect in the single-crystals. Additionally, to manifest the difference in the single crystal and polycrystalline perovskites, we replace the thermal/light sensitive Spiro-MeOTAD with more stable poly[bis(4-phenyl)(2,4,6-trimethylphenyl)amine] (PTAA). The stability differences among those devices become even more pronounced.

Figure 4F:
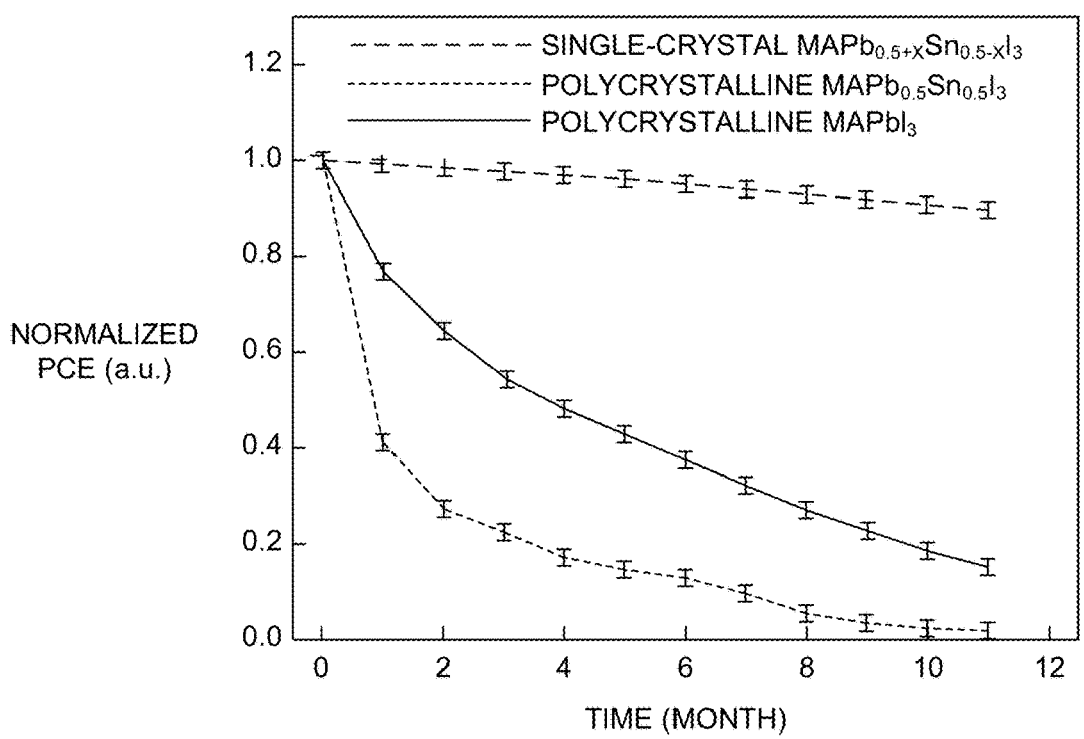
FIG. 4f show long-term shelf-stability test results (over 11 months) of the graded single-crystal $MAPb_{0.5+x}Sn_{0.5-x}I_3$, polycrystalline $MAPb_{0.5}Sn_{0.5}I_3$, and polycrystalline $MAPbI_3$ photovoltaic devices in a dark dry box.

FIG. 4f show long-term shelf-stability test results (over 11 months) of the graded single-crystal $MAPb_{0.5+x}Sn_{0.5-x}I_3$, polycrystalline $MAPb_{0.5}Sn_{0.5}I_3$, and polycrystalline $MAPbI_3$ photovoltaic devices in a dark dry box. A top SU8/PDMS layer also covers the polycrystalline photovoltaic devices for keeping the same encapsulation. The single-crystal photovoltaic devices show much better stability in PCE than their polycrystalline counterparts. Error bars come from three different measurements with different aperture positions. These long-term shelf-stability studies further prove that single-crystal devices have much better stability than their polycrystalline counterparts regardless of the composition.

The Solution-Based Lithography-Assisted-Epitaxial-Growth-Transfer Method

Figure 5A:
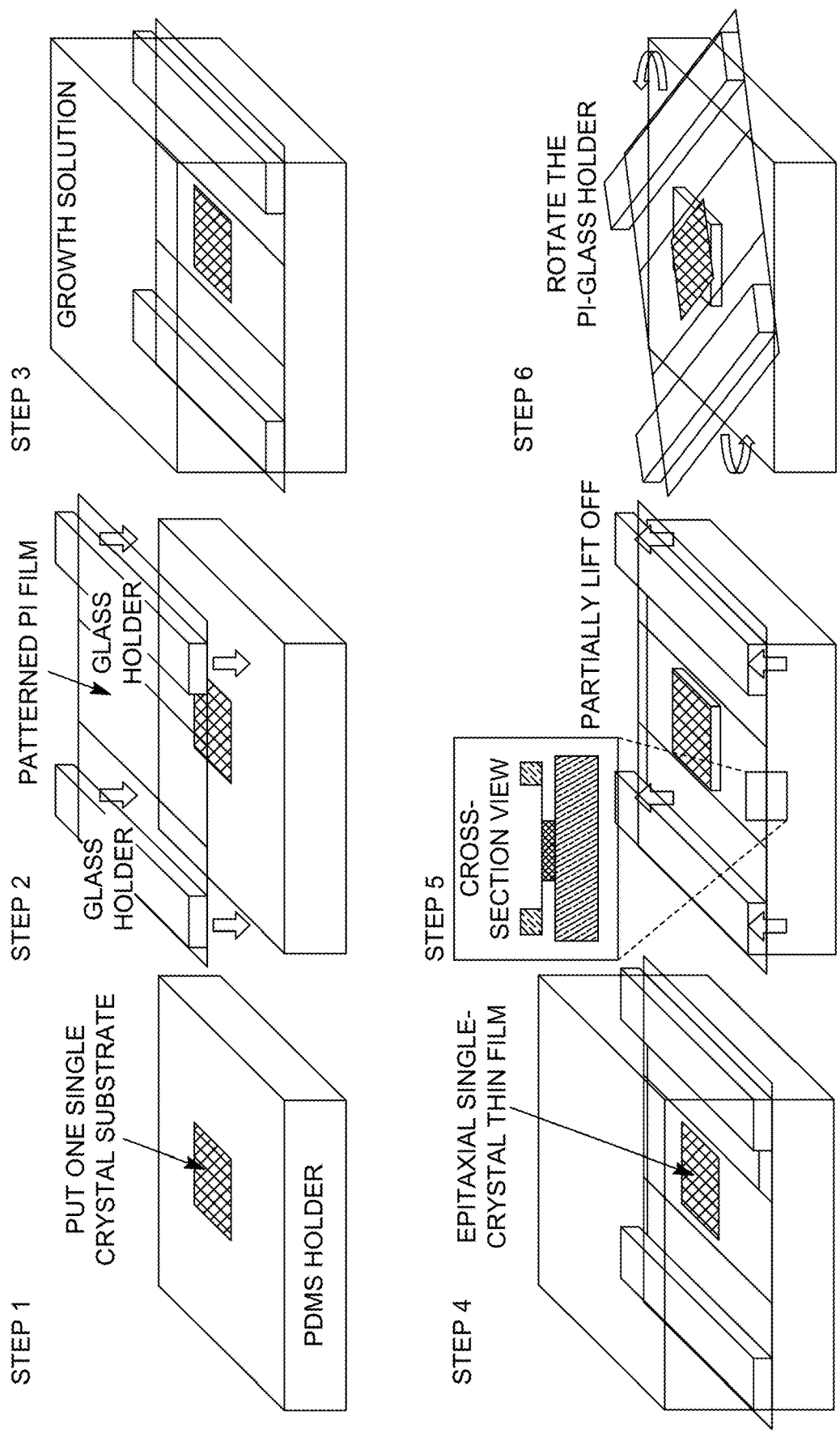
FIG. 5a shows the overall growth and transfer process divided into six steps.

One example of the overall process of the growth/transfer method is presented in FIG. 1a and FIG. 5a. In this particular example, a polymer such as parylene (or polyimide, PI) is used as the mask transfer layer, and no metal or other ETL/HTL layers are needed during the growth/transfer process. To illustrate the process we fix the pattern geometry of the parylene at 1 µm by 1 µm, where the thickness of parylene (or PI) can vary from 2 µm to 10 µm. A single-crystal perovskite substrates is placed into a PDMS growth mold or other receptacle and covered by the patterned parylene (or PI) layer. Before the growth, a freshly prepared MAPbI$_3$ GBL (1M) solution is evaporated under 80° C. for 6 hours to achieve a near-saturated condition, which is used as the growth solution. Otherwise, the high solubility of MAPbI$_3$ in GBL will immediately dissolve parts of the single-crystal substrates and destroy the pattern.

For epitaxial single-crystal perovskite thin films growth, the as-prepared growth solution is heated up to a preset temperature. The growth mold is then placed into the pre-heated growth solution for a particular amount of growth time. Precise thickness, area, and shape control of the epitaxial single-crystal thin films can be achieved by adjusting the growth temperature, time, and the lithography layout. The design of the patterned mask serves as the mechanism for controlling the thickness of the epitaxial layer.

During the growth process, the epitaxial single-crystal perovskites (e.g., MAPbI$_3$ or MAPbBr$_3$) grows three-dimensionally under the natural behaviors of this kind of material. No additional capping agents or physical covers are necessary to control its growth behavior (although capping agents may be optionally employed in some cases). Initially, small crystals nucleate on patterned growth sites, each having an epitaxial relationship with the substrate. As growth continues, the small crystals gradually expand and merge, forming a monolithic single-crystal film.

Figure 6A:
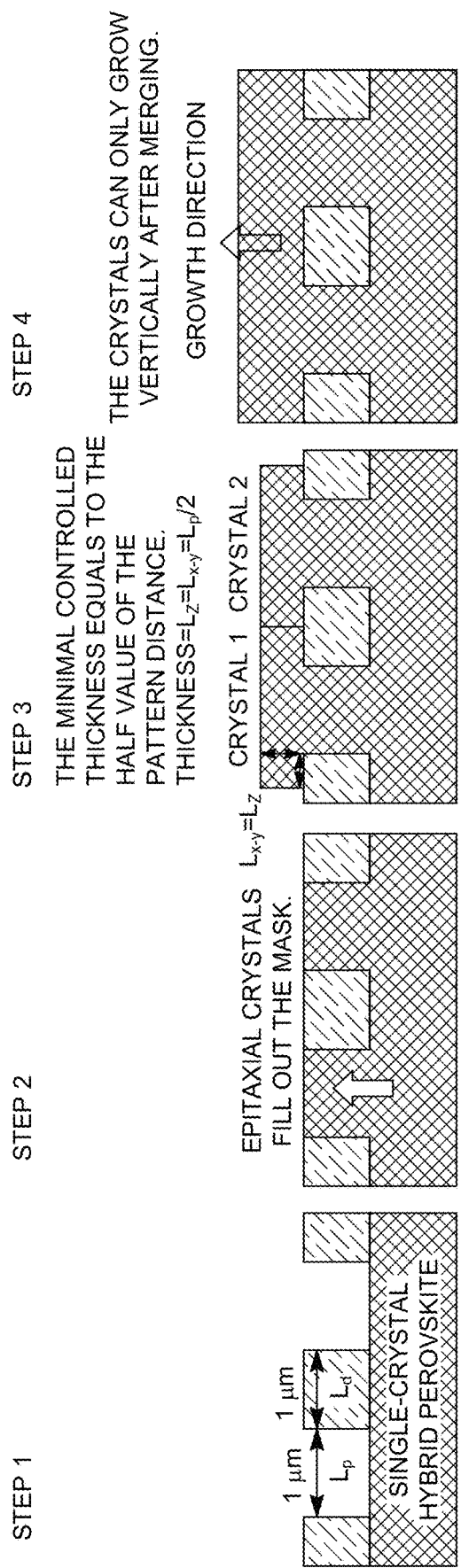
FIG. 6a illustrates the overall growth process, which can be divided into four steps.

FIG. 6a illustrates the overall growth process, which can be divided into four steps. In step 1, photolithography has been applied to generate masks on the single-crystal perovskite substrate. The schematic cross-section shows that the widths of the pattern and the distance between the patterns are about the same ($L_p=L_d$). If $L_p$ is too large, it is impossible to peel off the epitaxial film because the connection between the epitaxial layer and the substrate is too strong. In step 2, the growth starts. The epitaxial crystals fill the pattern openings until the horizontal level of epitaxial crystals and the top surface of the mask are about the same. In step 3, the epitaxial crystals are growing out of the pattern opening, where the growth rate in x-y directions, in principle, equals the rate in the z direction ($r_{x-y}=r_z$). Therefore, the grown lengths in all directions are considered to be the same ($L_{x-y}=L_z$). As the growth continues, adjacent crystals will start to merge. The thickness of such a merged thin film $L_{x-y}$ is only half of the $L_d$. The smaller the designed $L_d$, the thinner the epitaxial film. In step 4, the epitaxial crystals fully merge into a continuous thin film and grow only in thickness.

Because the epitaxial nature of the growth process, all crystals grown from the individual exposed area have the same lattice structure, morphology, and orientation, which are all determined by the substrate. When two adjacent epitaxial crystals are growing large enough to contact with each other, there will be no tilting or twisting of the lattice at the interface. Therefore, no grain boundaries will be formed when adjacent crystals are merging with each other.

Figure 6B:
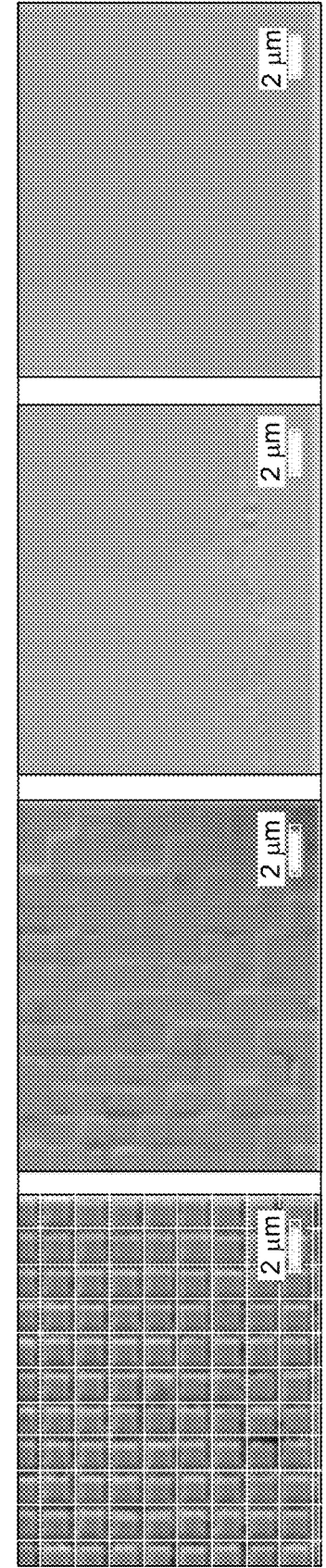
FIG. 6b shows the epitaxial merging steps by a sequence of SEM images.

The different stages during the growth/transfer growth process can be revealed by SEM images, which may better illustrate the merging of the epitaxial crystals. This is illustrated in FIG. 6b, which shows the epitaxial merging steps by a sequence of SEM images. First, individual single-crystals grow out of the mask. The lattice orientation of the epitaxial crystals is the same, which is controlled by the substrate. Then, the individual crystals gradually expand and contact each other. No lattice tilting or twisting can be found. Finally, completely merged single-crystal thin films are formed, where no grain boundaries can be seen. FIG. 1c shows that different growth behavior arises under different growth temperatures and precursor concentrations. Low temperature and concentration can result in thin films (left), while high temperature and concentration lead to rods (right). Also, the HRTEM image in FIG. 1c can clearly reveal the chemical epitaxial relationship between the substrate and the as-grown thin film. The XRD measurements in FIG. 1d also serve as additional evidence that the epitaxial crystals have the same orientation as the substrate.

Figure 6C:
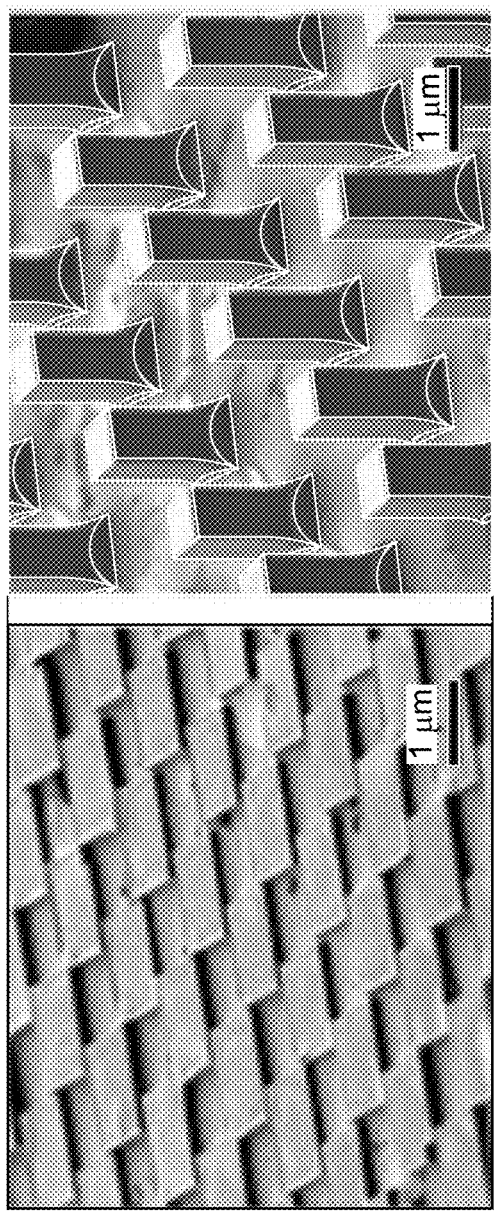
FIG. 6c shows that the growth rate in different directions can be effectively tuned by using different growth temperatures and precursor concentrations.

Additionally, it has also been found that the growth rate in different directions can be effectively tuned by using different growth temperatures and precursor concentrations (see FIG. 6c). At a low growth temperature, the growth rate in all directions is low because of the temperature-reversal growth behavior. The growth rate would be surface reaction controlled. Then the precursor molecules have sufficient time to diffuse and adsorb at the most energetically favorable locations. The tri-phase interface between the single-crystal perovskite, substrate surface, and the growth solution is more favorable for nucleation and growth than the bi-phase interface between the single-crystal perovskite and the growth solution. Therefore, the precursor molecules would prefer to adsorb at the tri-phase boundary, which contributes to the growth in the x-y directions. This is also why in the literature, almost none of the freestanding bulk single crystals have perfect cubic shapes. The footprint of these bulk single crystals on the substrate is always larger than their heights. The same analysis applies to the scenario when the growth rate is low at a low precursor concentration. With the same pattern design, high growth temperature and precursor concentration lead to vertically standing rods. Because of the high growth rate under the high temperature and concentration, the crystal would quickly consume the precursor molecules in their vicinity. The growth rate is diffusion controlled. Precursor molecules would be depleted in between the crystals, and therefore the growth along the x-y directions is slowed down due to the internal competition for precursor molecules. The growth rate would be dependent on the precursor diffusion from the bulk solution, which is from the z direction of the crystals. Fresh precursor molecules would first arrive at the top surface of the crystals and thus contribute to the fast growth along the z-direction of the crystals.

After epitaxial growth, an in-plane rotation of the patterned mask (e.g., parylene or PI in tis example) together with the top epitaxial thin film is necessary to break the connected single-crystal micro-rods between the epitaxial single-crystal layer and the single-crystal substrate; otherwise, directly lifting up the epitaxial layer may break the epitaxial single-crystal layer.

The whole growth and transfer process can be divided in six steps, which are illustrated in FIG. 5a. In step 1, a single-crystal perovskite substrate is placed into a receptacle (e.g., a PDMS growth mold) for epitaxial growth. The height of the substrate does not need to be the same as the depth of the reservoir or trench in the mold. If the surface of the substrate when placed in the mold is below the surface of the mold, the epitaxial crystals will first fill the gap and then grow out. If on the other hand the surface of the substrate is higher than the surface of the PDMS mold, the attached mask can tightly cover the substrate. In step 2, a soft pre-patterned parylene (or PI) film is fixed with two glass holders on the two ends as a mechanical handle. Then, the mask is attached to the PDMS mold. In step 3, the growth solution is introduced to the growth mold for the epitaxial growth, with controlled temperature, time, and precursors. In step 4, the epitaxial single-crystal films can grow out of the mask with different thicknesses, morphologies, and compositions depending on the growth conditions. In step 5, the top parts (i.e., the epitaxial film and the parylene or PI mask) need to be partially lifted up to separate the glass holder and the PDMS substrate. The rotational movement of the substrate is still restricted by the PDMS holder. In step 6, the parylene or PI-glass holder will be rotated to break the connection. The substrate will be detached from the growth mask.

Figure 5B:
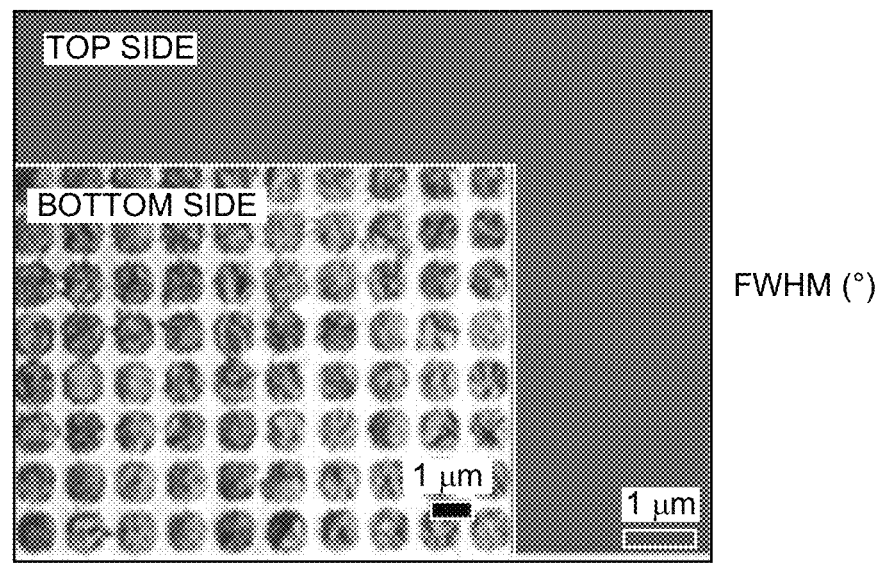
FIG. 5b shows optical images of the top (left) and the bottom (right) sides of the single-crystal $MAPbI_3$ after the in-plane rotation.
Figure 5C:
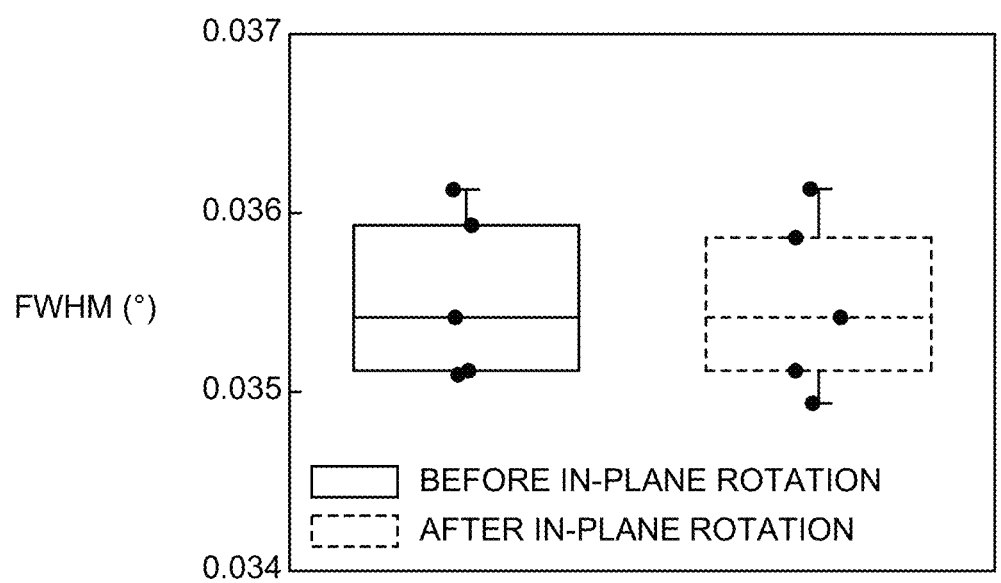
FIG. 5c shows an XRD ω scan
Figure 5D:
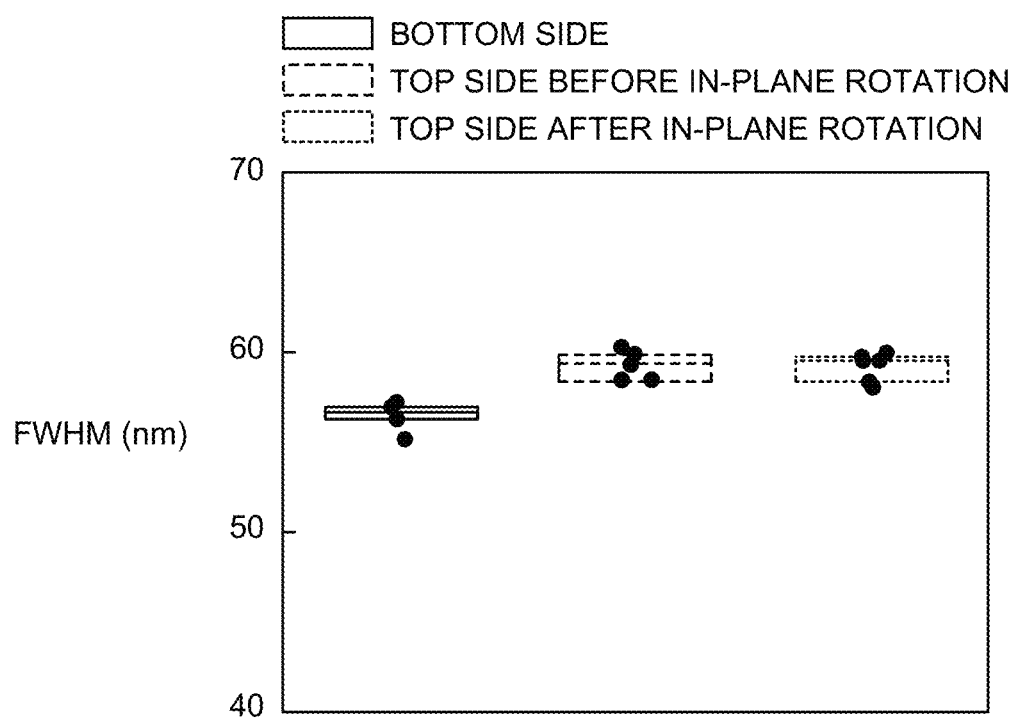
FIG. 5d shows PL measurements, which have also been used to further study the crystal quality before and after the in-plane rotation.

Optical images in FIG. 5b show the top (left) and the bottom (right) sides of the single-crystal MAPbI$_3$ after the in-plane rotation. The broken single-crystal micro-rods can be clearly seen in the soft transfer mask. XRD ω scan in FIG. 5c and PL measurements in FIG. 5d have also been used to further study the crystal quality before and after the in-plane rotation. From the XRD results, no obvious change can be found, indicating the crystal quality before and after the in-plane rotation is similar. The PL measurements exhibit a comparable result, where the full-width-at-half-maximum (FWHM) values do not have a noticeable change before and after the in-plane rotation. Note that the PL measurements give narrower peaks from the bottom side compared with the top side, because the bottom surfaces are freshly broken from the bulky parts, whose defect levels are found to be much lower than the existing surfaces that have been treated by solvents.

After the in-plane rotation step, a transfer step can performed to transfer the perovskite single crystals to a new substrate. A re-adhesion process may be used so that the crystals adhere to the new substrate. Two different types of re-adhesion processes will be illustrated, although other alternative approaches may be used as well.

In the first illustrated re-adhesion process, diethyl ether can be used as an assistant antisolvent for transferring the crystals onto arbitrary substrates. It is worth pointing out that the antisolvent for use with single-crystal perovskite transfer in this example is fundamentally different from that used in depositing the polycrystalline perovskite, where the antisolvent is used to quickly wash the precursor solvent (e.g., DMF and DMSO) to uniformly and rapidly crystallize the polycrystalline perovskite. In this case, the anti-solvent is used to facilitate the transfer process in a more convenient way when strong interfacial adhesion forces are not needed. The relatively weak adhesion provided by the use of an antisolvent may be sufficient for various purposes such as taking SEM images, measuring thickness-dependent properties, and characterizing the crystal quality of the transferred single-crystal thin film. As a commonly used antisolvent in polycrystalline perovskite thin film deposition, diethyl ether has strong volatility and does not dissolve the perovskite. Therefore, diethyl ether can be used as a suitable re-adhesion solvent. Of course, other suitable re-adhesion solvent may be used instead.

Figure 7A:
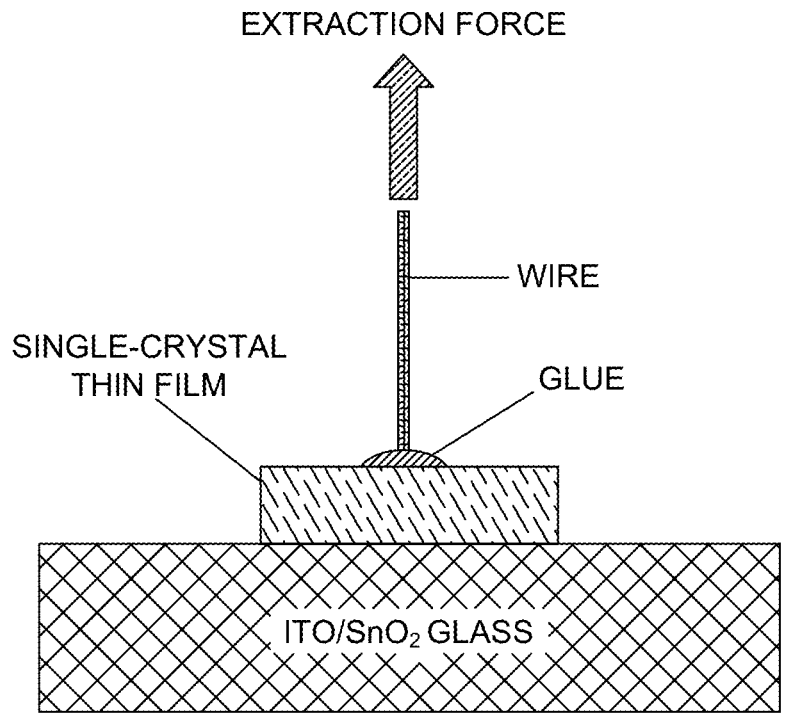
FIG. 7a schematically illustrates a testing arrangement for measuring the adhesion force between the perovskite single crystal thin film and the new substrates.
Figure 7B:
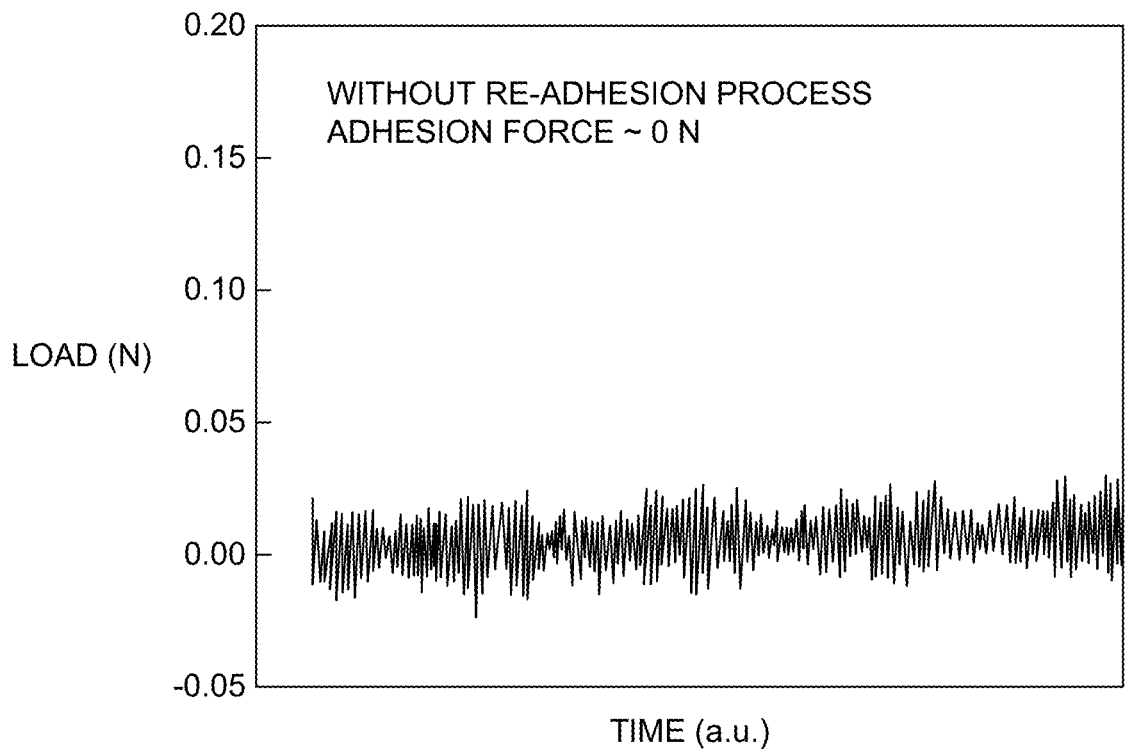
FIG. 7b shows the measurement of load as a function of time.
Figure 7C:
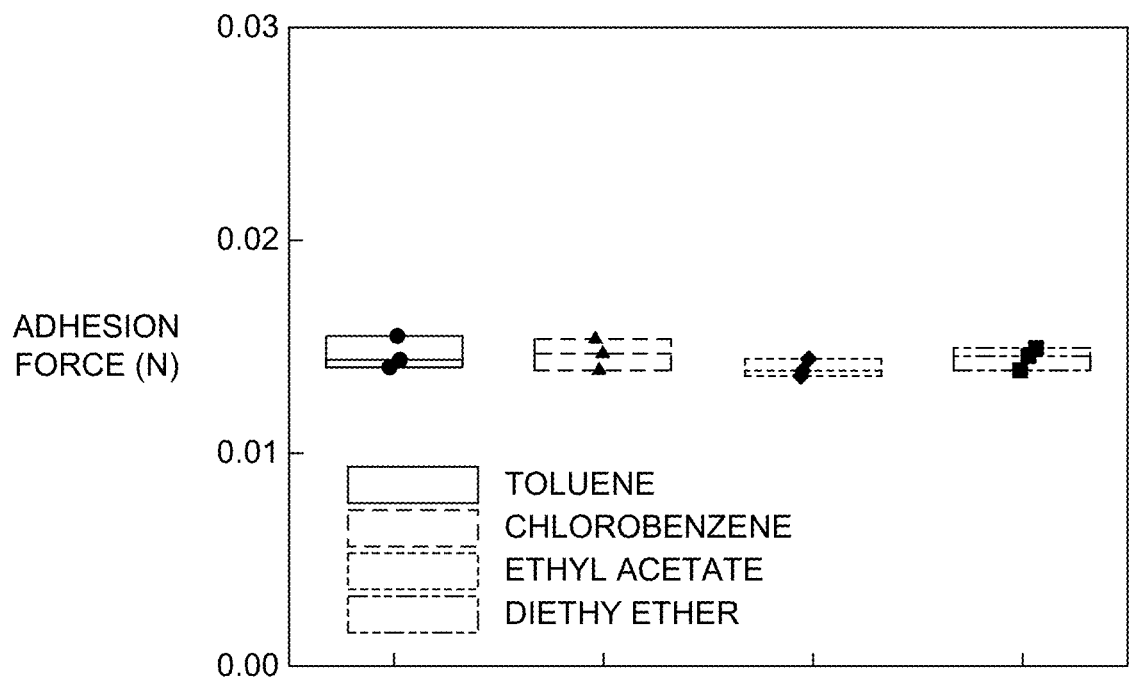
FIG. 7c shows in the measurement of adhesion force using different antisolvents, which exhibit similar adhesion forces.

The adhesion force between the perovskite single crystal thin film and the new substrates has been measured using a testing arrangement schematically illustrated in FIG. 7a. As shown, a Cu wire is fixed onto a single-crystal thin film for applying an external force. As illustrated in the measurement of load as a function of time in FIG. 7b, no adhesion force can be measured without a solvent-assisted re-adhesion process. This indicates that Van der Waals contact exist between two solids, possibly with micro-gaps. Also, as illustrated in the measurement of adhesion force in FIG. 7c, different antisolvents have been shown to exhibit similar adhesion forces.

Figure 7D:
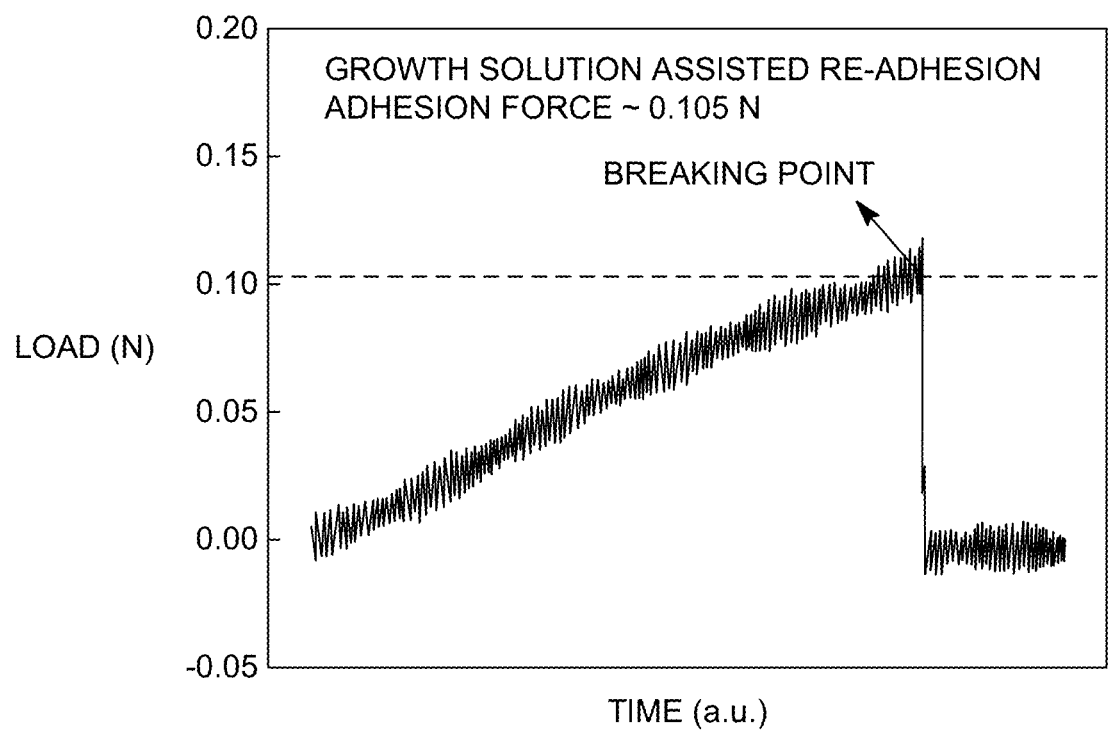
FIG. 7d shows the measurement of load as a function of time for the case of the growth solution assisted re-adhesion process.

However, for device fabrication, a strong interfacial contact between the perovskite single crystal thin film and the new substrates is generally important. Accordingly, to provide a stronger adhesion, a very thin layer of supersaturated growth solution may be first spin-coated onto the target substrate, followed by transfer of the single-crystal thin film onto the new substrate. The substrate then may be baked under suitable conditions (e.g., 80° C. for 1 hour). The thin layer of growth solution between the single-crystal thin film and the substrate will introduce a secondary re-growth process: the supersaturated solution will gradually dry under heating, while new perovskites will be crystallized from the solution. The transferred single crystal film will serve as an epitaxial substrate for growing the new single crystals. As growth proceeds, the new single-crystal perovskite not only fill any micro-gaps between the two solids but also achieve strong adhesion with the substrate, in a similar way to the spin-coating process. The bonding introduced by the crystal growth has been proved to be able to exhibit good adhesion with the substrate, and the measured strong adhesion force confirmed our analysis. This is illustrated in the measurement of load as a function of time in FIG. 7d for the case of the growth solution assisted re-adhesion process.

Finally, the patterned mask can be removed by e.g., dry etching or direct peeling off, depending on the thickness of the mask. For the dry etching of the mask, $O_2$ (or $Cl_2$ and Argon) plasma can serve as the etchant, which has been reported to damage perovskite by introducing a series of decomposition reactions. Even though accurate etching power and time are needed to remove the polymer mask and minimize the plasma damage, surface decomposition after dry etching is inevitable. The surface after dry etching should be cleaned to remove any decomposition residues. A supersaturated MAPbI$_3$ GBL solution will be used to clean the surface by dynamic spin coating followed by a suitable bake (e.g., 80° C. baking for 1 minute).

FIG. 8 shows surface characterization of the crystals after etching and GBL washing. FIG. 8a is an SEM image showing the crystal surface after dry etching and after GBL washing. The rough surface caused by dry etching can be fully removed by GBL washing. After the dry etching, periodic features can be seen in the SEM image The zoomed-in SEM image shows a very rough morphology, which may result from the plasma damage. After washing the perovskite surface with the saturated GBL solution, the rough surface becomes very smooth without any noticeable particles or residues. By using the saturated solution, the perovskite will be minimally dissolved, but the non-perovskite materials can be quickly washed away by the GBL. FIG. 8b shows AFM measurements of a transferred single-crystal MAPbI$_3$ surface before and after GBL washing. The rough surface caused by dry etching can be effectively smoothed by GBL washing. The AFM measurements confirm the observations of the SEM. XRD ω scan and PL measurements also confirm the dramatic changes before and after washing the perovskite film with the saturated GBL solution. FIG. 8c shows XRD ω scan measurements showing the huge difference before and after the washing, indicating that dry etching can cause serious damage to the crystal quality. FIG. 8d are PL measurements that also reveal the same phenomenon, where the unwashed crystal shows a much weaker PL intensity and a broader peak. Before the washing, the FWHM of the XRD peaks is around 0.065, and the PL signals are very weak, indicating that the crystal quality has been degraded by the formation of non-crystalline residues. However, the FWHM of the same sample after washing can be effectively reduced to around 0.03, and the PL signals are significantly enhanced, showing that surface defects induced recombination has been largely reduced after washing.

Figure 9A:
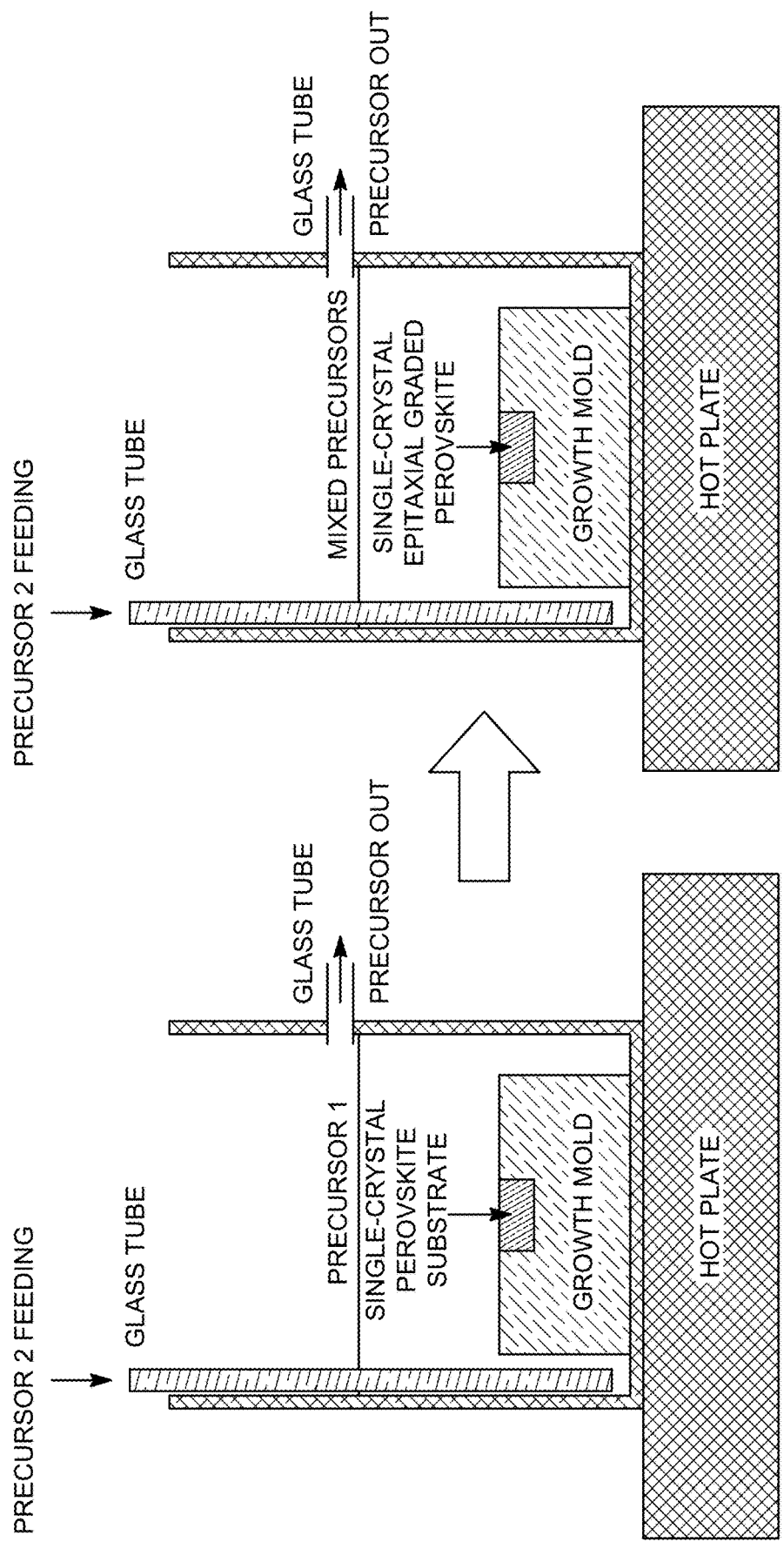
FIG. 9a shows a schematic of a growth system for bandgap-graded single-crystal perovskites.

In some embodiments a continuous growth process may be used to fabricate graded single crystals. This is important to avoid clear structural interfaces that arise in heterojunctions. Such interfaces can serve as carrier recombination centers, decreasing device performance. In one implementation a continuous growth system may be realized by providing two pumping systems for the growth solution: one system injects new precursors while the other extracts supernatant precursors. FIG. 9a shows a schematic of a growth system for bandgap-graded single-crystal perovskites. In this system the precursor solution is continuously exchanged, which allows the formation of an alloyed structure along the epitaxial growth direction. As shown, the perovskite substrate is located in a PDMS growth mold in the precursor solution. A different precursor is fed with designed rates. A container with an open hole is used to hold the growth solution. The open hole can drain unneeded precursors for realizing the continuously changed compositions in the growth solution. Perovskite precursor 1 is added into the container, where the top of the solution is at the same level as the bottom of the hole to ensure that the solution can be promptly and effectively washed out. Next, a glass tube is inserted to the bottom of the container to serve as the feeding source of a different perovskite precursor 2 for changing the growth solution composition. The feeding speed is dependent on the growth speed (e.g., growth temperature, precursor concentration) and the container volume, and can be changed in different systems.

The following is one specific example of the various conditions and parameters used to fabricate graded perovskite single crystals, which is presented by way of illustration. Assuming a graded crystal about 5 mm thick needs 2 hours to grow under certain conditions, the whole solution (i.e., precursor 1) needs to be fully exchanged in 2 hours. Given a container volume of 5 mL, the pumping speed should be 41.67 μl/min. If a high temperature/concentration and a smaller container are used, the growth time for a thickness of 5 mm may be reduced to 1 hour. Using a volume of 3 mL, the pumping speed should be 50 μl/min. For a very small thickness, the growth time is much shorter. If a 0.5 mL 1 M solution is used at 80° C., then the pumping speed should be 1 ml/min for growing a 2 μm thick film.

Figure 9B:
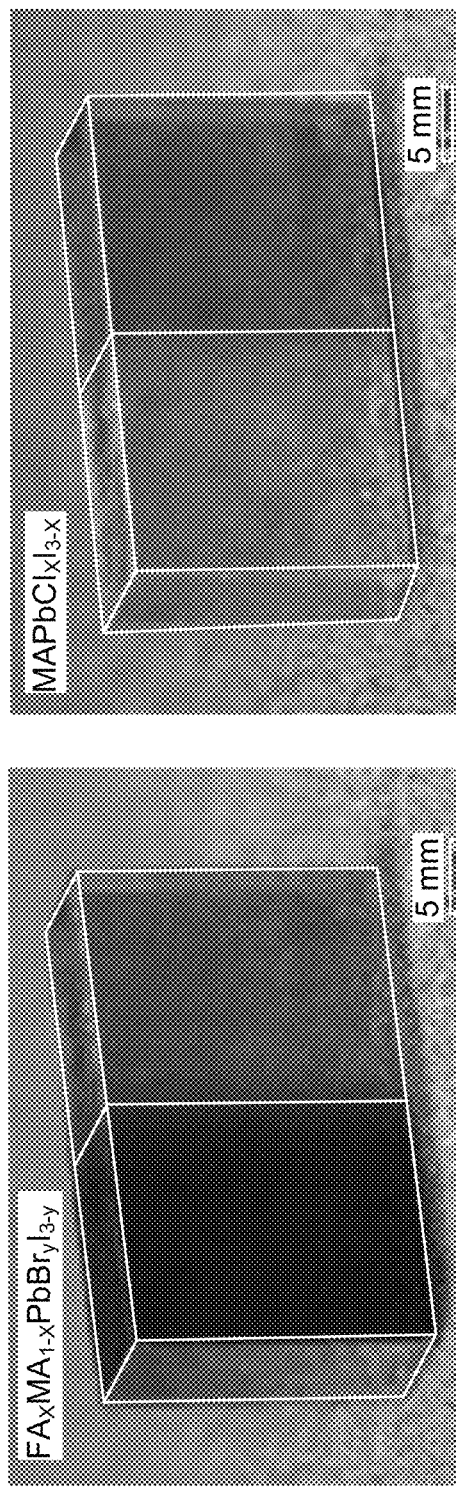
FIG. 9b shows optical images of two representative types of graded single-crystal perovskites.

It is important to note that the new precursor (precursor 2) generally should be pre-heated before being injected to the same temperature as the growth condition. Otherwise, the freshly mixed solution during the precursor exchange will not be able to reach the preset temperature, which makes it difficult to determine the actual growth temperature. The lukewarm solution may also dissolve the already grown epitaxial single-crystal thin crystals/films. Different pumping speed may be used to grow different gradient profiles. Graded single-crystal perovskites can be grown with different ion combinations and ratios of cations and anions. FIG. 9b shows optical images of two representative types of graded single-crystal perovskites. The alloyed region is at the interface (about 1 mm in width, depending on the alloying rate) between the different colored crystals. Organic cations, inorganic atoms, and halides can all be alloyed.

Interfacial Quality Studies in the Growth/Transfer Process

The quality of interfacial adhesion between different layers of materials in single-crystal perovskite electronic devices is a major challenge. In particular, the interface between single-crystal perovskite and other functional layers (e.g., ETL, HTL) can substantially determine the charge transfer and the device performance. Therefore, it is important to understand the interfacial quality in the growth/transfer process. In the growth/transfer process, there are two steps that involve the usage of solvents to treat the interface of the single-crystal perovskite thin films. The first is to perform the re-adhesion/re-growth steps as part of the transfer process. The second is to wash the single-crystal perovskite surface after dry etching.

1. Re-Adhesion/Re-Growth Process.

In the re-adhesion/re-growth step, the supersaturated growth solution is firstly spin-coated onto the target substrate. Then, the peeled-off single-crystal $MAPbI_3$ thin film is attached to the supersaturated growth solution on the substrate. Finally, the entire system is placed onto a hotplate until full growth of new single crystals from the spin-coated supersaturated growth solution. In this whole process, the substrates are only serving as inert "holders" to mechanically support the spin-coated growth solution and are not chemically involved in the growth process. The substrates do not react with the solution or the perovskite materials. Therefore, the growth behaviors, crystal structures, and interface properties of single-crystal perovskite should not be influenced by the substrates. To clearly reveal the quality at the interface, systematic studies include TEM, XRD, optical topography, PL, temperature-dependent Hall mobility, TRPL, trap density, TPV, TPC, adhesion force, and contact angle have been performed. Besides, different kinds of substrates have also been studied to qualify substrate independence. The detailed discussions can be seen below.

Unlike in preparation of polycrystal perovskite films, the perovskite solution is spin-coated onto a substrate, followed by annealing, where the crystal quality has been proven to be substrate-dependent. The major reason is that those interfacial properties of the substrate can largely influence nucleation, growth, and formation of the perovskite and may cause an incomplete conversion from the precursor to crystals during the rapid deposition process. However, the mechanism of preparing single crystals in this study is totally different. Unlike the rapid crystallization process in the spin-coating method, the process in this study is epitaxial growth, where the transferred single crystal thin film is serving as the real epitaxial substrate for interfacial crystal growth. The nominal substrate at the bottom is only providing the mechanical support for the growth process. Therefore, the substrate properties should have minimal influence on the quality of interfacial crystals.

Figure 10A:
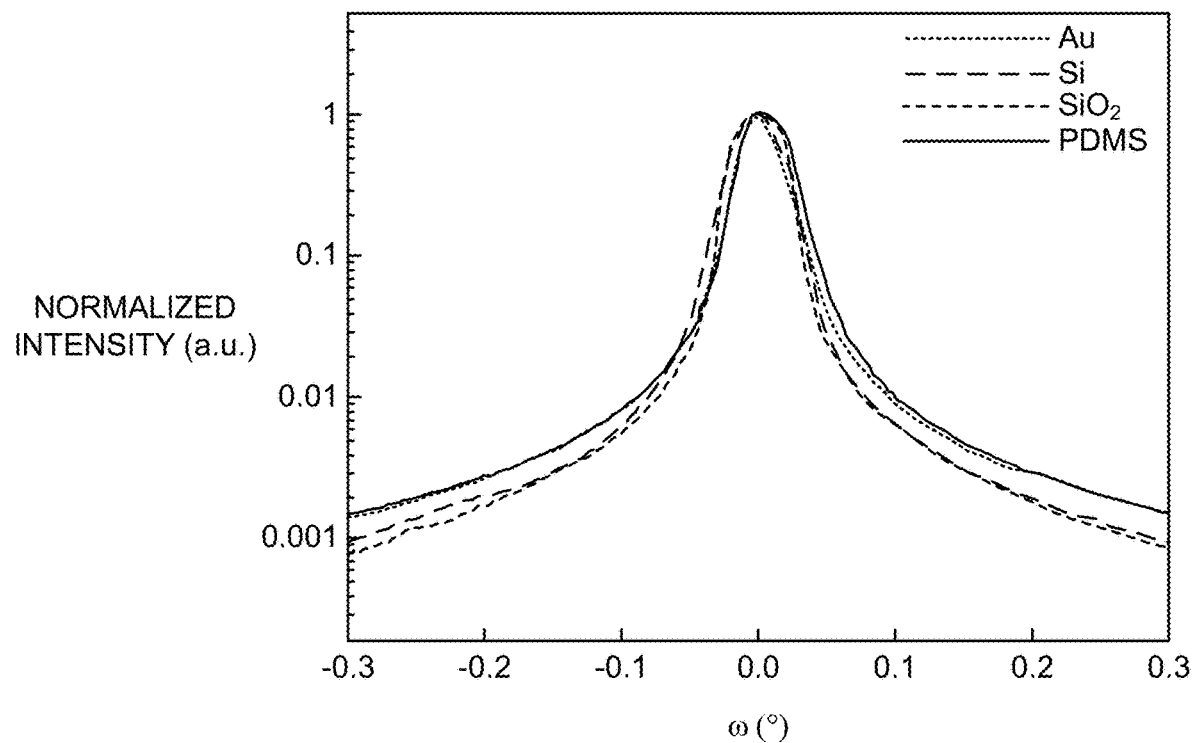
FIG. 10a shows an XRD ω scan with transferred single-crystal $MAPbI_3$ on different substrates.
Figure 10B:
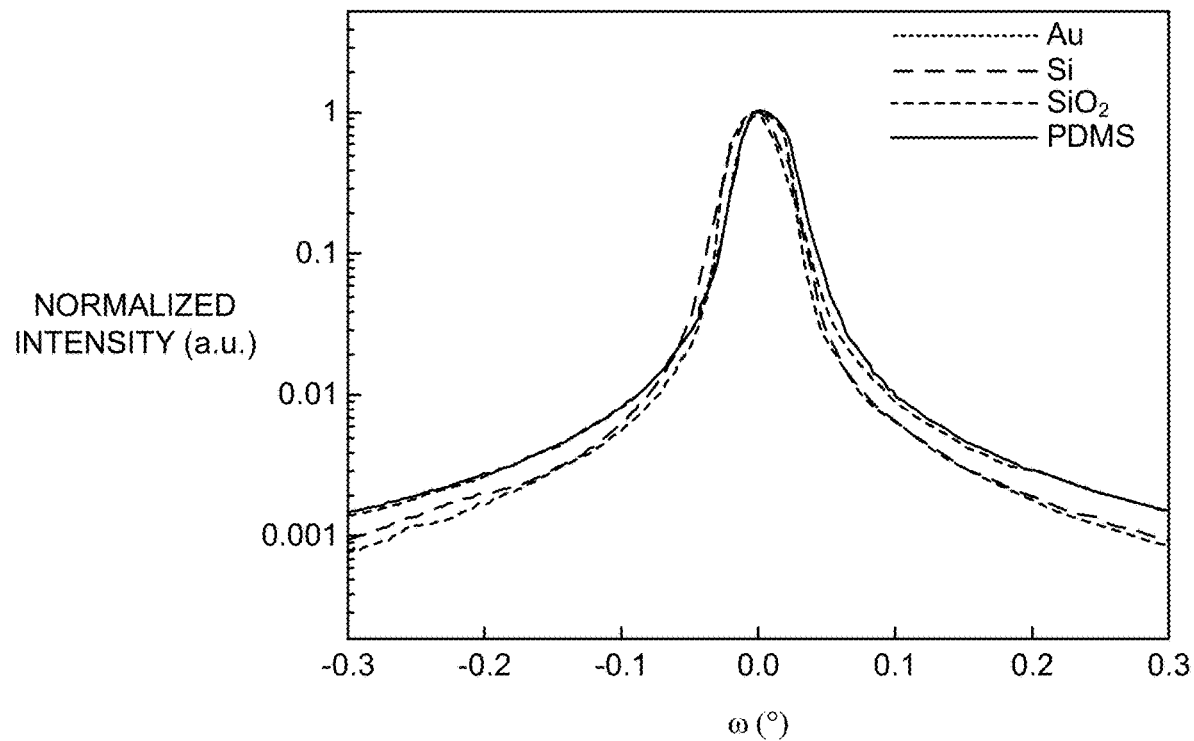
FIG. 10b shows PL measurements with transferred single-crystal $MAPbI_3$ on different substrates.

The overall crystal quality of the transferred single-crystal $MAPbI_3$ after the re-adhesion/re-growth process on different substrates has been studied by XRD and PL. XRD ω scan has been performed for the transferred single-crystal $MAPbI_3$ on different substrates, whose FWHM is commonly used to evaluate the crystal quality. FIG. 10a shows an XRD ω scan with transferred single-crystal $MAPbI_3$ on different substrates. It can be seen that the FWHM of the XRD peaks does not show noticeable changes with different kinds of substrates. PL measurements with transferred single-crystal $MAPbI_3$ on different substrates shown in FIG. 10b also exhibit similar results, where both the intensities and the FWHM of the peaks do not change with different substrates, indicating that the possibility of radiative recombination and the crystal quality are similar to each other.

Figure 11A:
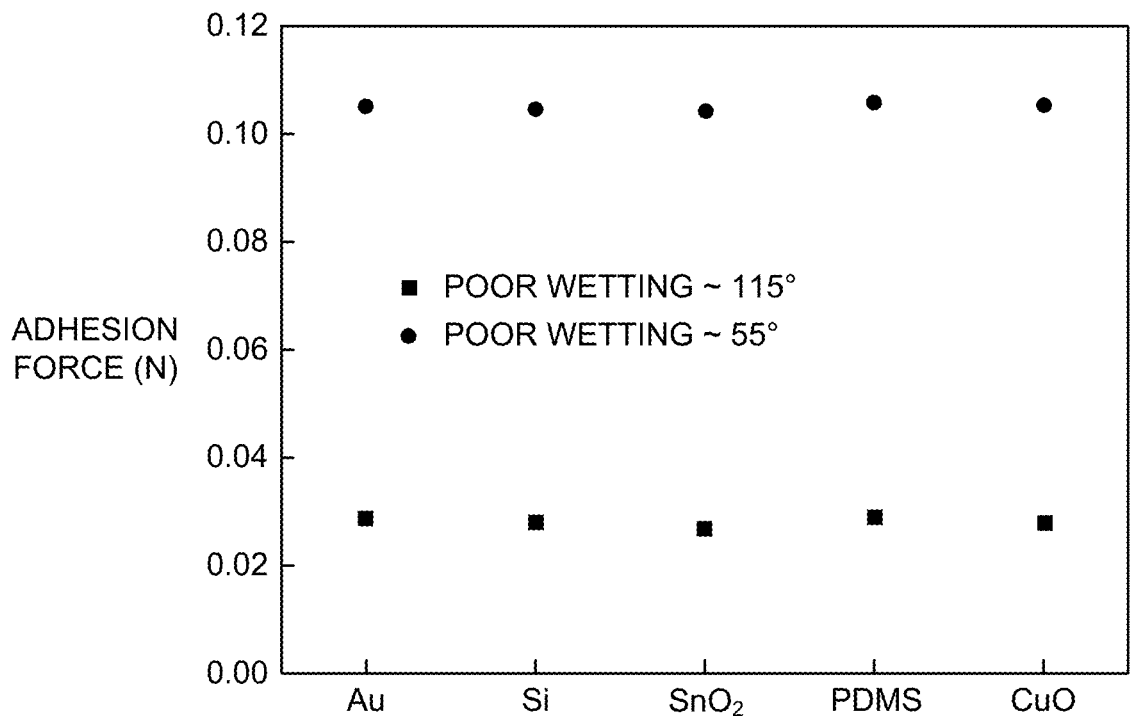
FIG. 11a shows the measured adhesion force between the transferred single-crystal $MAPbI_3$ and different substrates with good and poor wetting conditions.
Figure 11B:
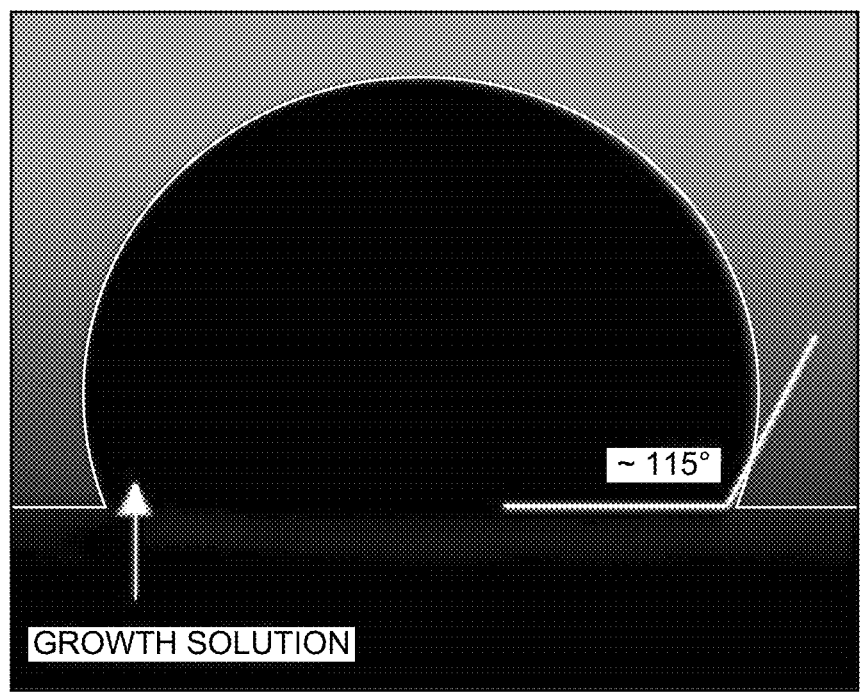
FIGS. 11b and 11c show contact angle measurements on an Au surface after being treated by UV-Ozone for 2 minutes and 10 minutes, respectively.
Figure 11C:
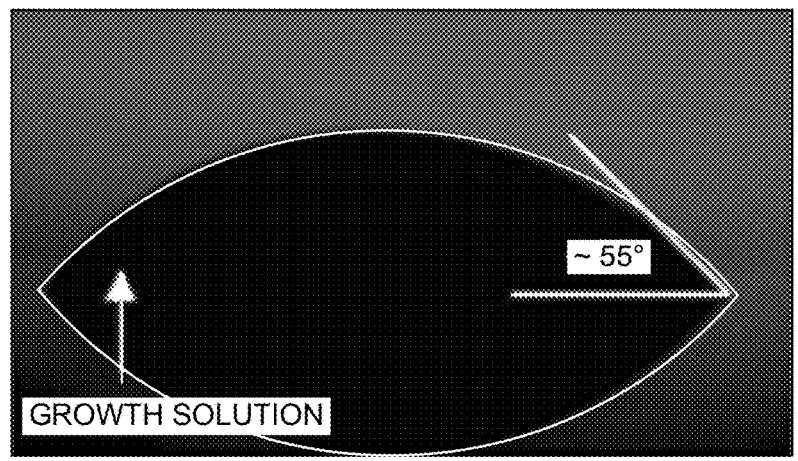

However, substrates with different wetting behavior of the precursor solution will influence the adhesion force between the crystals and the substrate. If wetting is poor, even though the re-growth can still happen, the bonding between the single crystal and the substrate will be weak. Adhesion forces have been measured under good and poor wetting conditions on different substrates. Usually, the wetting is considered to be poor if the contact angle is between 90° and 180°, and good if the contact angle is less than 90°. FIG. 11a shows the measured adhesion force between the transferred single-crystal MAPbI$_3$ and different substrates with good and poor wetting conditions. Good wetting can always give a strong adhesion force regardless of the substrate. FIGS. 11b and 11c show contact angle measurements on an Au surface after being treated by UV-Ozone for 2 minutes and 10 minutes, respectively. By controlling the surface treatment, the wetting conditions and contact angles can be well controlled. As the figures demonstrate, the contact angle can be roughly controlled by adjusting the time for treating the substrate surface using UV-ozone or oxygen plasma. As long as the time of substrate treatment is enough, all substrates used in this study produce similarly high adhesion force of the single-crystal perovskite. For example, even though the PDMS surface is one of the most difficult substrates for achieving good wetting with the precursor solution, we found that a 10 minute UV-Ozone treatment to be enough to achieve good wetting. A good wetting condition can always result in a strong adhesion force, regardless of the substrates. Good adhesion between the single-crystal perovskite and the substrate is necessary for achieving high-performance photovoltaic devices.

Figure 12:
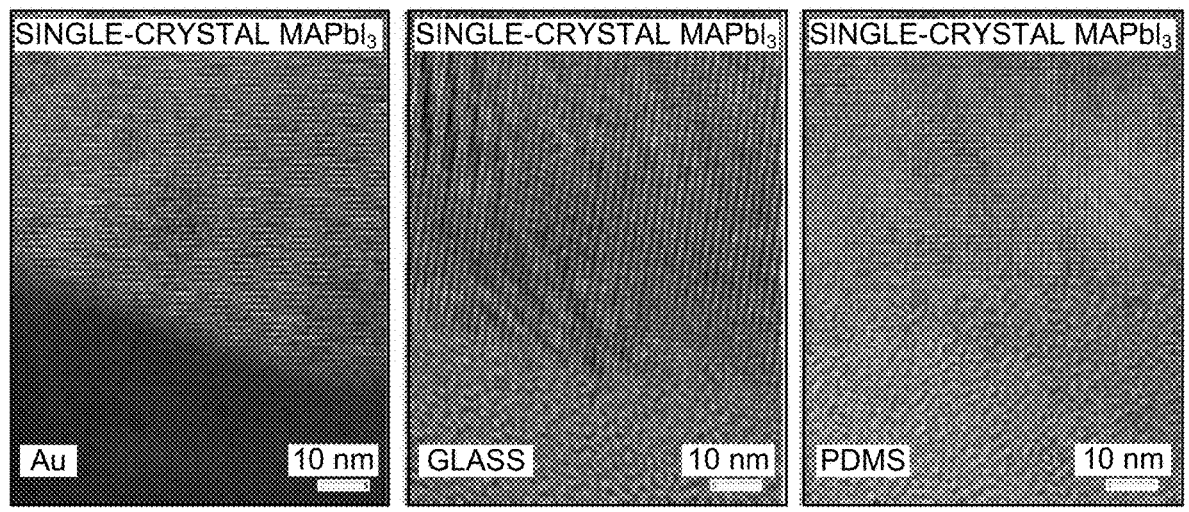
FIG. 12 shows HRTEM studies of transferred single-crystal $MAPbI_3$ on different substrates.

To reveal the interfacial crystallinity at the interface, interfacial cross-section of the crystals on different substrates has been studied by high-resolution transmission electron microscope (HRTEM). Specifically, Au, glass, and PDMS substrates are chosen to represent metals, oxides, and polymers. The results can be seen in FIG. 12, which shows HRTEM studies of transferred single-crystal MAPbI$_3$ on different substrates (e.g., Au for metals, glass for oxides, and PDMS for polymers) using this growth/transfer method. The results show that there is no obvious lattice dislocation or polycrystalline structure formed at the interface, indicating that the re-adhesion/re-growth process maintained the single-crystal properties of the transferred materials. All of the HRTEM results show distinct boundaries between the single-crystal thin film and the substrate, where no noticeable polycrystal or amorphous structures can be found in the single-crystal MAPbI$_3$, indicating that the re-adhesion/re-growth process maintains the high-quality lattice structure of MAPbI$_3$. The reason is that the re-adhesion process is also an epitaxial growth process: during the re-adhesion process, the transferred single-crystal MAPbI$_3$ thin film actually serves as the real "substrate" to guide the epitaxial growth. The transferred single-crystal MAPbI$_3$ thin film, which will not be dissolved in the supersaturated solution, can be considered as a huge "seed crystal" to guide the epitaxial growth. At a relatively slow growth rate of the chemical growth compared with the rapid dynamic spin coating, it is favorable to form epitaxial single crystal from the supersaturated solution. Therefore, the re-growth process will always follow the epitaxy and maintain a high-quality lattice structure.

Additionally, hybrid perovskite includes organic and inorganic components. The results from the HRTEM show only the inorganic framework. It is worthwhile to quantitatively investigate the influence of the sensitive organic component on the trap and defect states.

(1) Thickness-Dependent PL Studies.

Figure 13A:
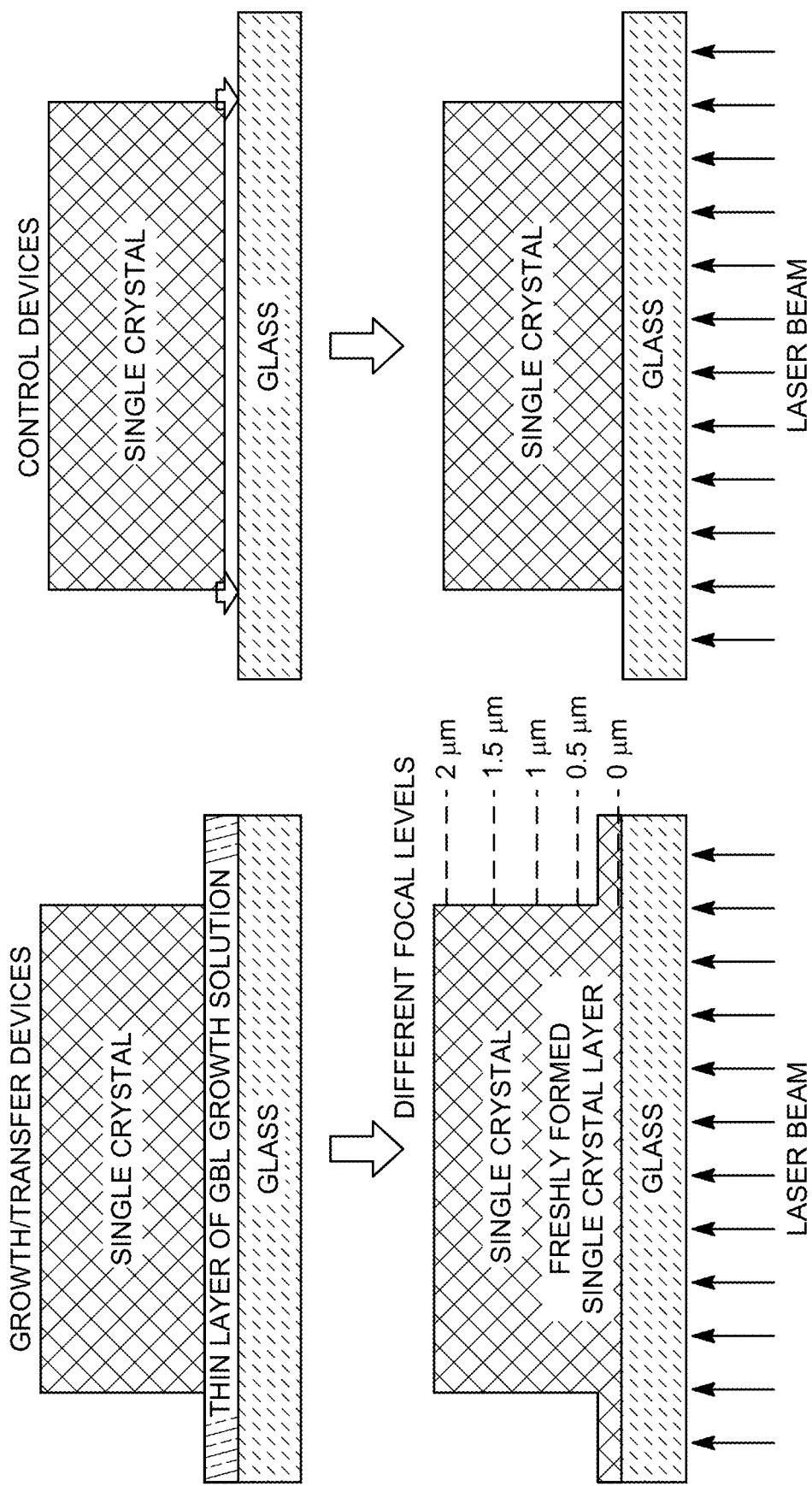
FIG. 13a shows a schematic of an arrangement for characterizing the growth/transfer and control devices.
Figure 13B:
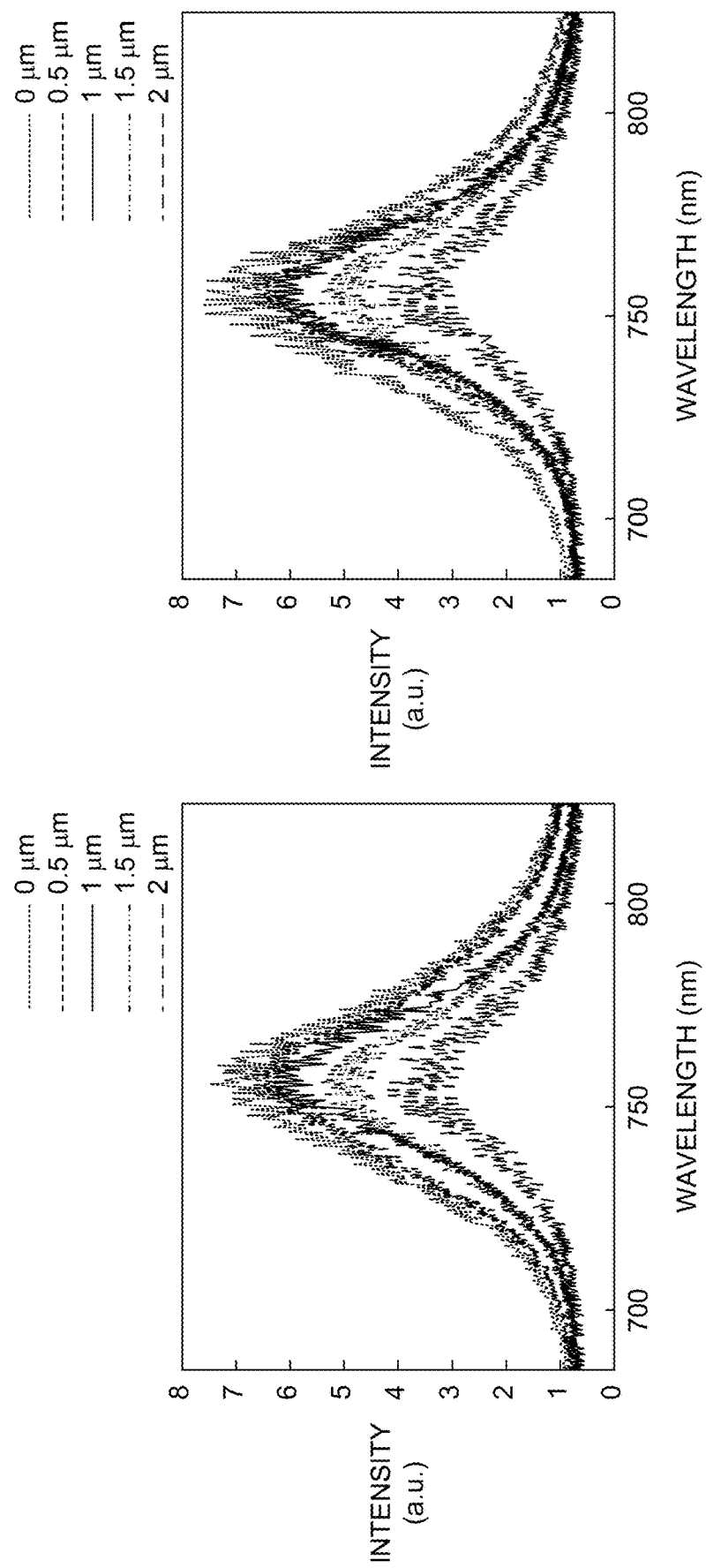
FIG. 13b shows PL measurement results of the growth/transfer and control devices.
Figure 13C:
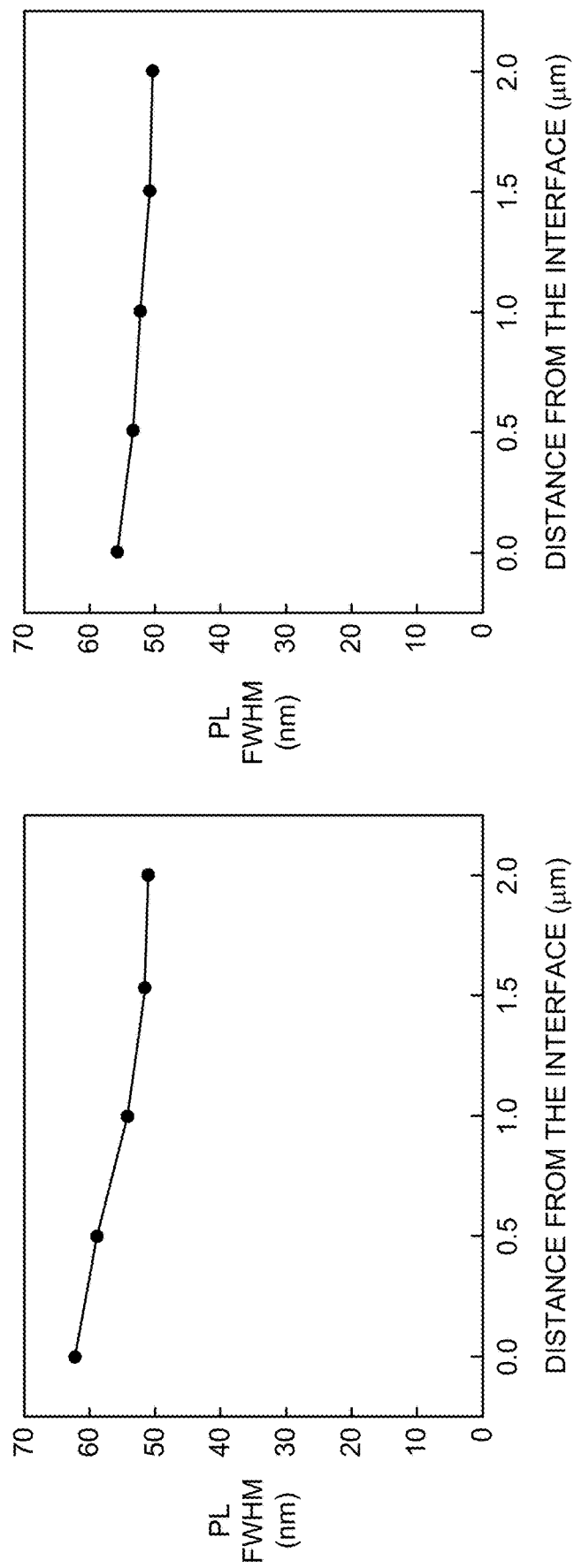
FIG. 13c shows the fitted FWHM results of both devices.
Figure 14A:
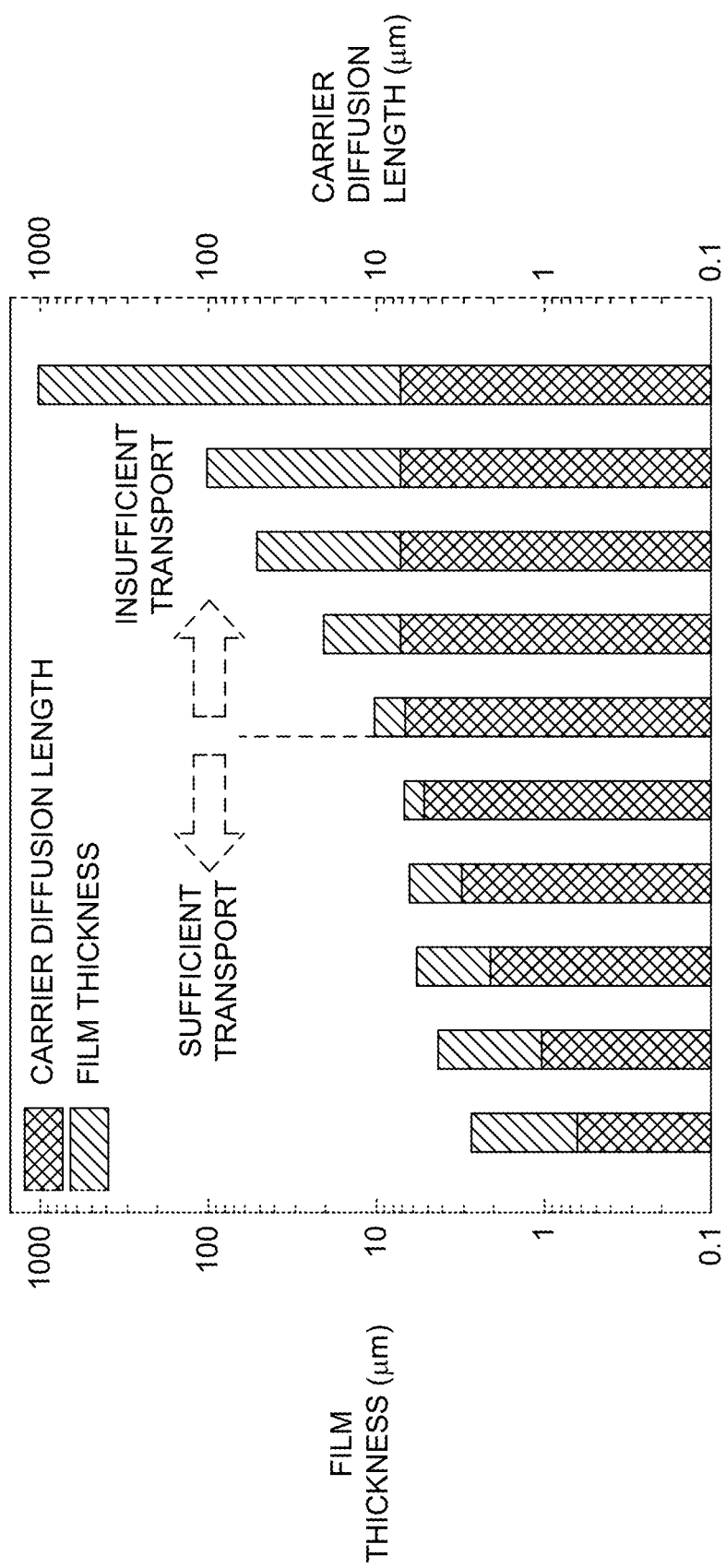
FIG. 14a shows carrier diffusion lengths calculated from measured carrier mobilities shown in FIG. 14b and carrier lifetimes shown in FIG. 14c with different thicknesses of the single-crystal perovskite.

Thickness-dependent PL has been studied to investigate the interfacial crystal quality. FIG. 13a shows a schematic of an arrangement for characterizing the growth/transfer and control devices. As shown, a transparent substrate (glass) has been used to perform the re-adhesion/re-growth process so that the confocal laser beam is able to access the interfacial area. A control device with a simple physical contact to the glass substrate has also been measured. FIG. 13b shows PL measurement results of the growth/transfer and control devices. With different focal levels, as shown in FIG. 13b, the PL intensity decreases because of the self-absorption from deeper focal levels in the single-crystal perovskite. FIG. 13c shows the fitted FWHM results of both devices. The corresponding FWHM of the PL peaks at different focal levels show that the interfacial regions in both devices have the largest FWHM, indicating relatively lower crystal quality at the interface compared with those in the bulk. Such a relatively lower crystal quality at the interface can also be revealed from the thickness-dependent carrier lifetime, carrier mobility, crystallinity, and trap density. FIG. 14a shows carrier diffusion lengths calculated from measured carrier mobilities shown in FIG. 14b and carrier lifetimes shown in FIG. 14c with different thicknesses of the single-crystal perovskite. Insufficient charge collection begins when the thickness goes beyond about 5 µm, which can result in a high recombination possibility in the absorber and thus a low device efficiency. Error bars come from three different measurements under the same condition. The re-adhesion/re-growth device exhibits a slightly larger FWHM value than the control device near the interface, which means the re-adhesion/re-growth step reasonably degrades the interfacial crystal quality in comparison with naturally grown single crystals. FIG. 15a shows XRD ω scan and FIG. 15b shows PL measurements with different thicknesses of the crystals, and FIG. 15c shows trap density measurements. All measurements give the same trend that thicker crystals give better crystal qualities. Error bars come from three different measurements under the same scan conditions.

(2) Hall Mobility Studies.

Figure 16A:
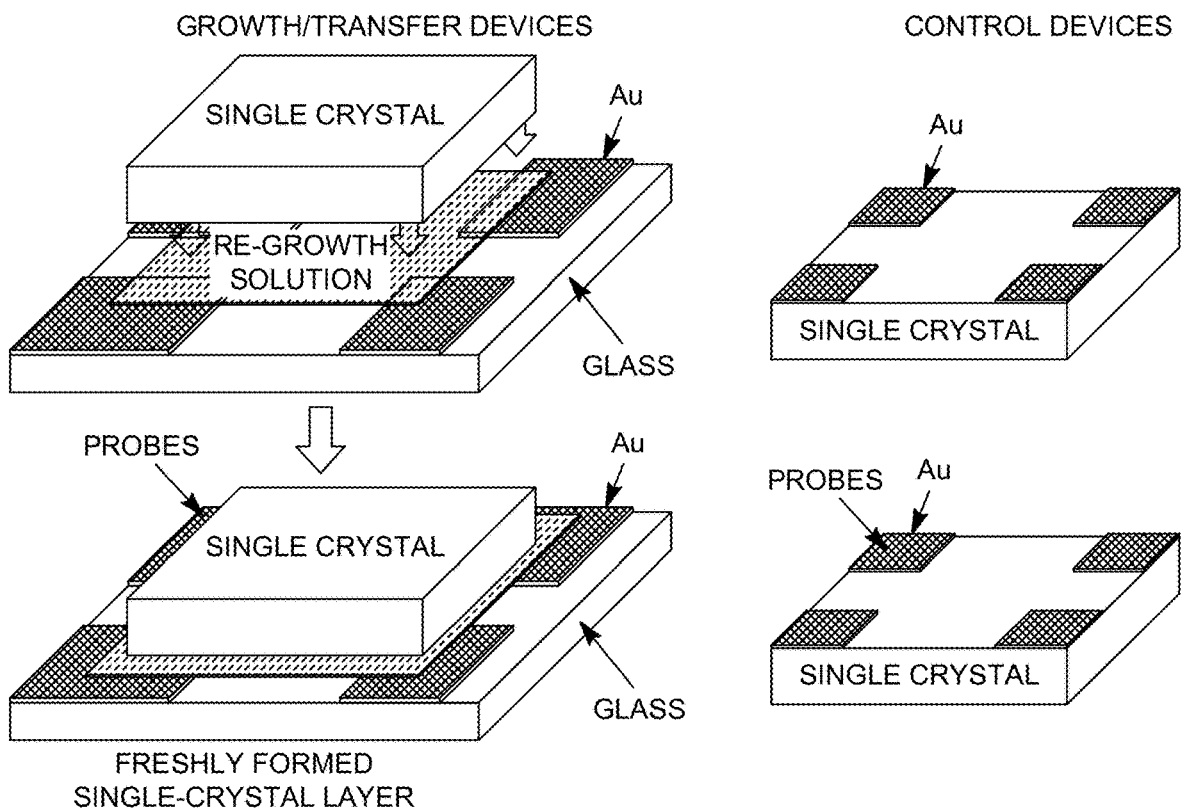
FIG. 16a shows the schematics of a measurement arrangement for growth/transfer and control devices; FIG.
Figure 16B:
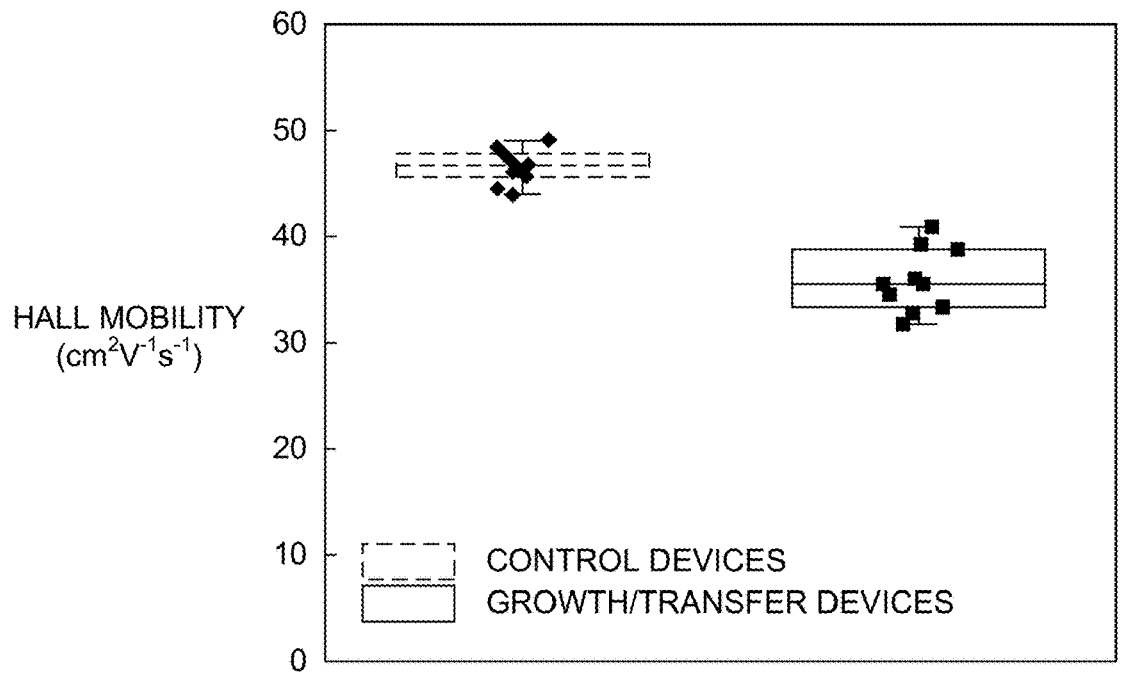
FIG. 16c shows temperature-dependent interfacial Hall mobility measurements.

Hall mobility has been used to provide additional evidence for evaluating the interfacial crystal quality. In general, interfaces formed under different conditions can significantly influence the charge dynamics. FIG. 16a shows the schematics of a measurement arrangement for growth/transfer and control devices. A control device is fabricated by depositing four Au electrodes using E-beam evaporation on top of one surface of a single-crystal perovskite. FIG. 16b shows interfacial Hall mobility results showing that the growth/transfer devices have slightly lower mobilities and larger measurement variations compared with the control devices. The results in FIG. 16b show that the interfacial Hall mobility in the growth/transfer device exhibits a moderate loss and a slightly larger variation compared with the control device. To understand the mechanism of the interfacial mobility loss, temperature-dependent Hall measurements have been used to study the interfacial scattering. In theory, the main factor for determining the carrier mobility is the scattering: impurity scattering and phonon scattering, which can be described by the Matthiessen's Rule:

$$\frac{1}{\mu} = \frac{1}{\mu_{impurities}} + \frac{1}{\mu_{lattice}}$$

where μ is the actual mobility, $\mu_{impurities}$ is the mobility of the material if impurity is the only source of scattering, and $\mu_{lattice}$ is the mobility of the material if phonon is the only source of scattering. Normally, with an increasing temperature, phonon concentration increases and starts to dominate the scattering. Theoretical calculations have already revealed that the mobility in perovskite is dominated by phonon interaction at room temperature, where the relationship between the mobility and the temperature is expected to be described by an inverse power-law with $\mu \propto T^{-3/2}$. The effect of impurity scattering, however, decreases with increasing temperature because the average thermal speeds of the carriers are increased. These two effects operate simultaneously on the carriers through Matthiessen's rule: at lower temperatures, impurity scattering dominates; while at higher temperatures, phonon scattering dominates.

Figure 16C:
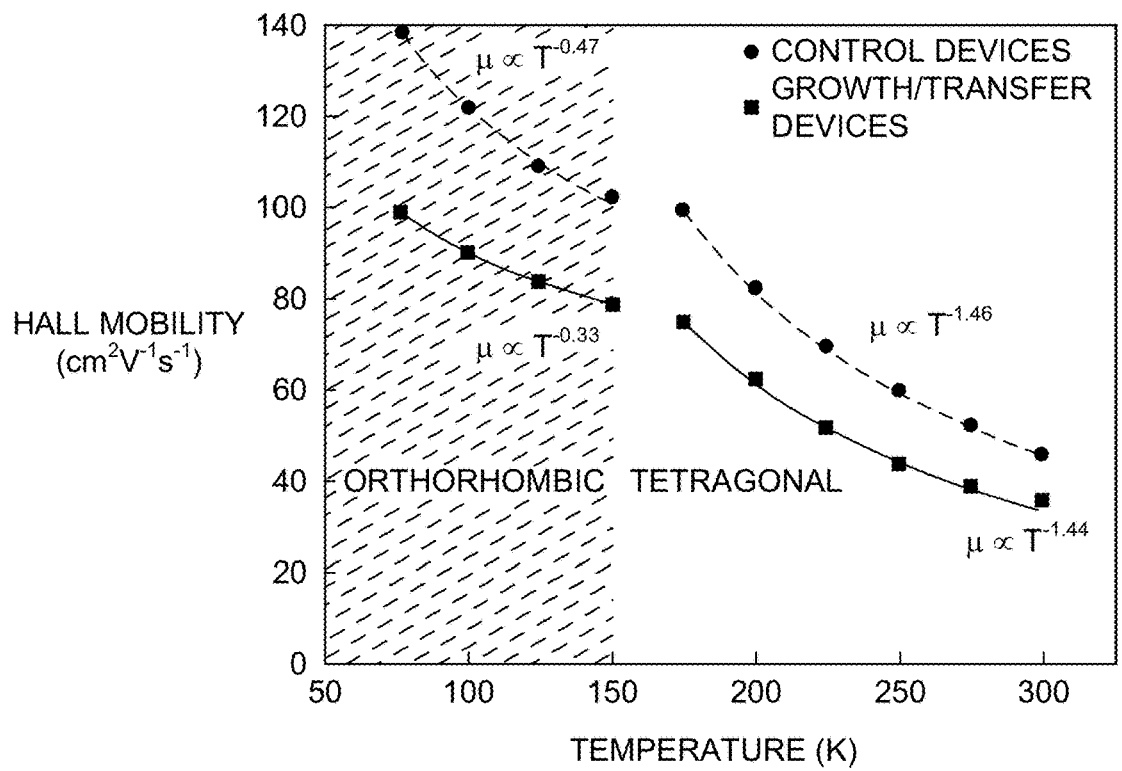

FIG. 16c shows temperature-dependent interfacial Hall mobility measurements showing a noticeable difference in power exponents (about −0.33) for the growth/transfer devices compared with the control devices (about −0.47) under low temperatures, which can be attributed to the increased interfacial impurity scattering of the growth/transfer devices. From the measurements, all devices exhibit an inverse power-law temperature dependence. In the high temperature tetragonal phase, the power exponents are fitted to be −1.46 and −1.44 for the control device and the growth/transfer device, respectively. The power exponents being very close to −3/2 suggests that phonon scattering (in the form of a deformation potential scattering) is dominating the charge transport in both tetragonal phases, and the difference between the two devices is negligible. However, as the temperature decreases to around 150 K, the crystal undergoes a transition from the tetragonal phase to the orthorhombic phase with a relatively abrupt changing of mobility. After that, even though the mobility continues to increase with cooling, power exponents become smaller, around −0.47 and −0.33 for the control device and the growth/transfer device, respectively. The change of the power exponents associated with the phase transition suggests that the carrier scattering in the tetragonal and orthorhombic phases are governed by different mechanisms. The smaller power exponent obtained suggests an enhanced weight of impurity scattering, where such a phenomenon is more noticeable in the growth/transfer device, indicating an increased impurity scattering.

(3) Interfacial Trap Density Studies.

Figure 17A:
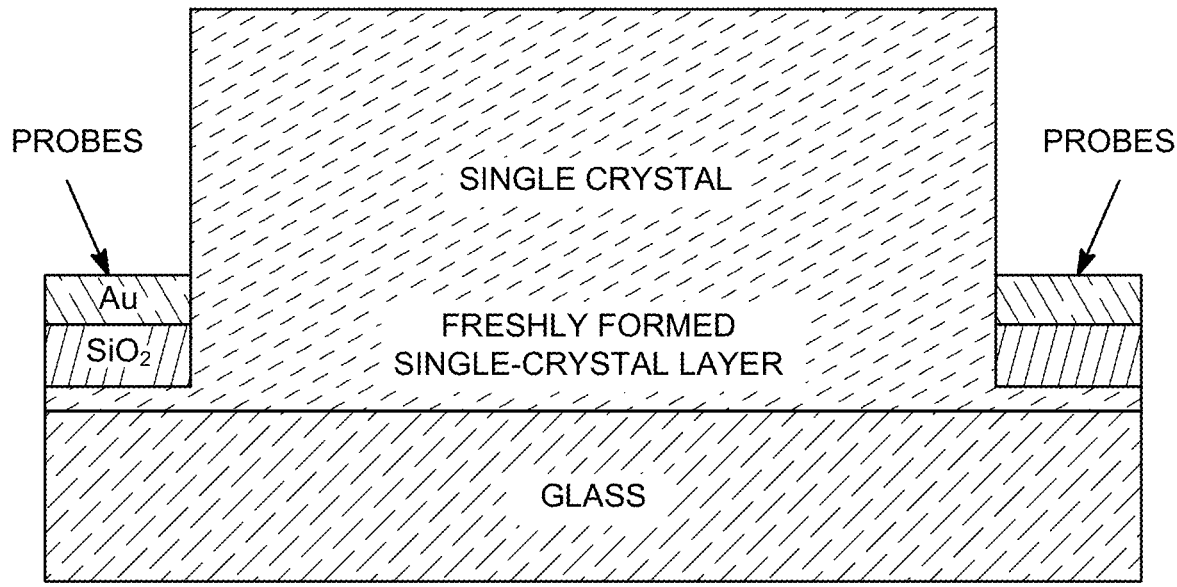
FIG. 17a shows a schematic arrangement for performing interfacial trap density measurements.
Figure 17A:
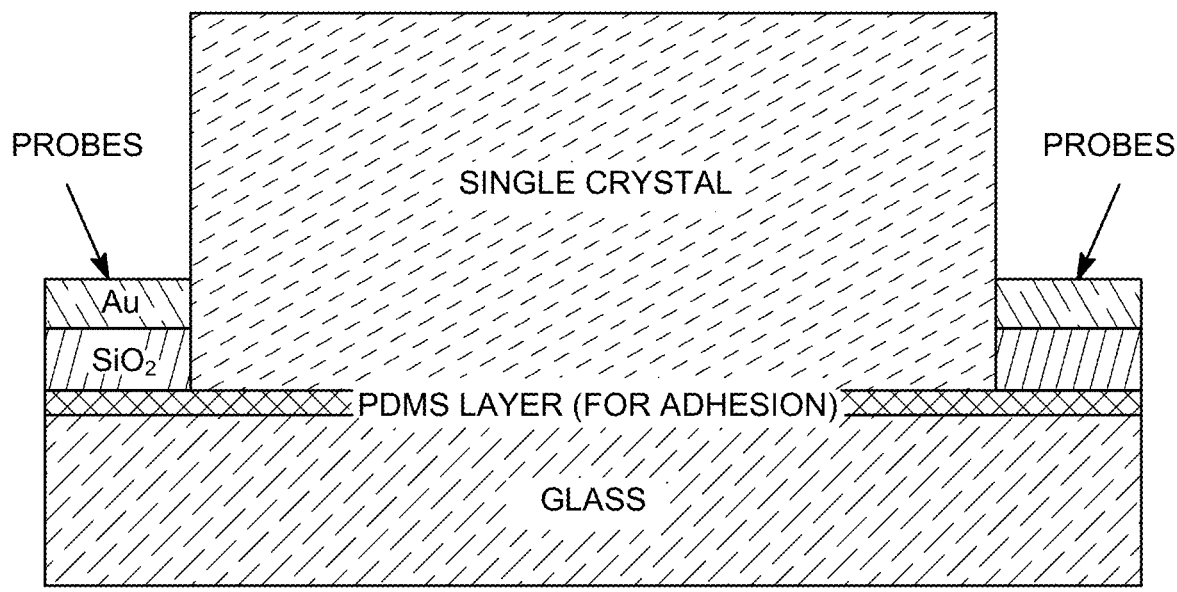
Figure 17B:
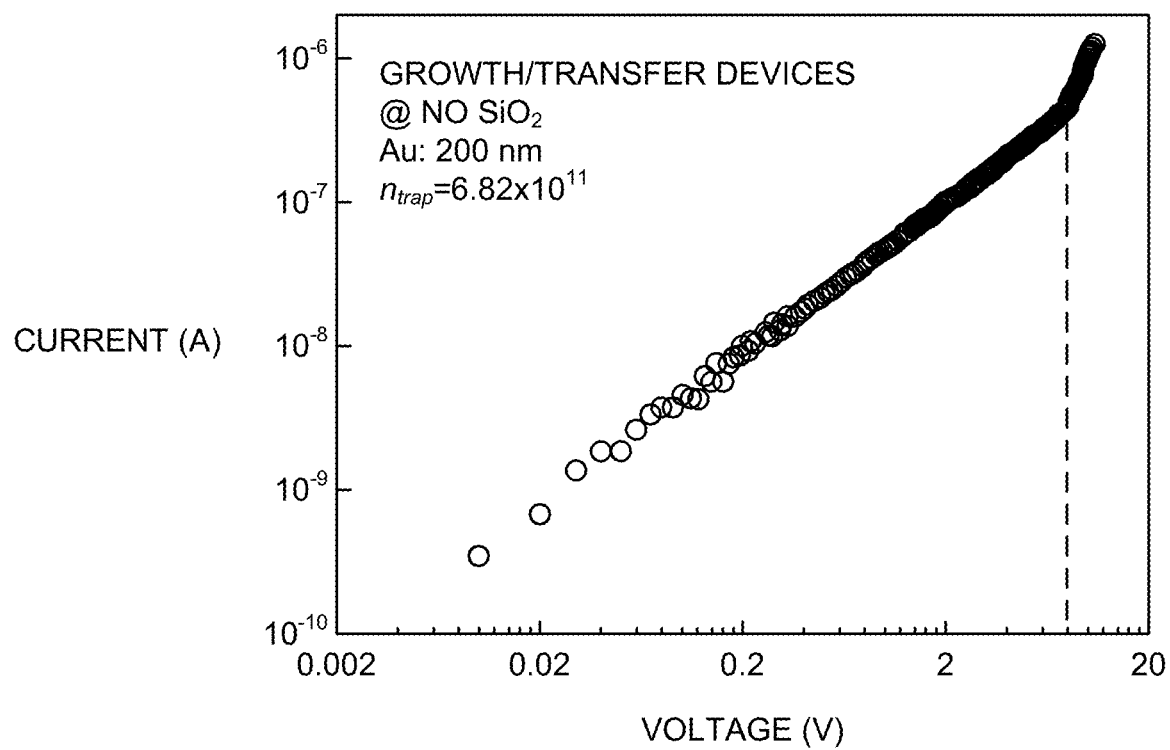
FIG. 17b shows the calculated trap densities at the interfaces of the growth/transfer and control devices.
Figure 17B:
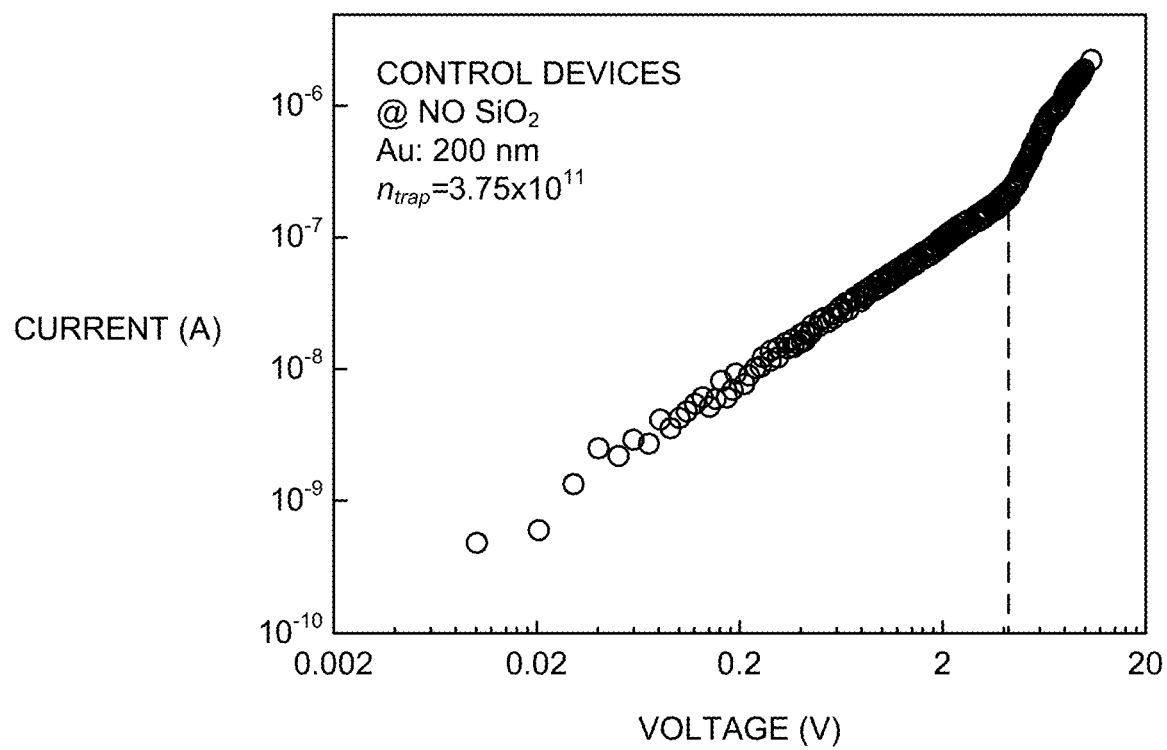
Figure 17C:
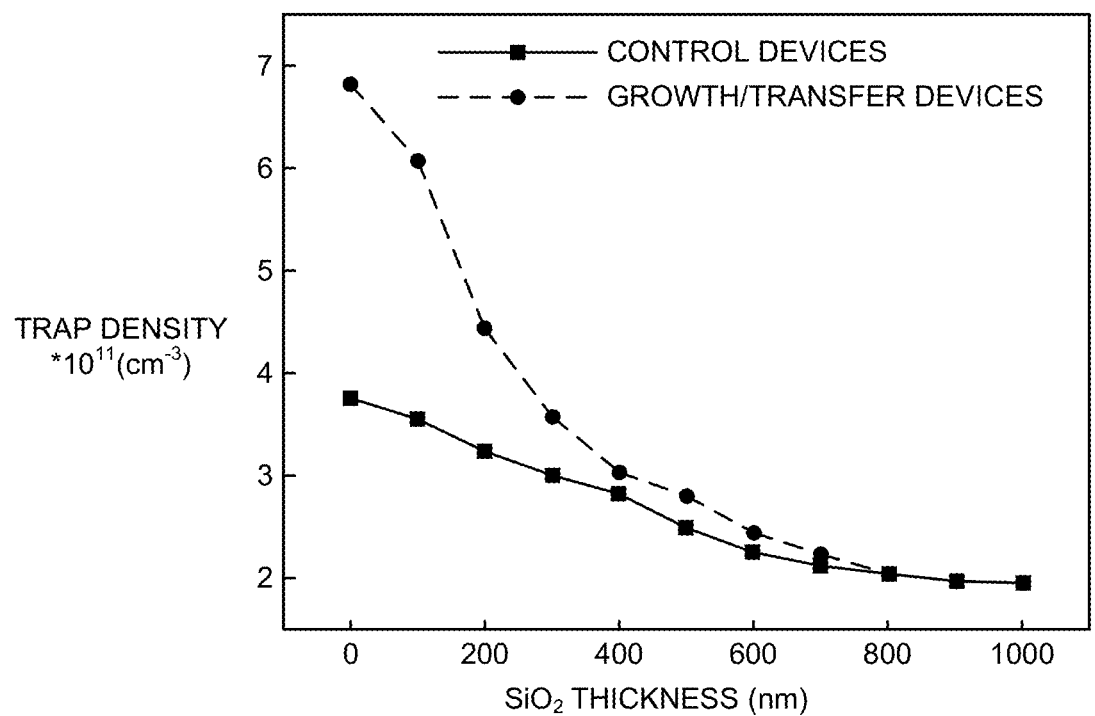
FIG. 17c shows the interfacial trap density results.

Interfacial trap densities of a similar device setup have been measured to confirm the Hall mobility studies. The results are seen in FIG. 17. FIG. 17a shows a schematic arrangement for performing interfacial trap density measurements. FIG. 17b shows the calculated trap densities at the interfaces of the growth/transfer and control devices. FIG. 17c shows the interfacial trap density results showing that the growth/transfer device has a higher trap density close to the interface than that distant from the interface. Here, the $SiO_2$ layer is deposited by sputtering to control the measurement heights in the thickness direction of the single-crystal perovskite. The thicker the $SiO_2$ layer, the further the measured region is away from the interface. The results also show a similar trend to the Hall mobility studies, confirming that the re-growth step can slightly degrade the interfacial crystal quality, which is reflected by a higher trap density of the growth/transfer device.

Figure 18A:
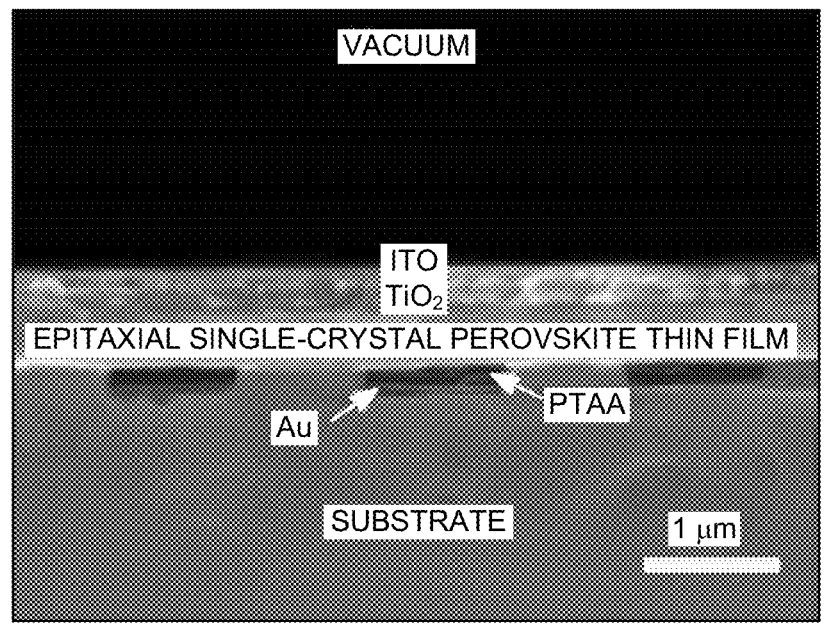
FIG. 18a shows an image indicating that the in-situ fabricated devices do not require additional peeling off the epitaxial single-crystal thin film.
Figure 18B:
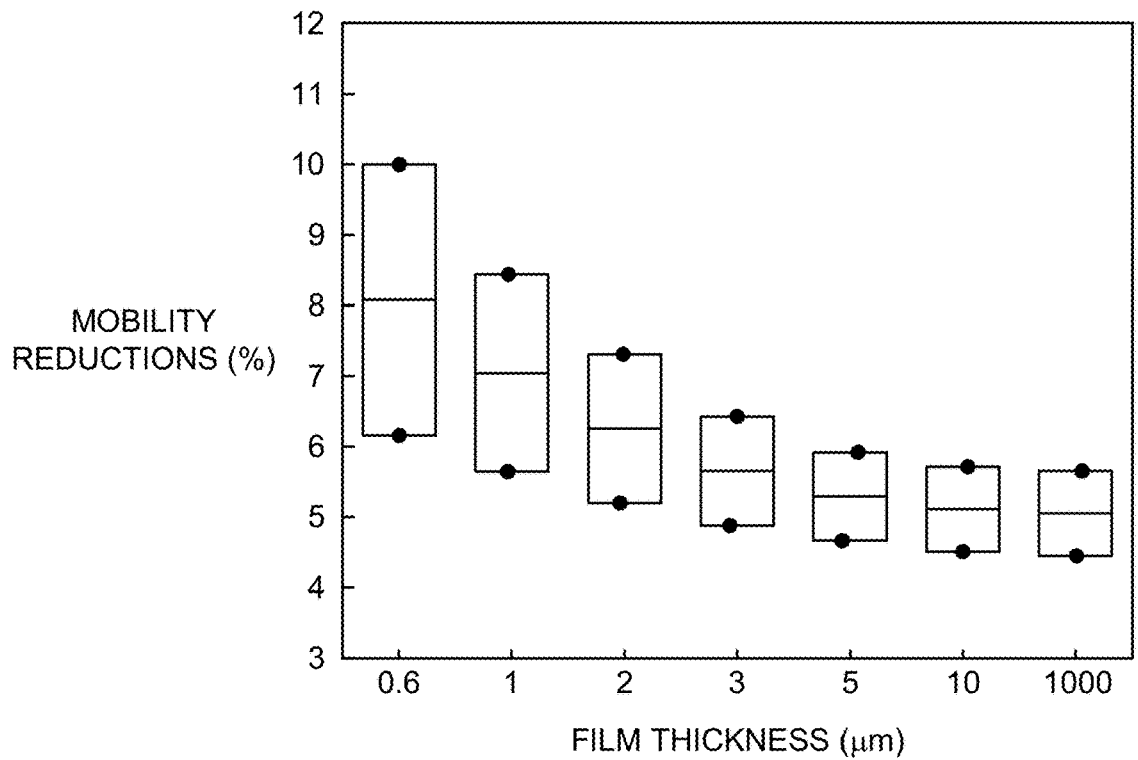
FIG. 18b shows mobility reductions in the $MAPbI_3$ single-crystal thin films with different thicknesses.
Figure 18C:
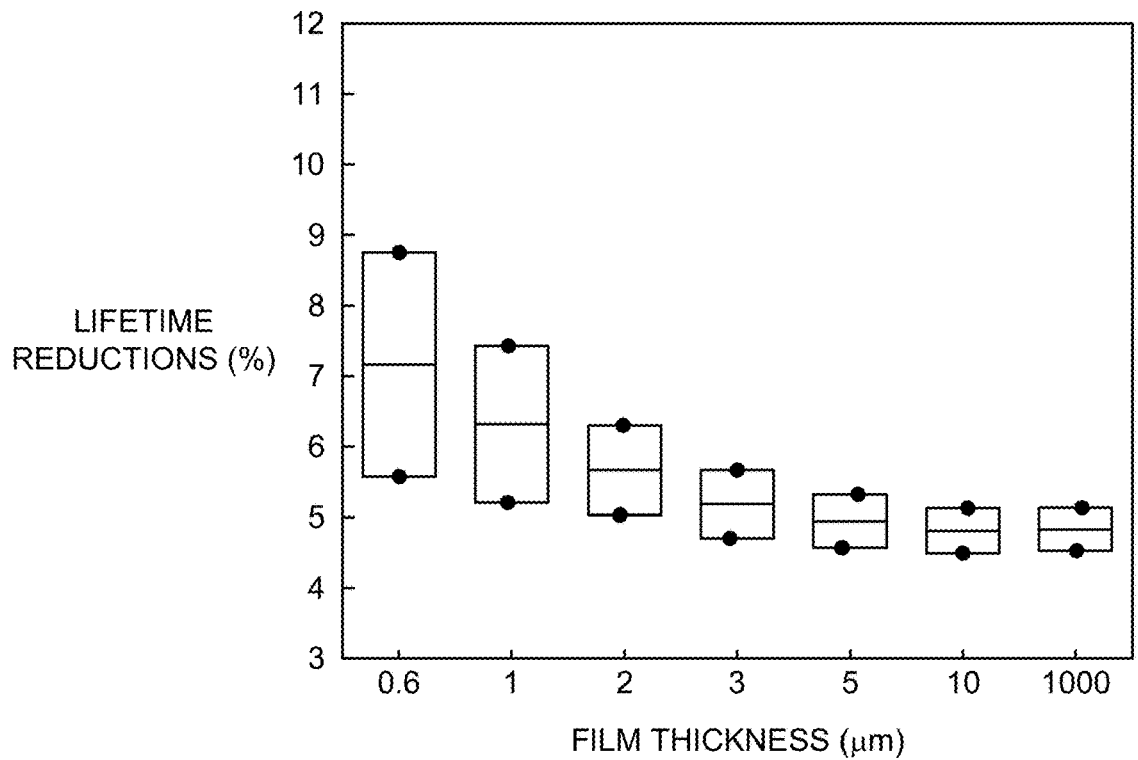
FIG. 18c shows lifetime reductions in $MAPbI_3$ single-crystal thin films with different thicknesses.

Additionally, we measured the overall carrier lifetime and carrier mobility using transient photovoltage (TPV) and transient photocurrent (TPC) to estimate how the interfacial quality can influence the overall crystal properties. FIG. 18a shows that the in-situ fabricated devices do not require additional peeling off the epitaxial single-crystal thin film. FIG. 18b shows mobility reductions in the $MAPbI_3$ single-crystal thin films with different thicknesses. Larger discrepancy exists in thinner films. FIG. 18c shows lifetime reductions in $MAPbI_3$ single-crystal thin films with different thicknesses. A similar tendency to the mobility reduction can be observed, indicating that the electrical measurements in thinner films are more easily to be influenced by solution treatments. The growth/transfer process can decrease the carrier mobility and lifetime by ~4-5%, which is considered to be insignificant. The interfacial quality can be improved by surface/interface passivation to enhance the device performance.

Based on all studies above, we conclude that in the growth/transfer process, the substrates do not play a role more than a mechanical support. The as-transferred single-crystal $MAPbI_3$ thin film serves as the real "substrate" to guide the epitaxial growth. As long as the transferred single-crystal $MAPbI_3$ is not dissolved in the supersaturated solution, the subsequent re-growth/re-adhesion process will always result in the single-crystal rather than the polycrystalline at the interface. Although the interfacial crystal quality shows slight degradation because of a higher level of impurity scattering as evidenced by the temperature-dependent Hall mobility measurements, the physical lattice structure and the crystallinity near the interface of the growth/transfer device do not change. The measured electronic dynamics of the growth/transfer device are on par with those of the bulk single crystals.

2. The GBL Solution Washing Process

Figure 8A:
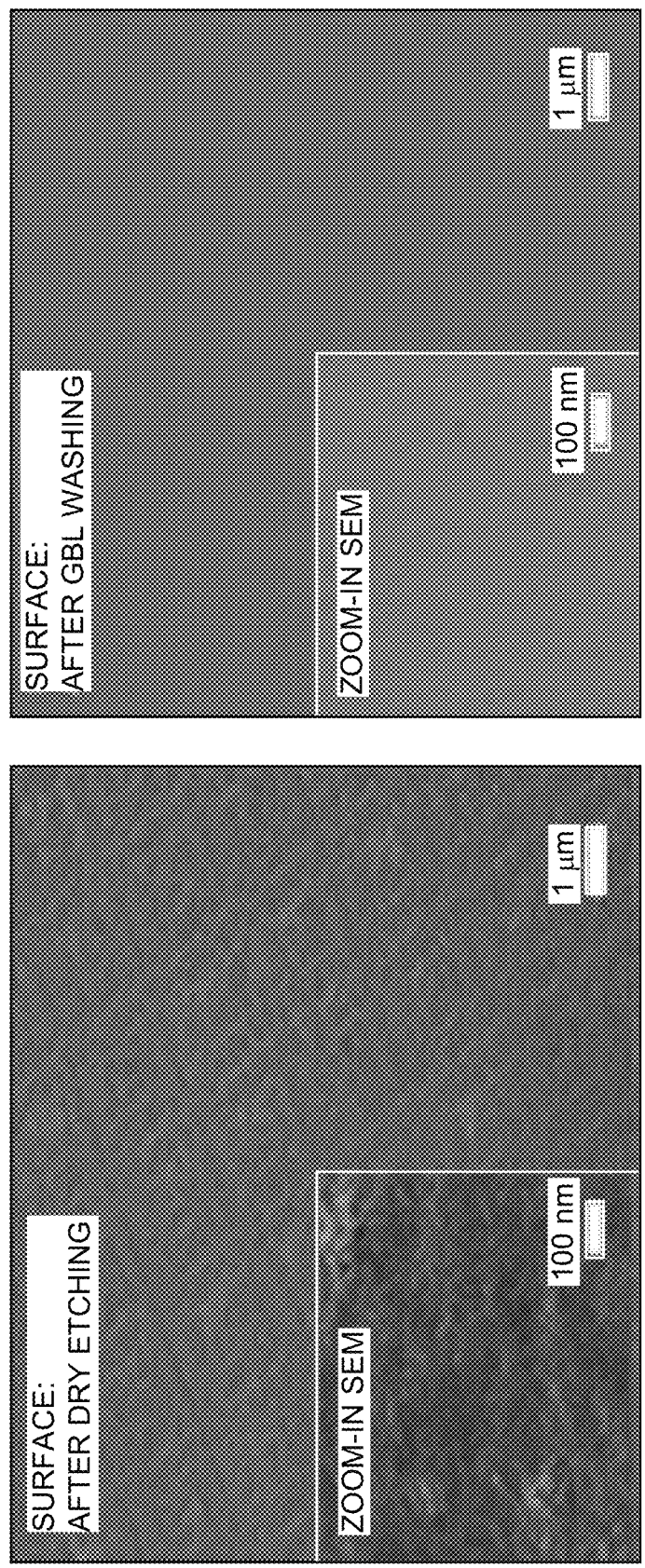
FIG. 8a is an SEM image showing the crystal surface after dry etching and after GBL washing.
Figure 8B:
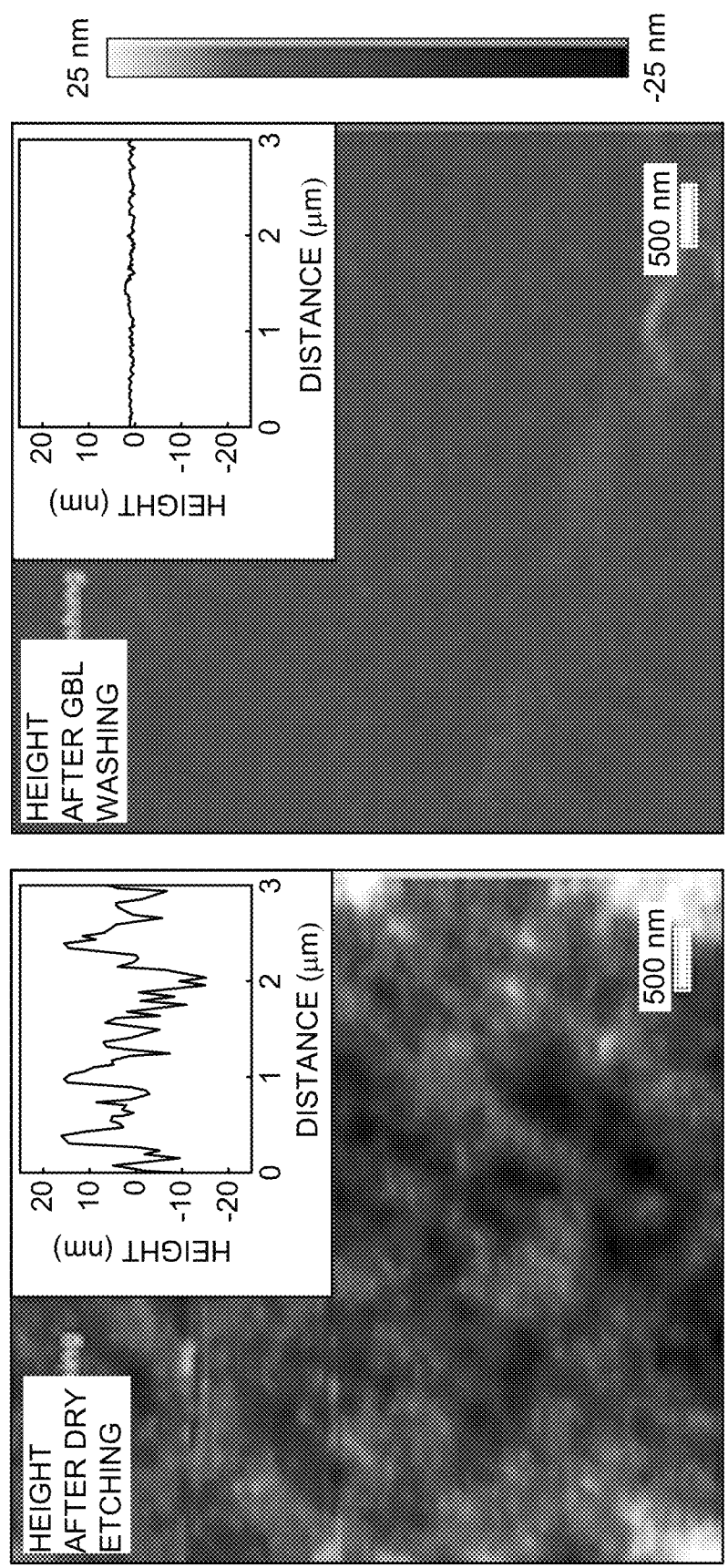
FIG. 8b shows AFM measurements of a transferred single-crystal $MAPbI_3$ surface before and after GBL washing.
Figure 8C:
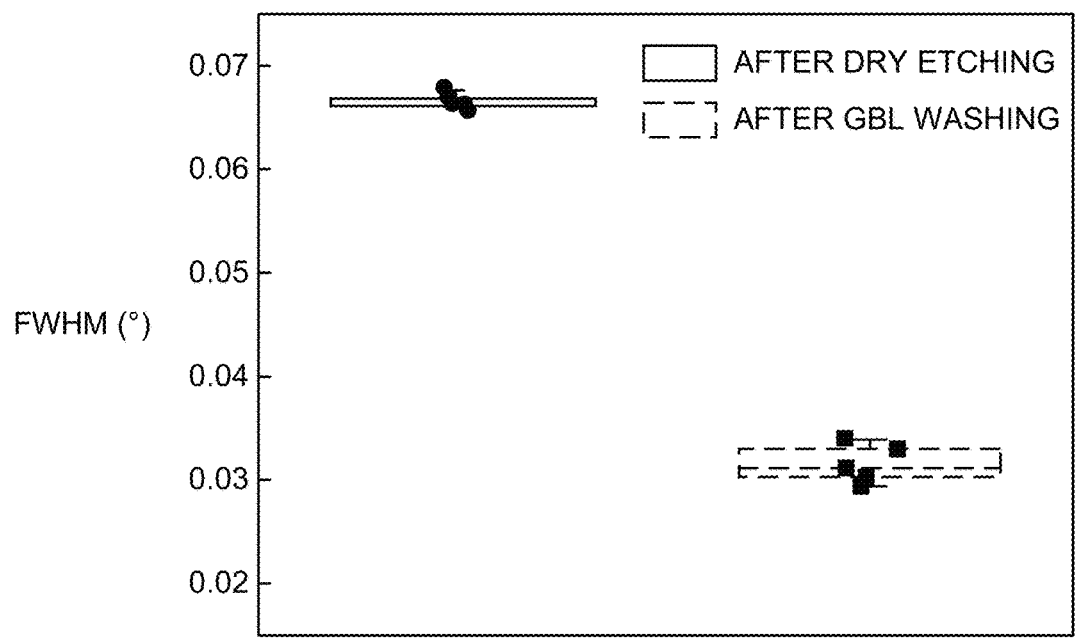
FIG. 8c shows XRD ω scan measurements showing the difference before and after the washing.
Figure 8D:
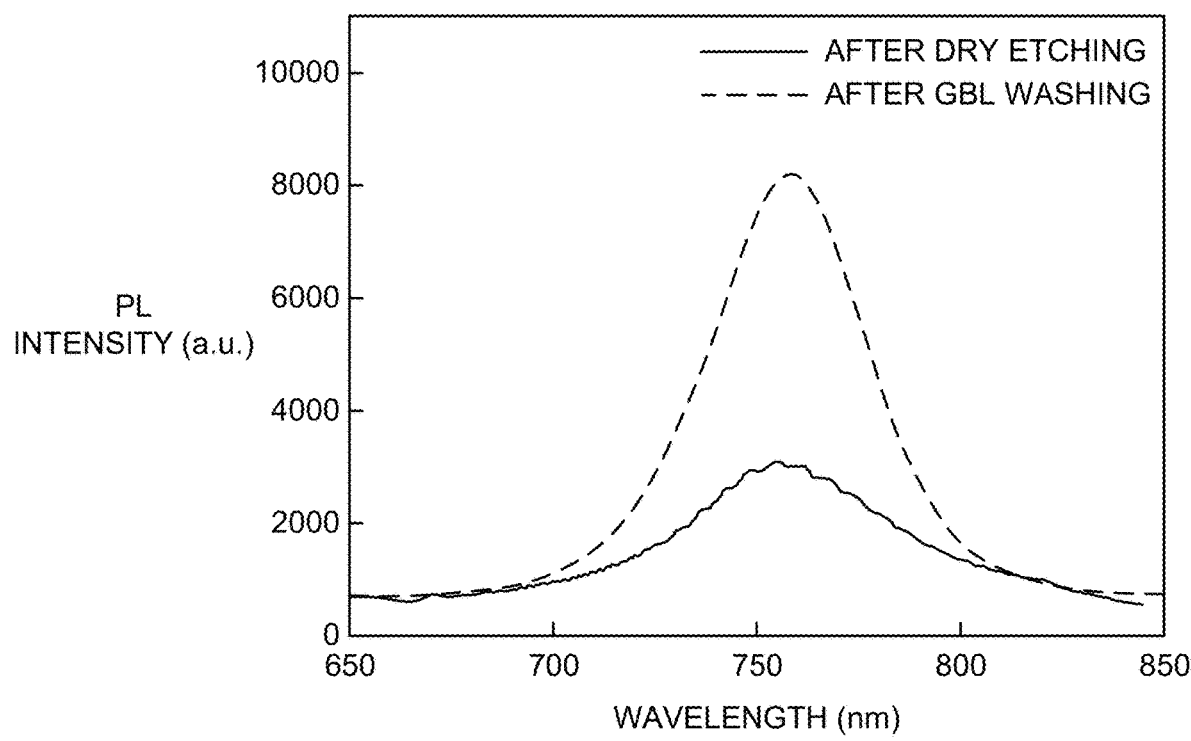
FIG. 8d are PL measurements that also reveal the same phenomenon, where the unwashed crystal shows a much weaker PL intensity and a broader peak.

In the GBL solution washing process after dry etching, the non-crystalline residues on the surface of the single-crystal film can be effectively removed. SEM and AFM studies confirm the dramatic change of morphologies. XRD ω scan and PL measurements confirm the dramatic change of crystal quality before and after washing the perovskite film with the saturated GBL solution. FIG. 8a shows SEM images showing the crystal surface after dry etching and after GBL washing. The rough surface caused by dry etching can be fully removed by GBL washing. FIG. 8b shows AFM measurement results of a transferred single-crystal $MAPbI_3$ surface before and after GBL washing. The rough surface caused by dry etching can be effectively smoothed by GBL washing. FIG. 8c shows XRD ω scan measurements showing the huge difference before and after the washing, indicating that dry etching can cause serious damage to the crystal quality. FIG. 8d shows PL measurements, which also reveal the same phenomenon, where the unwashed crystal shows a much weaker PL intensity and a broader peak.

The Scaled Growth/Transfer Process.

The size of the single-crystal perovskite thin films can be scaled up. In particular, refining the growth/transfer process can be effective in scaling up the thin film size. Basically, the growth/transfer process can be divided into three stages: 1. Epitaxial growth; 2. Peeling off; 3. Transferring. The scale can be further increased by addressing the following issues.

For the first stage of epitaxial growth, the larger size of the growth substrate and the patterned mask, the larger area of the epitaxial single-crystal perovskite film. The size of the substrate can be achieved by increasing the crystal growth time. The single-crystal perovskite wafer of size 120 mm×70 mm×52 mm has demonstrated. The size of the patterned mask can be as large as the lithography process allows.

Figure 19A:
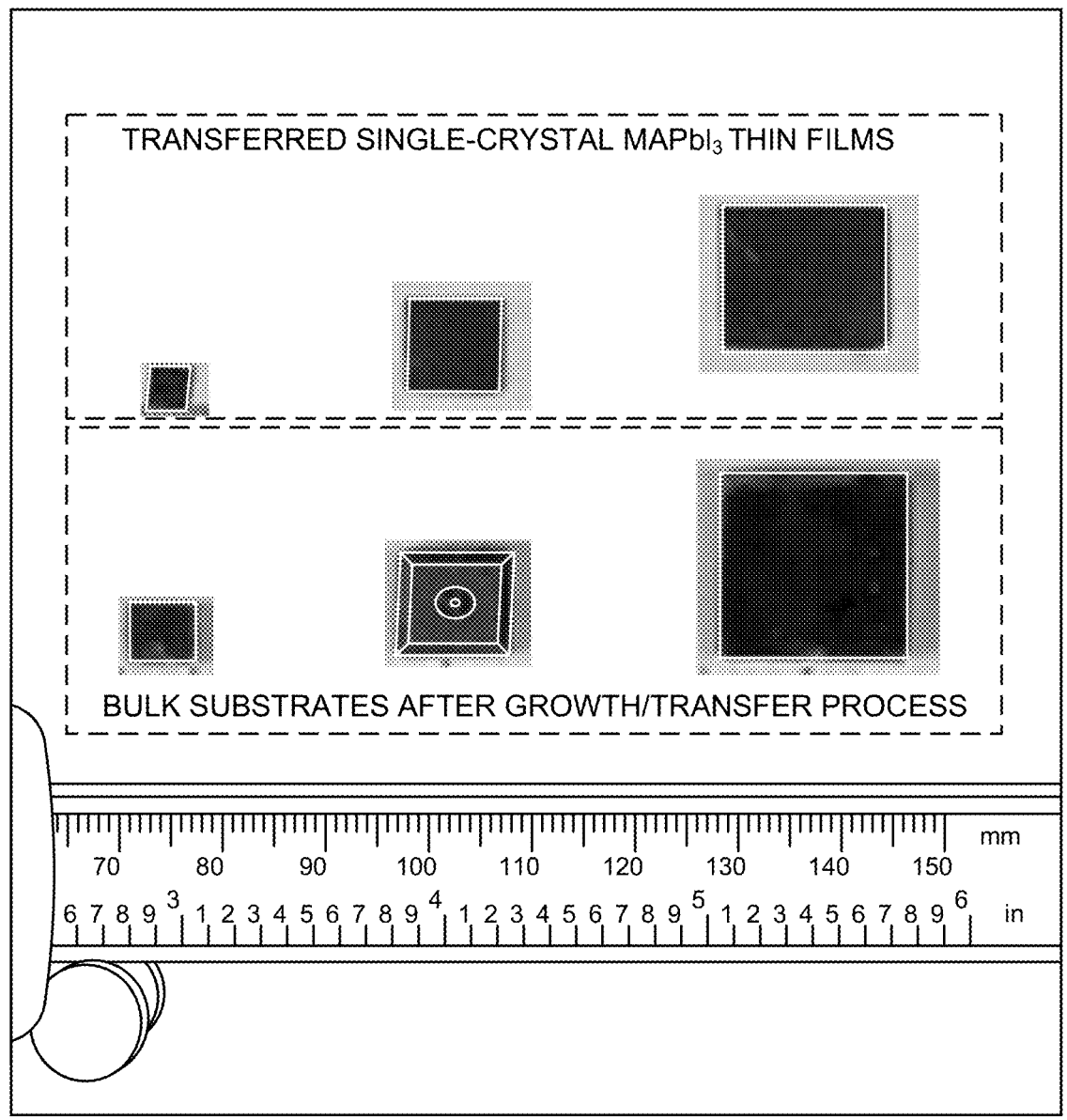
FIG. 19a shows a freestanding transferred single-crystal $MAPbI_3$ thin film fabricated by soft polymer masks and corresponding bulk substrates.
Figure 19B:
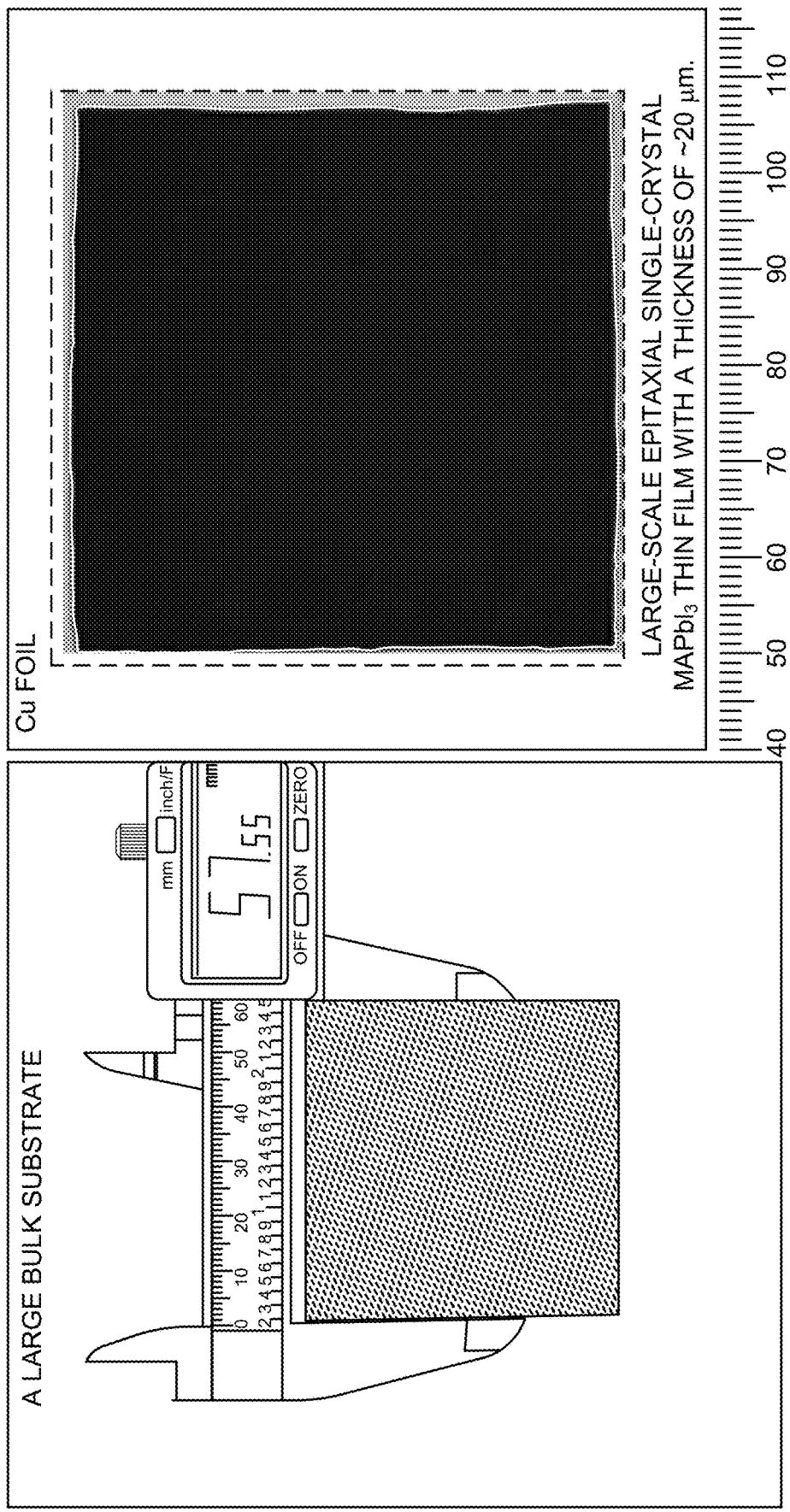
FIG. 19b shows a large bulk substrate that is used to epitaxially grow the single-crystal $MAPbI_3$ thin film (left) and a transferred single-crystal $MAPbI_3$ thin film using a rigid Cu foil (20 μm thick) as the mask (right).

For the second stage of peeling off, it is important to avoid breaking the epitaxial single-crystal perovskite film. The larger the single-crystal thin film, the higher the possibility of forming cracks. When the single-crystal thin film is larger, the size of the connected micro-rods and the mask are also larger. Therefore, it will be more difficult to avoid bending during the in-plane rotation. In the examples herein, the transfer yield is found to be lower with larger single-crystal thin films, because the larger single-crystal thin films are more easily broken during the in-plane rotation process. Even though increasing the thickness of the mask layer can help, the size with acceptable yield is still within about 2 cm×2 cm. To solve this problem, replacing the soft mask with a more rigid mask (e.g., Cu foil) is found to be effective. For instance, a patterned Cu foil (20 μm thickness, by laser drilling) may be used, which can realize a 5.5 cm×5.5 cm single-crystal perovskite film. The rigid Cu mask can largely avoid bending during the in-plane rotation, which significantly reduces the possibility of breaking the epitaxial single-crystal perovskite. FIG. 19a shows a freestanding transferred single-crystal MAPbI$_3$ thin films fabricated by soft polymer masks and corresponding bulk substrates. FIG. 19b shows a large bulk substrate that is used to epitaxially grow the single-crystal MAPbI$_3$ thin film (left) and a transferred single-crystal MAPbI$_3$ thin film using a rigid Cu foil (20 μm thick) as the mask (right).

Finally, for the stage of transferring, the only concern is that the mask should be able to be etched without damaging the perovskite. Soft masks such as parylene (or PI) can be easily dry-etched, which has minimal influence on the device performance. For rigid masks, e.g., the 20 μm Cu foil, the mask can be liftoff from the perovskite thin film after the transfer.

Figure 20A:
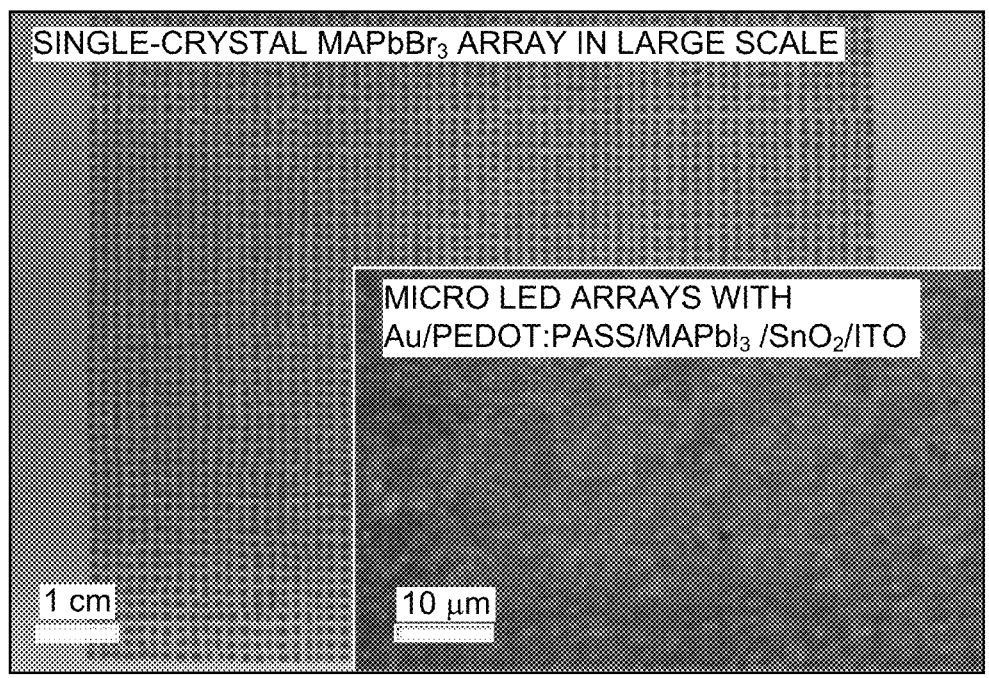
FIG. 20a shows transferred single-crystal $MAPbBr_3$ arrays with each pixel being about 100 μm by 100 μm in size.
Figure 20B:
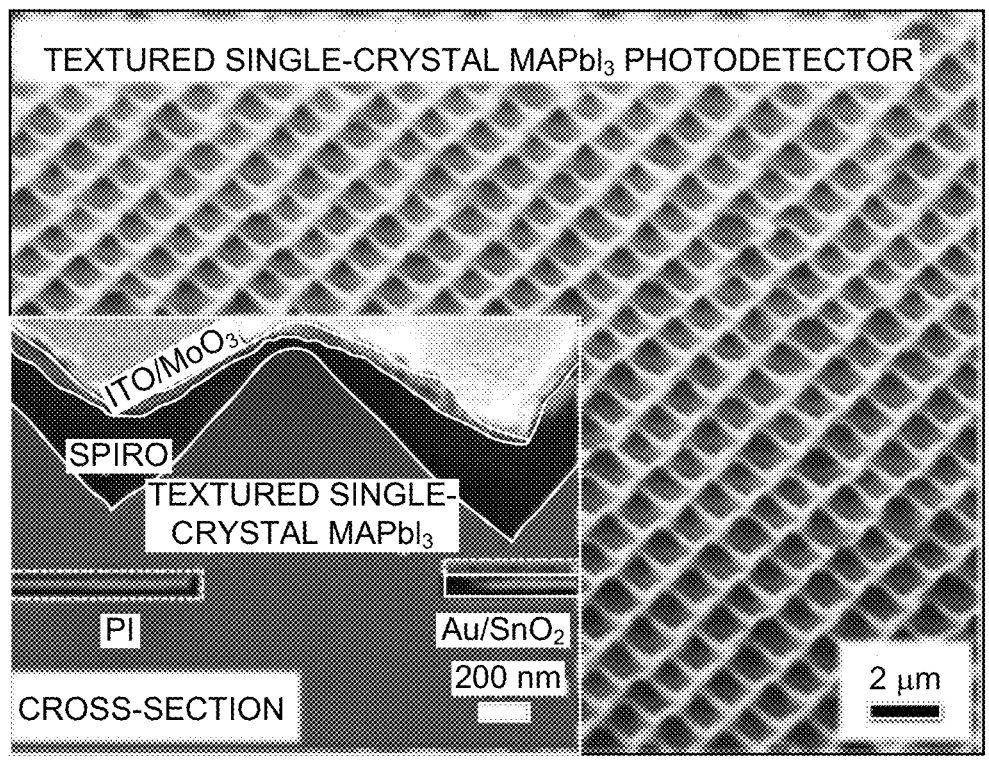
FIG. 20b shows SEM images showing the textured single-crystal $MAPbI_3$ thin film as photodetectors.
Figure 20C:
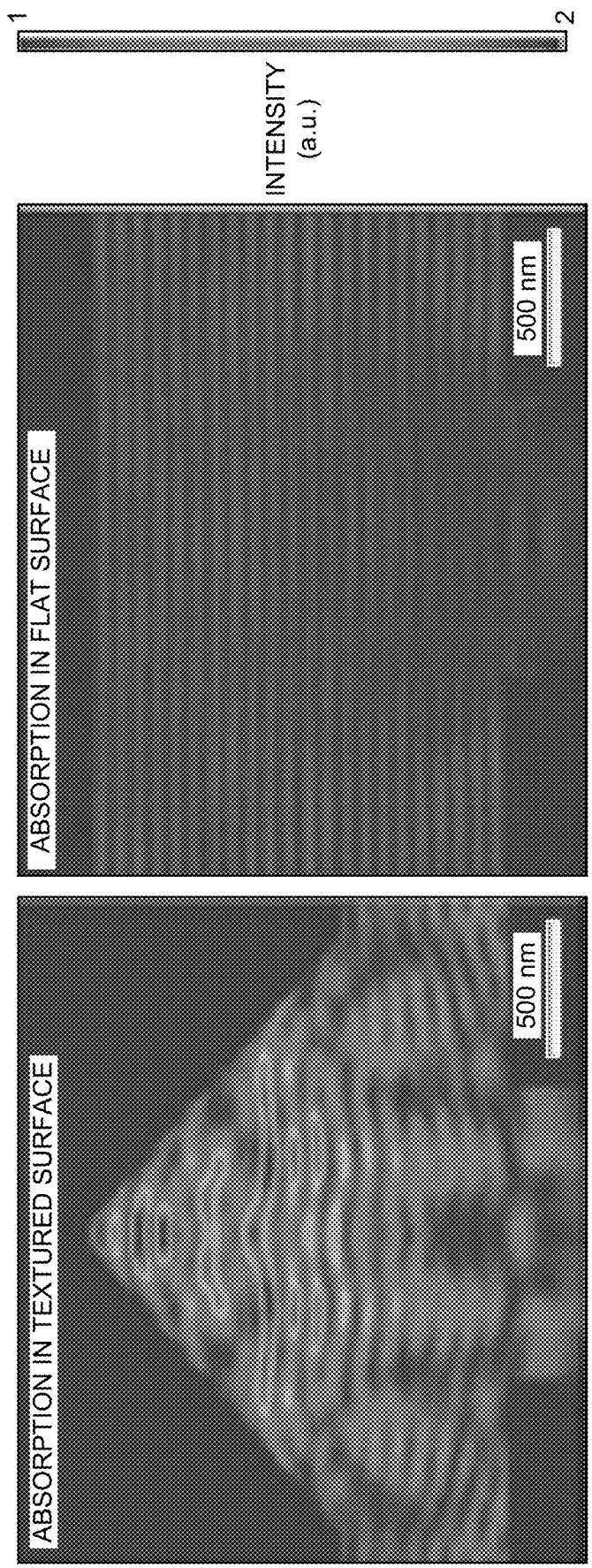
FIG. 20c shows finite-difference time-domain (FDTD) optical simulation of the overall absorption by the textured structure (left) and the flat structure (right)
Figure 20D:
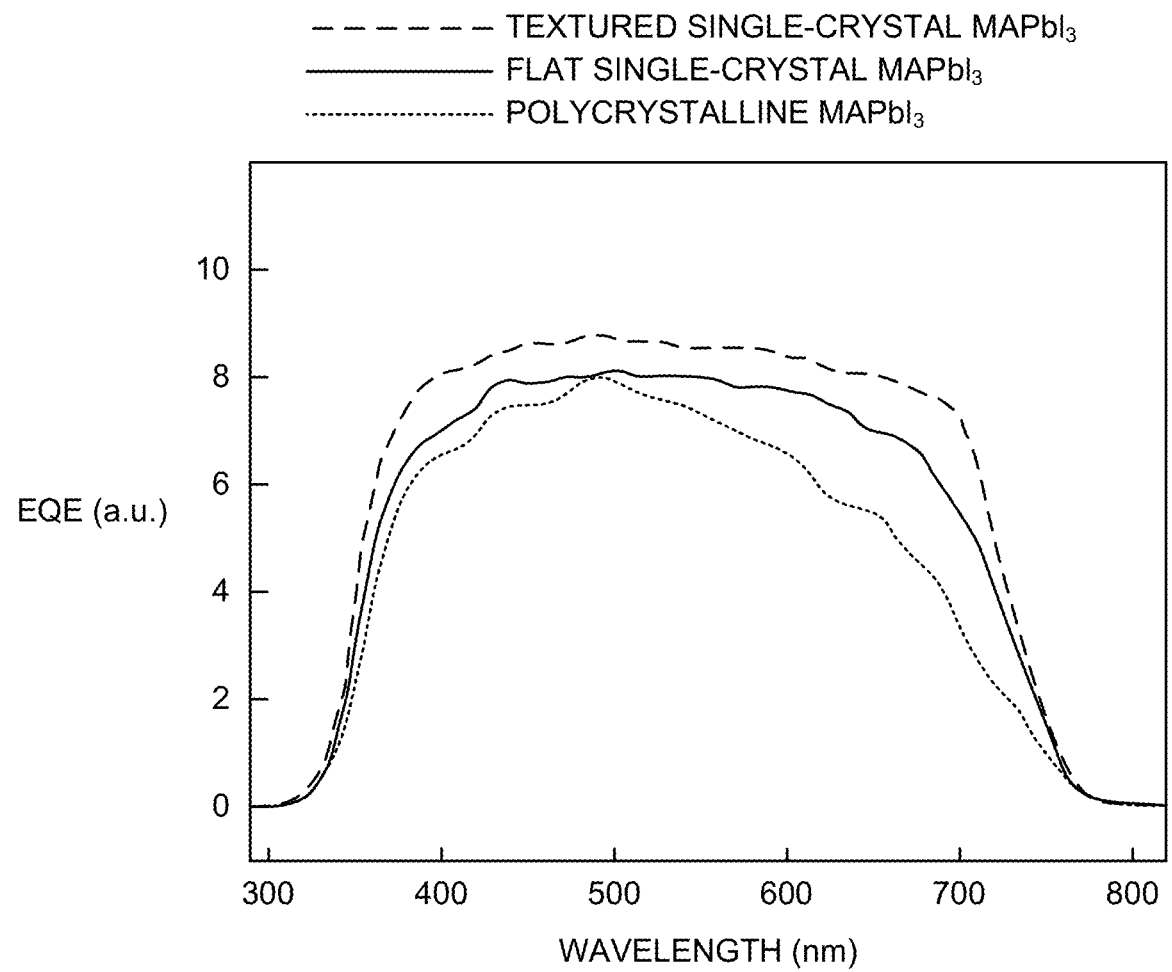
FIG. 20d shows EQE measurements of different device morphologies.
Figure 20E:
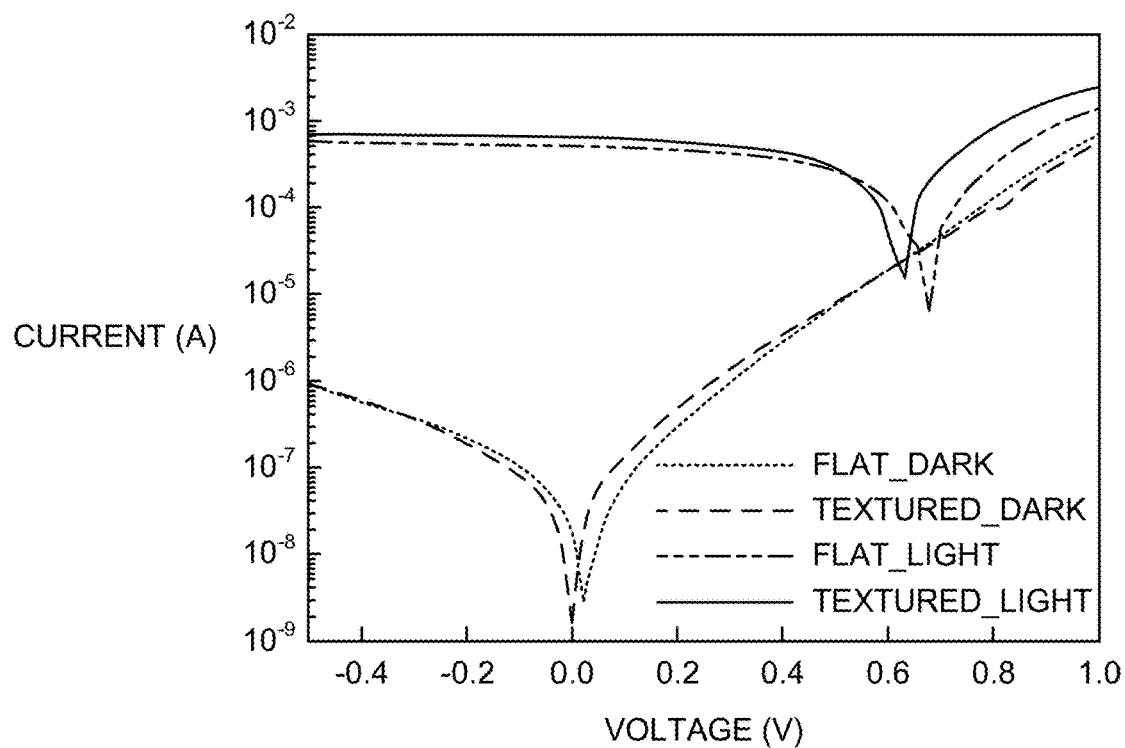
FIG. 20e shows dark current measurements on both textured and flat single-crystal devices.
Figure 20F:
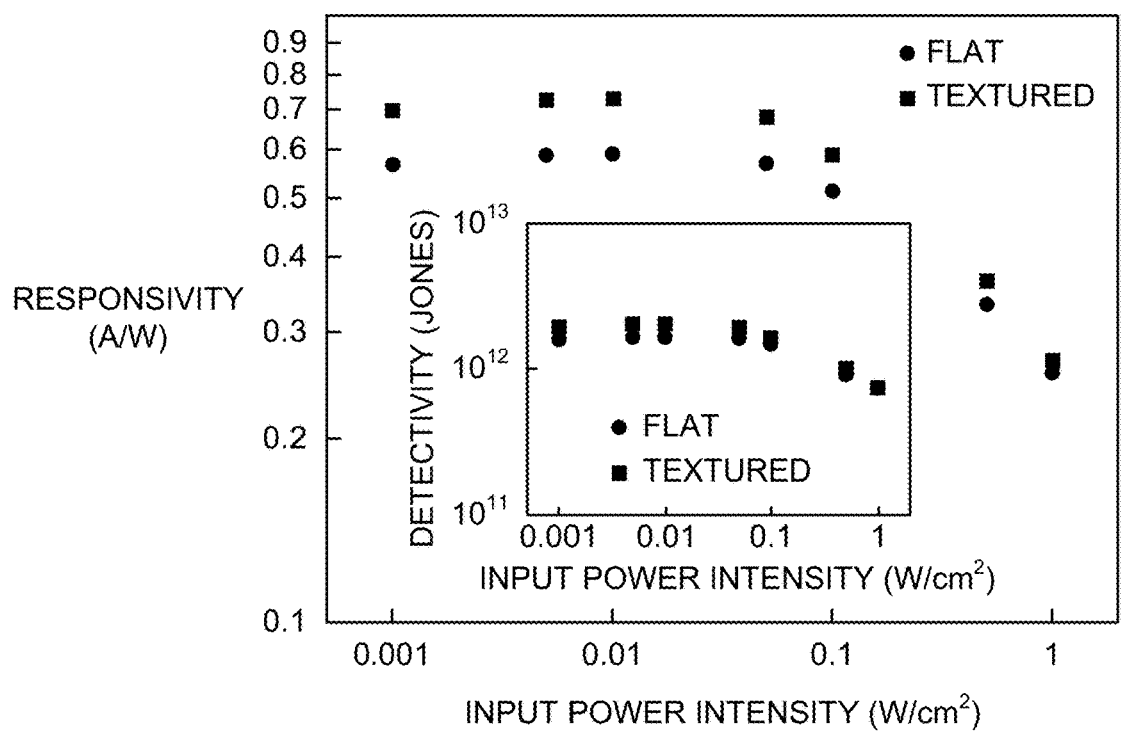
FIG. 20f shows responsivity results showing that the textured devices are more sensitive to the input power.

The scaled fabrication of single-crystal perovskite crystal microstructure arrays is also feasible. Single-crystal perovskite-based LED devices have been fabricated. The pixel size can be anywhere from 1 μm to 100 μm, with potential applications for flexible single-crystal perovskite LED displays with tunable color, high resolution, high stability, and high quantum efficiency. FIG. 20a shows transferred single-crystal MAPbBr$_3$ arrays with each pixel being about 100 μm by 100 μm in size. Inset shows the transferred single-crystal MAPbI$_3$ micro light-emitting diode arrays with each pixel ~1 μm by 1 μm. FIG. 20b shows SEM images showing the textured single-crystal MAPbI$_3$ thin film as photodetectors. The inset shows a zoomed-in SEM image of the cross-sectional structure of the device. FIG. 20c shows finite-difference time-domain (FDTD) optical simulation of the overall absorption by the textured structure (left) and the flat structure (right). The absorption by the textured thin film is much higher than the flat one because of the anti-reflective effect. FIG. 20d shows EQE measurements of different device morphologies. The textured single-crystal film exhibits the highest quantum efficiency, which comes from the reduced surface reflections. FIG. 20e shows dark current measurements on both textured and flat single-crystal devices, showing that the current levels are similar and indicating the pinhole-free and high-quality thin films. The higher light current of the textured device reveals its higher absorption than the flat device. FIG. 20f shows responsivity results showing that the textured devices are more sensitive to the input power. The inset shows that the textured devices exhibit a higher detectivity than the flat devices. The decreasing tendencies of the responsivity and detectivity at high input power may be due to the material degradation under strong light intensities.

Crystal Quality after the Growth/Transfer Method

XRD, optical topography, and PL have been used to study the epitaxial single-crystal thin film fabricated by the growth/transfer method. During the growth/transfer process, there are two major factors that will influence the quality of the as-prepared single-crystal thin films: epitaxial growth and transfer/re-adhesion.

Figure 21A:
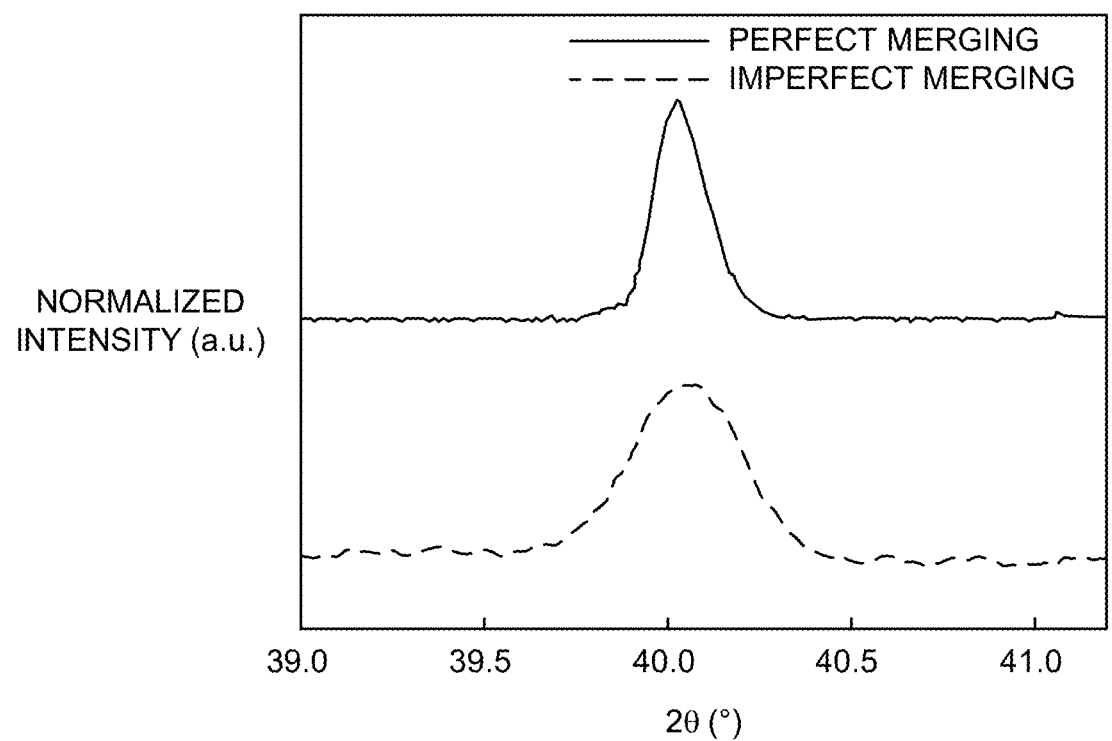
FIG. 21a shows the (400) peaks in the XRD θ-2θ scan showing perfectly and imperfectly merged single-crystal thin films.
Figure 21B:
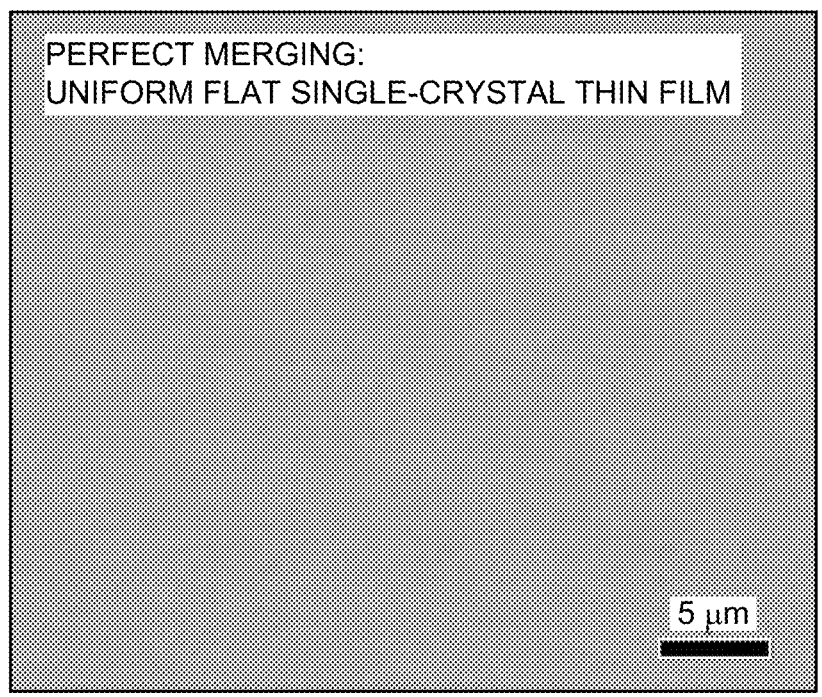
FIG. 21b shows an SEM image showing the top view of a perfect single-crystal thin film and FIG. 21c shows an imperfect single-crystal thin film with multiple grains.
Figure 21C:
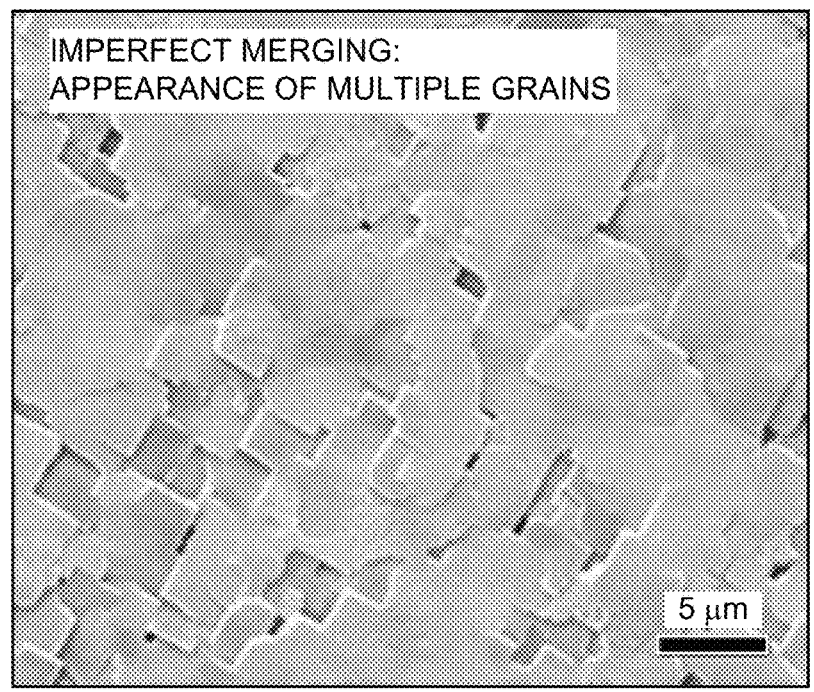

1. Epitaxial Growth:

Because of the high solubility of perovskite in their growth solutions, the concentration/growth temperature of the solution used in the growth/transfer method is important. Too high concentrations/growth temperature will cause an inhomogeneous merging and result in an inhomogeneous monolithic surface, which is reflected as a wide FWHM in the XRD. FIG. 21a shows the (400) peaks in the XRD θ-2θ scan showing perfectly and imperfectly merged single-crystal thin films. The imperfect thin film shows a broad XRD peak due to the existence of small grains. FIG. 21b shows an SEM image showing the top view of a perfect single-crystal thin film and FIG. 21c shows an imperfect single-crystal thin film with multiple grains.

In homo-epitaxial growth where there is no interfacial strain, such XRD peak broadening can be due to the small crystalline size, as explained by the Scherrer equation:

$$\tau = \frac{K\lambda}{\beta\cos\theta}$$

where τ is the mean domain size, K is the shape factor, λ is the wavelength of the X-ray, β is the broadening at the FWHM, and θ is the Bragg angle. In a particular material, the domain size τ is inversely proportional to the β. Even though the sub-micrometer particles or crystallites in the inhomogeneous monolithic thin films show the same orientation, they represent small domains and result in the XRD peak broadening.

After optimizing the growth concentration/growth temperature, FWHM values in the XRD ω-scan (rocking curve measurements) are studied to evaluate the mosaicity of the as-grown single-crystal perovskite thin films. Comparable FWHM values from the as-grown single-crystal thin films with the corresponding bulk single crystals demonstrate their similar crystal qualities (FIG. 1d), which mean the growth/transfer process will not sacrifice the quality of the as-grown epitaxial single-crystal thin films. The growth/transfer method can potentially be applied to a general perovskite in the perovskite family with very different growth temperatures and crystallization conditions.

Figure 21D:
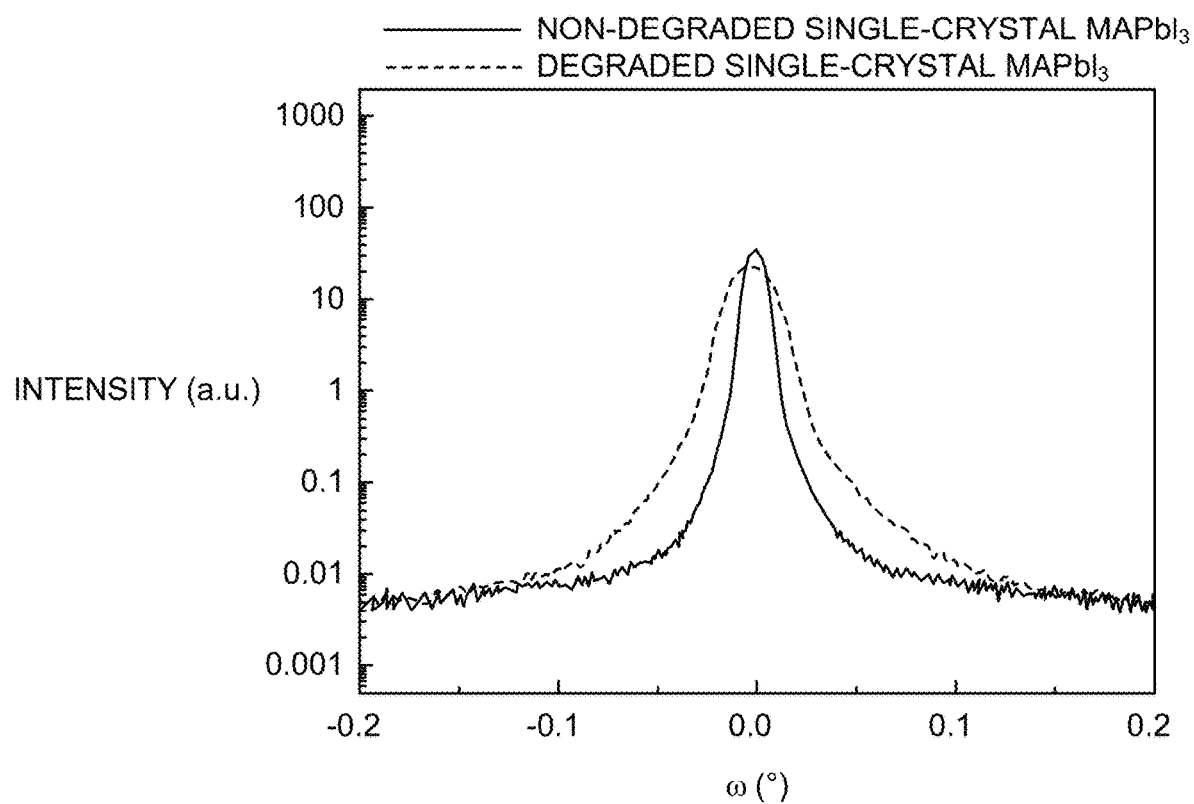
FIG. 21d shows XRD ω-scans of a degraded and a non-degraded single-crystal $MAPbI_3$ thin films after the transfer and re-adhesion processes.
Figure 21E:
FIG. 21e shows an image indicating that the degradations can come from the improper lifting transfer process and FIG. 21f shows an image indicating that the degradations can come from improper use of the re-adhesion solvent.
Figure 21E:
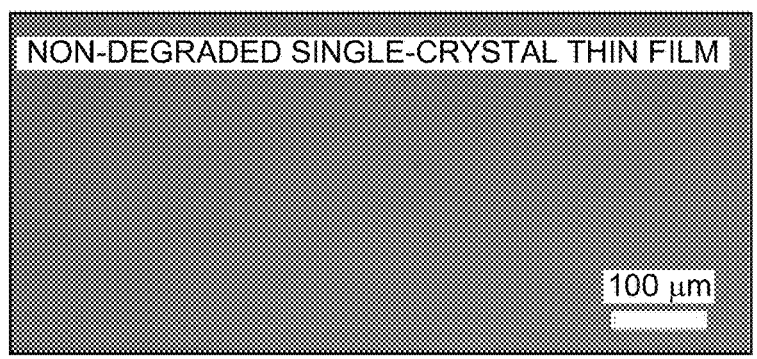

2. Transfer/Re-Adhesion:

Even though the growth process can be well-controlled, the single-crystal thin film quality can still largely degrade if a suitable transfer/re-adhesion process is not followed. FIG. 21d shows XRD ω-scans of a degraded and a non-degraded single-crystal MAPbI$_3$ thin films after the transfer and re-adhesion processes. The degraded single-crystal thin film exhibits a broad peak, which indicates a poor crystallinity. The degradations can come from either the improper lifting transfer process (see image in FIG. 21e) or improper use of the re-adhesion solvent (see image in FIG. 21f).

During the in-plane rotation, directly peeling off the epitaxial single-crystal films from one side will break it into many pieces (FIG. 21e top). This is because of the unique growth process of the growth/transfer method: the epitaxial single crystals need to fill the pattern first before growing out of the parylene (or PI) mask layer to merge into a thin film. Therefore, the pattern in the mask layer is filled with single-crystal micro-rods that serve as the connection between the epitaxial thin film and the substrate. Such a connection is strong and needs to be broken before the transfer. Otherwise, the brittle single-crystal thin film can get easily broken. Therefore, the in-plane rotation is critical to break those micro-rods and avoid breaking the epitaxial single-crystal during the transfer.

Figure 21F:
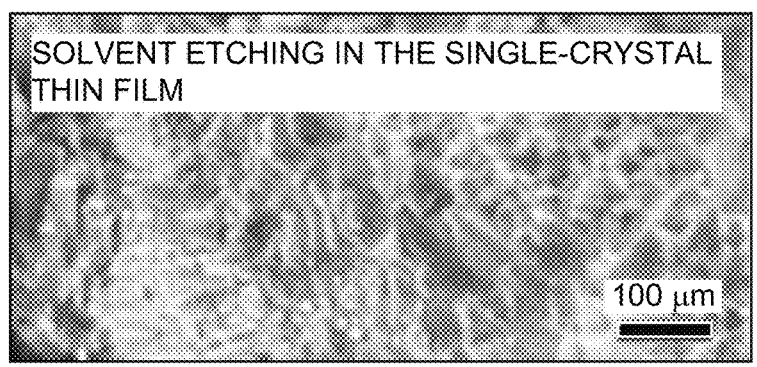
Figure 21F:
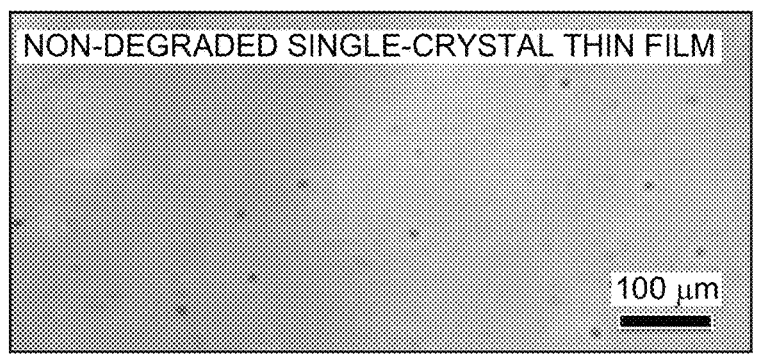

During the re-adhesion process, the concentration of the growth solution must be supersaturated. Otherwise, the growth solution will etch the single-crystal thin films quickly and may dissolve them partially, which lowers their crystallinity (FIG. 21f).

Figure 22A:
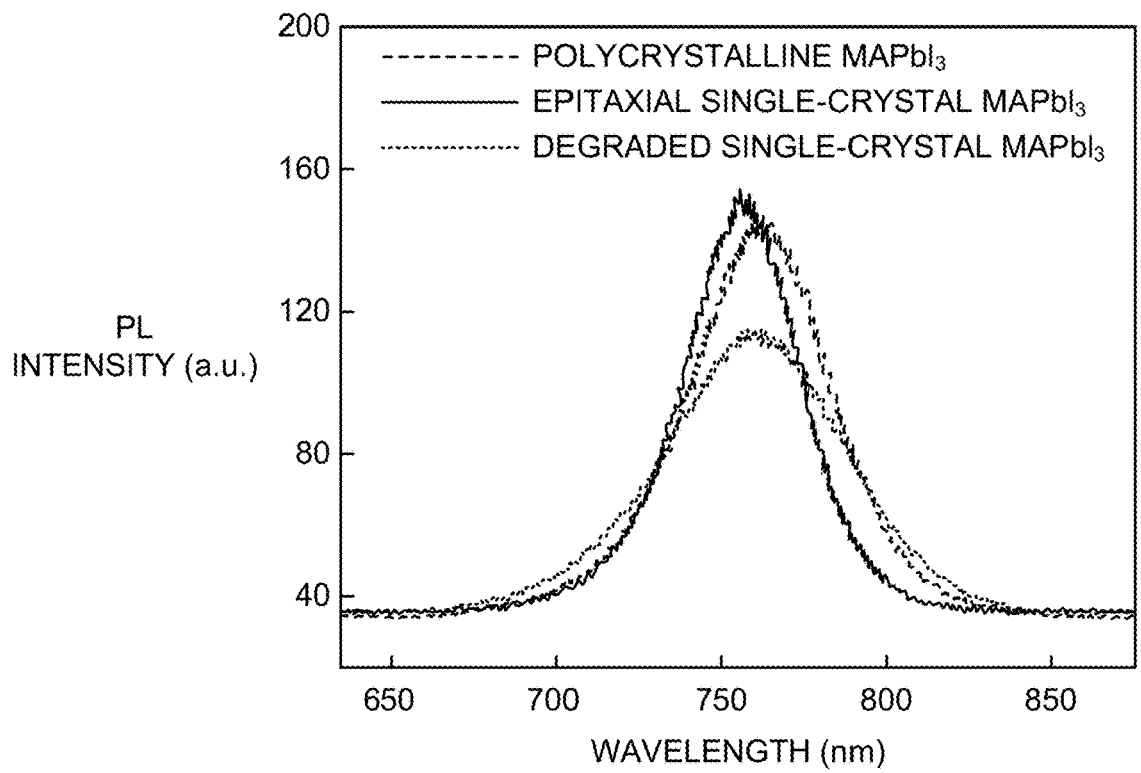
FIG. 22a shows PL results on the quality of three different types of $MAPbI_3$ thin films showing different PL measurement results.
Figure 22B:
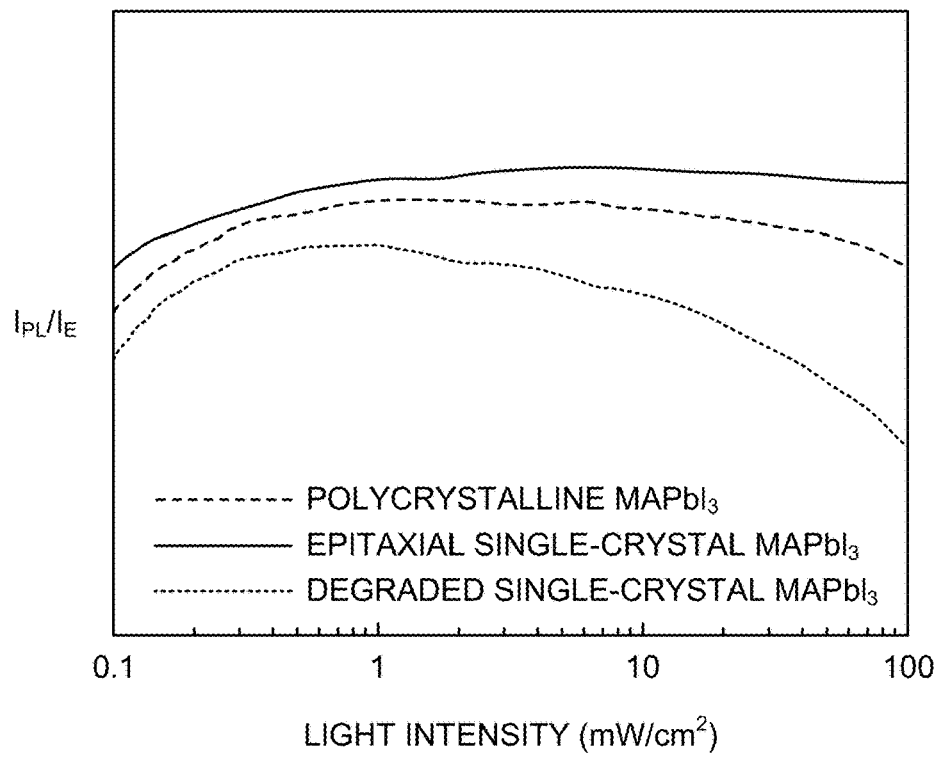
FIG. 22b shows $I_{PL}/I_E$ comparisons showing that the polycrystalline and degraded single-crystal thin films exhibit a decreasing tendency with increasing light intensity, providing evidence for their lower crystal qualities.

The overall crystal quality fabricated by the growth/transfer is studied using PL with an excitation wavelength of 533 nm. A well-controlled single-crystal thin film can not only exhibit a similar PL spectrum, but also show an $I_{PL}/I_E$ that is close to the bulk crystals (FIG. 1e). However, a degraded single-crystal thin film shows a PL peak broadening and an unstable $I_{PL}/I_E$, similar to the polycrystalline thin film. FIG. 22a shows PL results on the quality of three different types of MAPbI$_3$ thin films showing different PL measurement results. The polycrystalline thin film shows a little redshift compared with the single-crystal cases. The degraded single-crystal thin film shows a broad PL peak, which can be ascribed to a low crystal quality. FIG. 22b shows $I_{PL}/I_E$ comparisons showing that the polycrystalline and degraded single-crystal thin films exhibit a decreasing tendency with increasing light intensity, which provides additional evidence for their lower crystal qualities.

Diffusion Length Calculations

The optimal thickness for the photovoltaic material needs to strike a balance between the photogenerated carrier diffusion length and optical light absorption length. To ensure efficient charge collection, polycrystalline perovskite films are usually made sufficiently thin. The existence of crystallographic structural defects within the grain and at grain boundaries, where defects serve as trap states causing serious charge recombination, can heavily limit the charge carrier diffusion length to be typically less than 1 μm. Prior studies have demonstrated that this balance in spin-coated polycrystalline perovskite is attained for a material thickness of about 500 nm. Recently, with an advanced non-solvent method to produce low-defect polycrystalline perovskite films, high-efficiency solar cells with a thickness about 1.1 μm have been reported, where the thick films are found to be more efficient on light conversion. On the other hand, it has been concluded that the incoming light should be mostly absorbed by the polycrystalline perovskite with a thickness around 2 μm, indicating polycrystalline perovskite solar cells with a thickness 0.6~1 μm can efficiently collect the free carriers but do not make the best use of light.

As the single-crystal carrier dynamics and light absorption behavior are different from the polycrystalline, it is necessary to re-investigate the best thickness for an single-crystal absorber. According to the literature, the carrier diffusion length $L_D$ can be calculated by:

$$L_D = \sqrt{\frac{K_B \cdot T \cdot \mu \cdot \tau}{e}}$$

where $K_B$ is the Boltzmann's constant, T is the temperature, μ is the carrier mobility, τ is the carrier lifetime, and e is the electron charge.

Figure 14B:
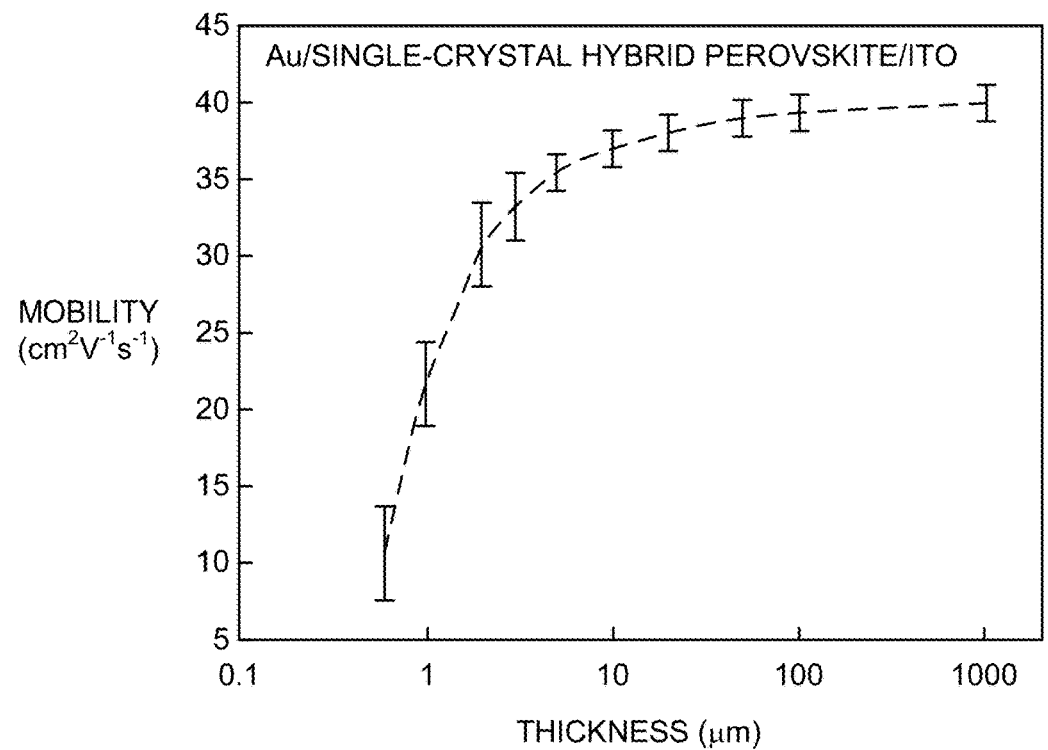
Figure 14C:
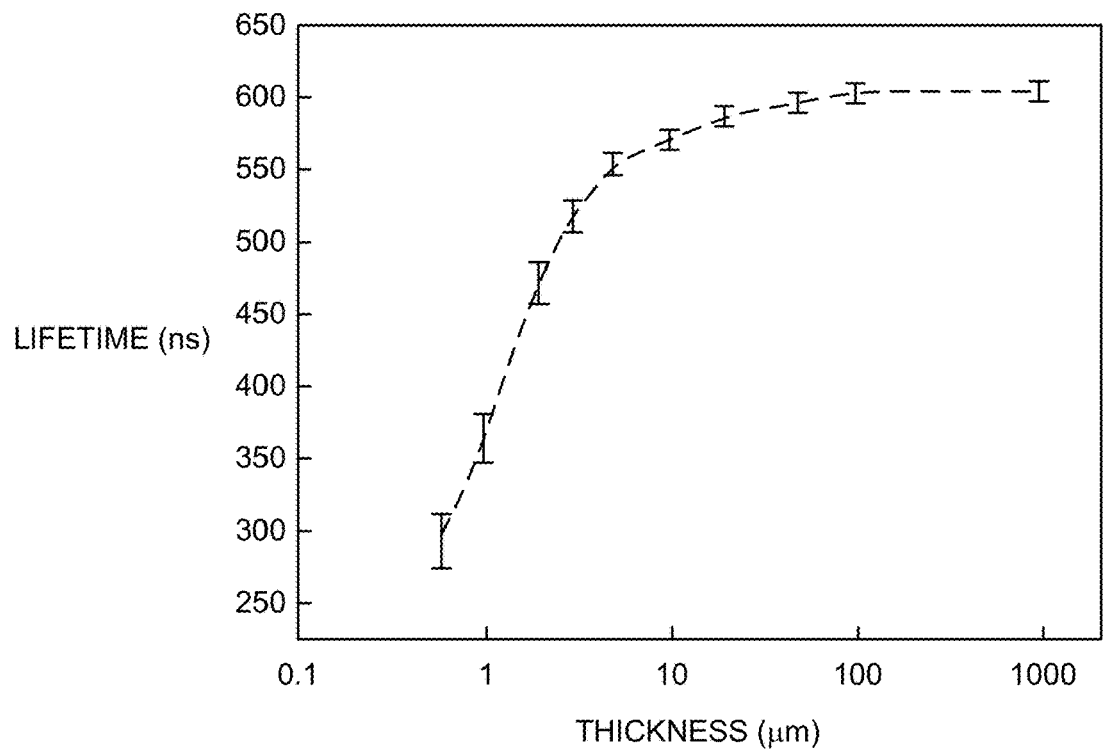
Figure 15A:
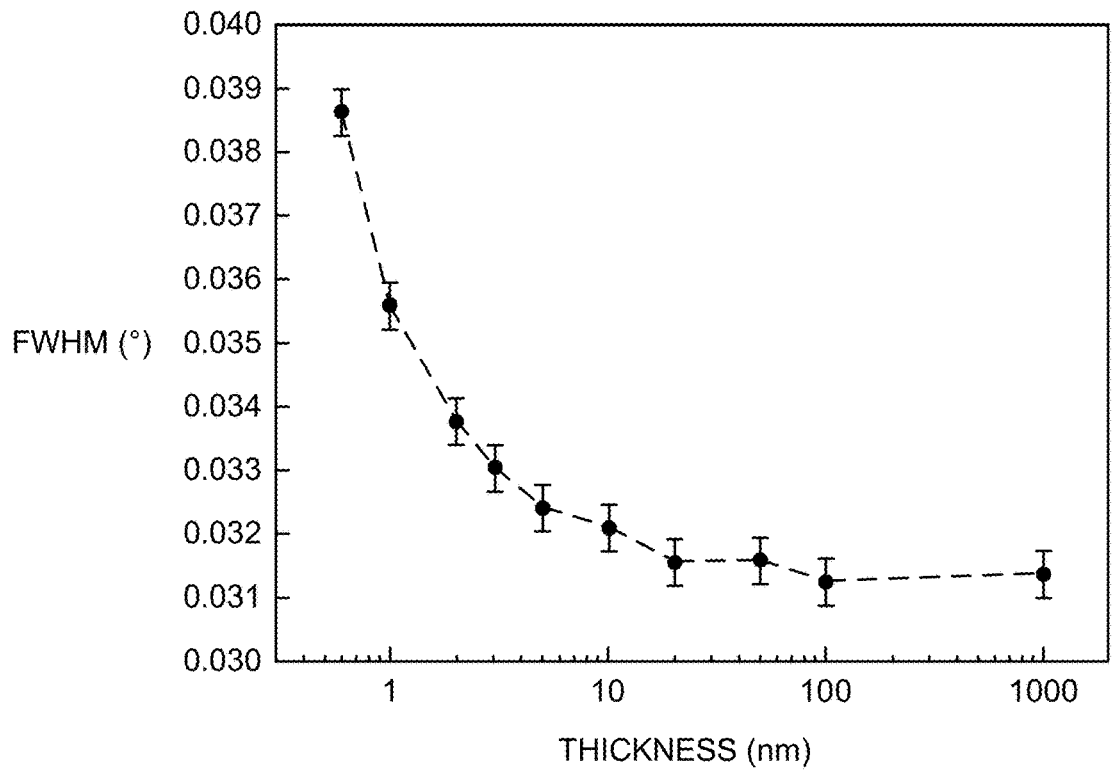
FIG. 15a shows a XRD ω scan and FIG. 15b shows PL measurements with different thicknesses of crystals.
Figure 15B:
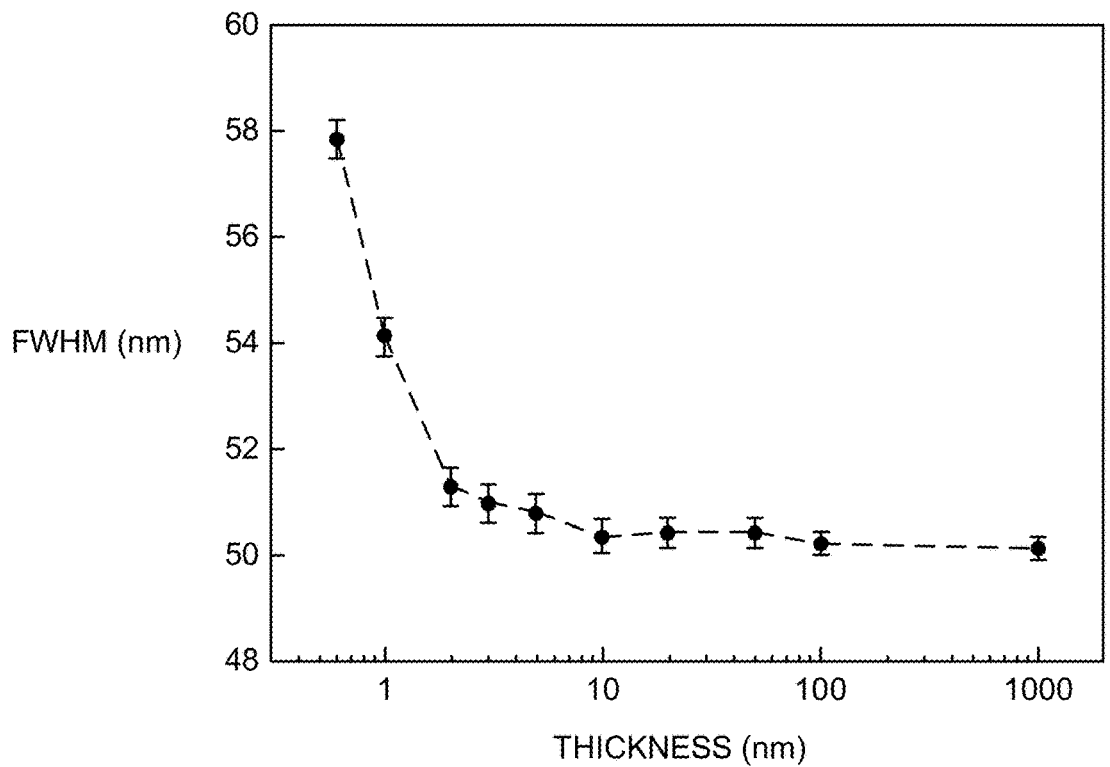
Figure 15C:
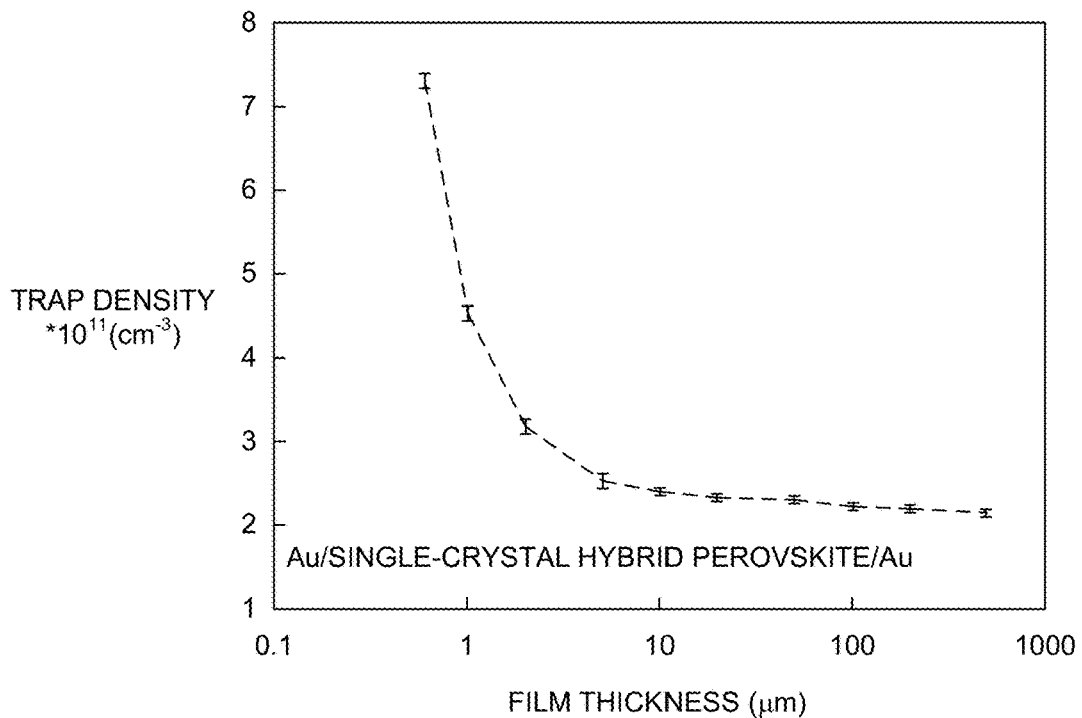
FIG. 15c shows trap density measurements.

To calculate $L_D$ for estimating a rough single-crystal perovskite thickness, the carrier mobility and lifetime are measured by ToF and TRPL under 1-Sun intensity, respectively (FIGS. 14b and 14c). For the ToF measurement, all devices share the same Au/single-crystal perovskite/ITO structure fabricated by e-beam evaporation and sputtering. By controlling the same deposition conditions for the ITO layer (power, time, and gas flow), possible plasma damage to the sample is controlled to be similar to each other.

The carrier mobility μ can be calculated from the carrier transit time by:

$$\mu = \frac{d^2}{Vt}$$

where d is the thickness of the target region, V is the applied voltage, and t is the measured carrier transit time. The average carrier lifetime of the single crystals is measured by TRPL.

Measured results show that both the carrier mobility and carrier lifetime are thickness-related and exhibit saturating tendencies, which indicate a "maximum" $L_D$ if the film thickness increases to a certain level (FIG. 14a). Usually, mobility will not change with different thickness. However, unlike well-established solvent engineering in polycrystalline perovskite thin film preparation, current perovskite single crystals grown by wet chemical methods are found to have high surface defect centers, which are orders of higher than those in polycrystal films. Additionally, thinner single-crystal films have a relatively higher surface-to-volume ratio, indicating that the surface can play an important role, especially when the surface properties are dominating. The reduced surface-to-volume ratio in thicker single-crystal films will result in a better overall crystal quality with higher carrier mobility and lifetime (FIGS. 14b and 14c).

To clearly exhibit such a property, thickness-dependent XRD, PL, and trap density[21] have been studied to quantitatively evaluate the crystalline quality of the epitaxial thin films (FIG. 15). The FWHM values from both XRD and PL decrease with increasing the film thickness, indicating thicker films exhibit better crystal qualities. However, such changes seem to plateau from about 20 μm, where there is almost no change with further increasing the crystal thickness. To study the trap density, P-type devices have been fabricated with two Au electrodes by e-beam evaporation. Devices with different single-crystal thicknesses are measured. All samples are scanned under forward bias only with the same scan condition to avoid any influence of hysteresis, and all samples are disconnected for 6 hours to avoid the polarization influence from the previous scan to the next one. The results also exhibit lower trap densities in thicker devices, which correspond to an overall better crystal quality. Therefore, the calculated carrier diffusion length shows a thickness-dependent phenomenon, which results from the saturated carrier mobility and carrier lifetime because of the better crystal quality in thicker single-crystal thin films.

The In-Situ Fabricated Devices

Different from the spin coating technique for preparing polycrystalline perovskite thin films, lithography steps have been carried in the growth/transfer process, so the nano/micro fabrication process needs to be considered as an influencing factor on the device performance. Generally speaking, the shape of the J-V curve can roughly tell the cell performance. Large series resistance can influence the $J_{SC}$, but in that case, the shape of the curve is normally s-shaped. If the F.F. is moderate, the series resistance should be acceptable. However, the F.F. and $V_{OC}$ do not have a strong correlation. Relatively speaking, an F.F. greater than 75% can still have a low $V_{OC}$. The $V_{OC}$ is highly related to the bandgap and interfacial recombination. While the bandgap is the same for all samples in this case, the interfacial recombination is sensitive to the surface defect states.

Perovskite single crystals grown by wet chemical methods are found to have high surface defect centers, which are orders of magnitude higher than those in polycrystalline films. These surface defect states will mainly influence the $V_{OC}$. Even though many approaches have been established to passivate the surface/interface defects in polycrystalline perovskite, there is still a lack of strategy to passive single-crystal perovskites. Also, thinner devices have a higher surface-to-volume ratio than thicker devices, and are thus more prone to operational errors and easier to be influenced by the re-adhesion/re-growth and solution treatment (e.g., washed by the GBL saturated solution). Evidence can be seen in FIGS. 18b and 18c, where TPC and TPV measurements are used to qualify the carrier lifetime and mobility changes after washing the single-crystal perovskite with different thicknesses by the GBL saturated solution. It is clear that the crystal quality in a thinner film is more easily influenced by surface treatments.

Therefore, to isolate the influence of fabrication steps on the quality of the crystal surface/interface and thus the $V_{OC}$, particularly of the thinner films, devices based on the single-crystal perovskite film without transferring (i.e., delamination, re-adhesion, or GBL washing) have been fabricated. These in-situ fabricated devices are used to characterize the $V_{OC}$, which are shown in the inset of FIG. 2b. The configurations of these in-situ fabricated devices are kept the same as Au/PTAA/single-crystal perovskite/TiO$_2$/ITO, where PTAA is the hole transport layer patterned by photolithography and etching, TiO$_2$ is the electron transport layer deposited by atomic layer deposition, and Au and ITO are both electrodes deposited by sputtering (FIG. 19). In such a structure where no solvent treatment is applied, the influence of the fabrication steps on the $V_{OC}$ is minimized. Also, because there is only one surface (top surface) that experiences the solution treatment, the $V_{OC}$ values resulted from the in-situ fabricated devices are more accurate and revealing. So, we can study the dependence of $V_{OC}$ on the single-crystal perovskite thickness in a more accurate way and exclude the influence of other confounding factors from fabrication steps.

In the J-V curves of FIG. 2b, the increase of $V_{OC}$ from ~0.6 to ~2 µm is considered to be because thicker films have better crystal qualities and are more immune to the fabrication steps induced degradation in crystal quality. The decrease of $V_{OC}$ beyond 2 µm can be explained by the inset of FIG. 2b. Without extra re-growth and solvent treatments, the single-crystal thin film can keep its original best surface quality. A thicker film leads to a lower $V_{OC}$, which is due to the interfacial charge accumulation caused by the weaker build-in field in the thicker films. Note that even though in-situ devices use a different structure from the growth/transfer devices, as long as the structure of all in-situ devices is the same, the conclusion of studying the thickness-dependent $V_{OC}$ is valid.

The Neutral Mechanical Plane (NMP) Design and Mechanical Simulations

Figure 23A:
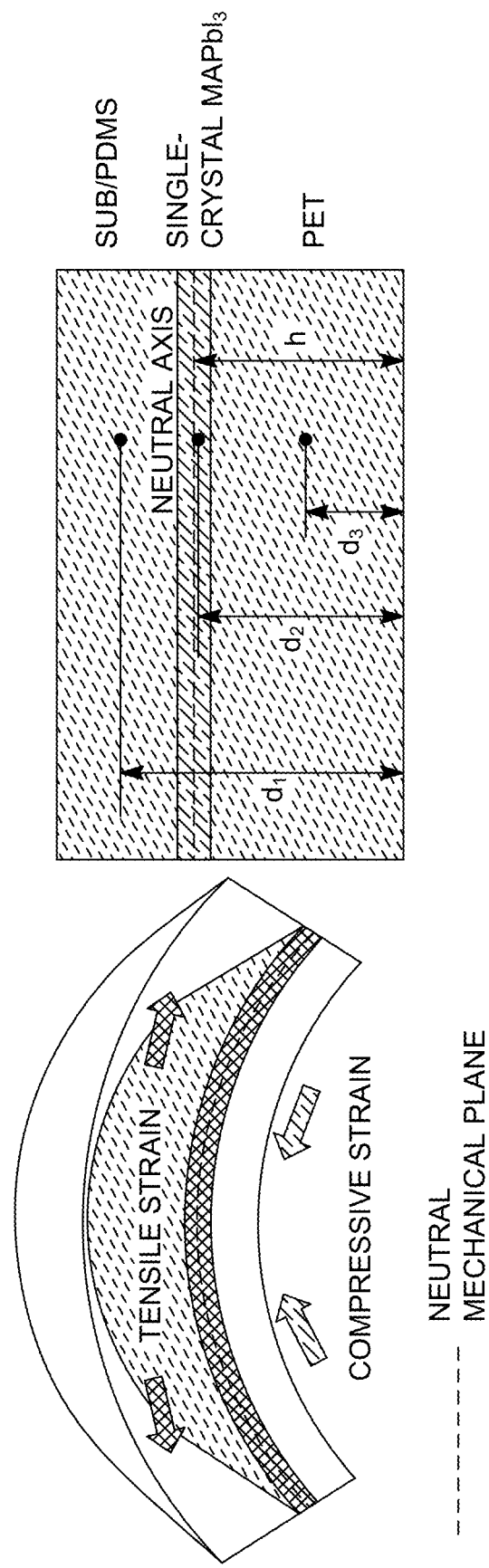
FIG. 23a show a schematic of method for calculating the position of the NMP.
Figure 23B:
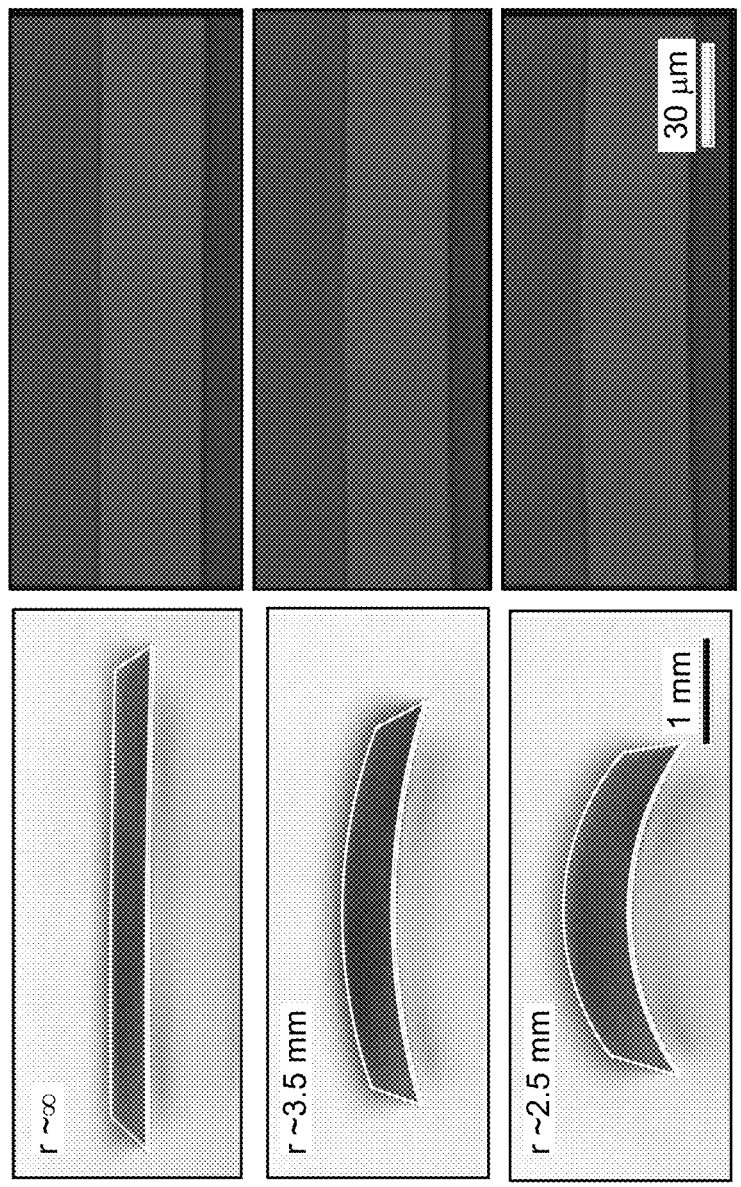
FIG. 23b shows optical (left) and SEM (right) images under different bending conditions.

The NMP is defined as a conceptual plane within a beam or cantilever. When loaded by a bending force, the beam bends so that the inner surface is in compression and the outer surface is in tension. The NMP is the surface within the beam between these zones, where the material of the beam is not under stress, either compression or tension. Therefore, if a critical material (layer) of interest is sufficiently thin and can be located in/near the NMP, the generated strain in the material will be diminishingly small. As such, this approach provides a means of rendering the nominally brittle single-crystal perovskite as flexible. FIG. 23a show a schematic of method for calculating the position of the NMP. The SU8/PDMS top layer is critical for minimizing the strain in the single-crystal perovskite layer. FIG. 23b shows optical (left) and SEM (right) images under different bending conditions. The single-crystal perovskite (about 2 µm thick) can be successfully bent to a radius of about 2.5 mm. All optical images share the same scale bar. All SEM images share the same scale bar.

To design such a structure, a result from a simple 1D bending is first implemented to provide insights into this system (FIG. 23a right):

$$h = \frac{d_1 E_1 A_1 + d_2 E_2 A_2 + d_3 E_3 A_3}{E_1 A_1 + E_2 A_2 + E_3 A_3}$$

where h is the distance from the bottom of the system to the neutral plane, d is the distance from the bottom of the system to the middle plane of each individual layer, E is the Young's modulus of the given layer, and A is the cross-sectional area.

In this study, the thickness of the middle single-crystal MAPbI$_3$ is 2 µm and the modulus is 14 GPa; the thickness of the bottom ITO/PET is 70 and the modulus is 2 GPa. Other device component materials, including ITO, SnO$_2$, and Spiro-MeOTAD are not discussed here to simplify the model. In addition to these layers, we first design a top layer with a suitable modulus and thickness to locate the NMP at the middle of the single-crystal MAPbI$_3$ layer. For flexible or wearable devices, an overall small thickness is preferred for better conformability with nonplanar surfaces and a smaller form factor. Therefore, a thin top layer in the NMP structure is highly desired, which suggests that the top layer should have a modulus similar to or larger than that of the PET/ITO. Here, we use a mixture of PDMS and SU8 to form such a top layer. The purpose of mixing SU8 into the PDMS is to increase modulus of the top layer. The resultant modulus of the SU8/PDMS is measured to be around 2.5 GPa.

Based on these values and using the above equation, to locate the NMP at the center of the perovskite layer (h=d$_2$) requires a thickness of 62 µm for the top SU8/PDMS layer. Also, for the entire structure (PET/ITO/SnO$_2$/single-crystal perovskite/Spiro-MeoTAD/Au/SU8-PMDS), because of the small thicknesses and generally symmetric positions of other additional layers, the calculated NMP is still near the center of the perovskite layer, which indicates the simplified structure is reasonable. This model provides a quick and simple approach to the initial design of the multilayer stacks, as to place the critical components (i.e., the single-crystal MAPbI$_3$ layer) near the neutral axis, thereby reducing the levels of strain it experiences during bending.

Still, discrepancies may arise between experimental observations and predictions from the 1D model, due to Poisson effects and large deformations of the system not accounted for in this simple 1D bending equation. As such, to better design the system, we analyzed the full 3D mechanical response of this system.

The commercial software package ABAQUS enables simulating the full 3D mechanical response of the single-crystal perovskite devices. The composite layer (SU8/PDMS, single-crystal perovskite, and PET) consists of 8-node linear brick elements (C3D8H). The simulation implements values of the elastic modulus of SU8/PDMS, single-crystal perovskite, and PET of 2.5 GPa, 14 GPa, and 2 GPa, respectively. The simulation also implements linear elastic constitutive models for each material but includes non-linear geometric effects (finite deformation) to enable large out of plane deformation. In the simulations, the largest value of the maximum principal strain is found to be near the edge of the single-crystal perovskite layer due to 3D and Poisson effects. Computing this maximum value of strain at the critical radius of curvature from the experiments (the one that induces fracture) allows for an estimation of the failure strain of perovskite materials. For our tested/simulated system, this corresponds to a critical failure strain of ~0.36% for single-crystal perovskite layer, which suggests this layer itself is quite brittle. Again, however, the overall system exhibits good flexibility (maintaining mechanical integrity down to a bending radius of 2.5 mm) due to the NMP design.

Figure 24:
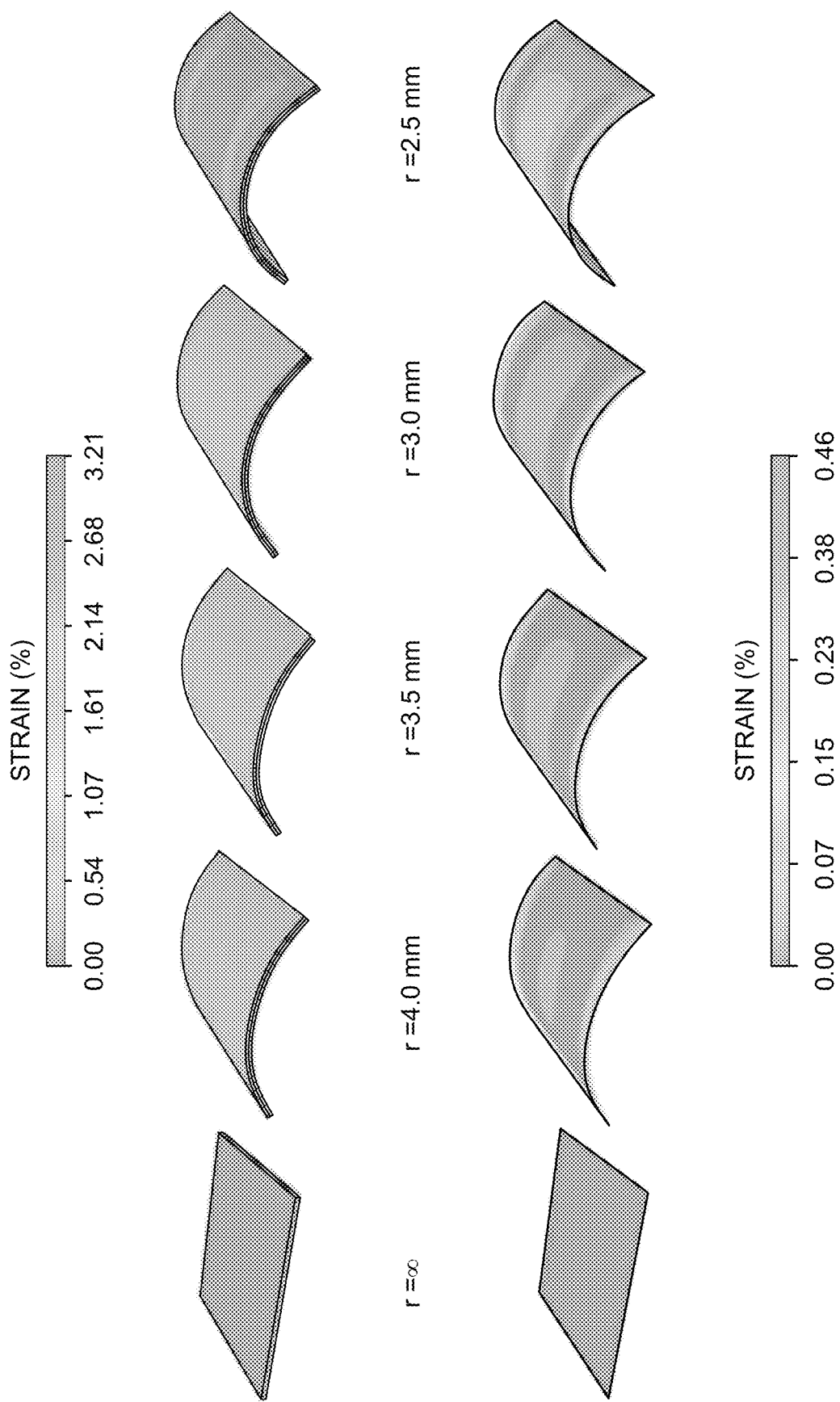
FIG. 24 shows finite element analysis simulations under different bending radii.

FIG. 24 shows finite element analysis simulations under different bending radii. The results in the top panels correspond to the entire sandwich structure, i.e., PET/single-crystal $MAPbI_3$/SU8-PDMS. The results in the bottom panels correspond to the extracted perovskite layer only (with the other layers hidden). At a bending radius of 2.5 mm, most parts of the perovskite layer have a principal strain of less than 0.25%. The edge areas show a principal strain of around 0.36%, which is close to the failure strain of this material.

Finally, we should note, that in using these simulations, a few assumptions are made that may not always be correct, depending largely on details of the fabrication process and the experimental testing procedure:
1. Boundary conditions: In the 3-D simulations, all layers are ideally attached, i.e., no slip or de-bonding occurs. However, slip or de-bonding may occur during the experiments, e.g., if the fabrication procedure does not lead to strong bonding between layers.
2. Input force (moment): Unlike in the experiments, a moment is applied to the device in the simulation. As such, the resulting deformation in the simulation does not have a constant bending radius of curvature along the length of the specimen.
3. Material parameters: The fabricated device may exhibit different material properties than are used in the simulation (e.g., modulus of the perovskite). Likewise, the critical strain to cause fracture may be different from what is reported (e.g., in the literature) and the actual material used in the experiments.

The results in FIG. 4c do exhibit a discrepancy between the NMP structure and the completed device structure. Different from a bending radius of r~2.5 mm in the NMP structure, the entire photovoltaic device exhibits a noticeable efficiency decrease at a radius of about 3 mm. This difference in bending radius should be due to the influences introduced by the additional layers in the photovoltaic device, including ITO, $SnO_2$, Spiro-MeOTAD, and Au, even though those layers do not change much the overall NMP position of the single-crystal hybrid perovskite.

Bandgap Measurements and Calculations

UPS measurements are carried out on graded single crystals with different growth time. Because the graded single crystal growth is under continuous solution exchanging, different growth time can result in different thicknesses and surface compositions. Thus, the surface bandgap at different growth time can represent the bandgap at different distances from the substrate interface of the graded bandgap single-crystal thin film.

Figure 25A:
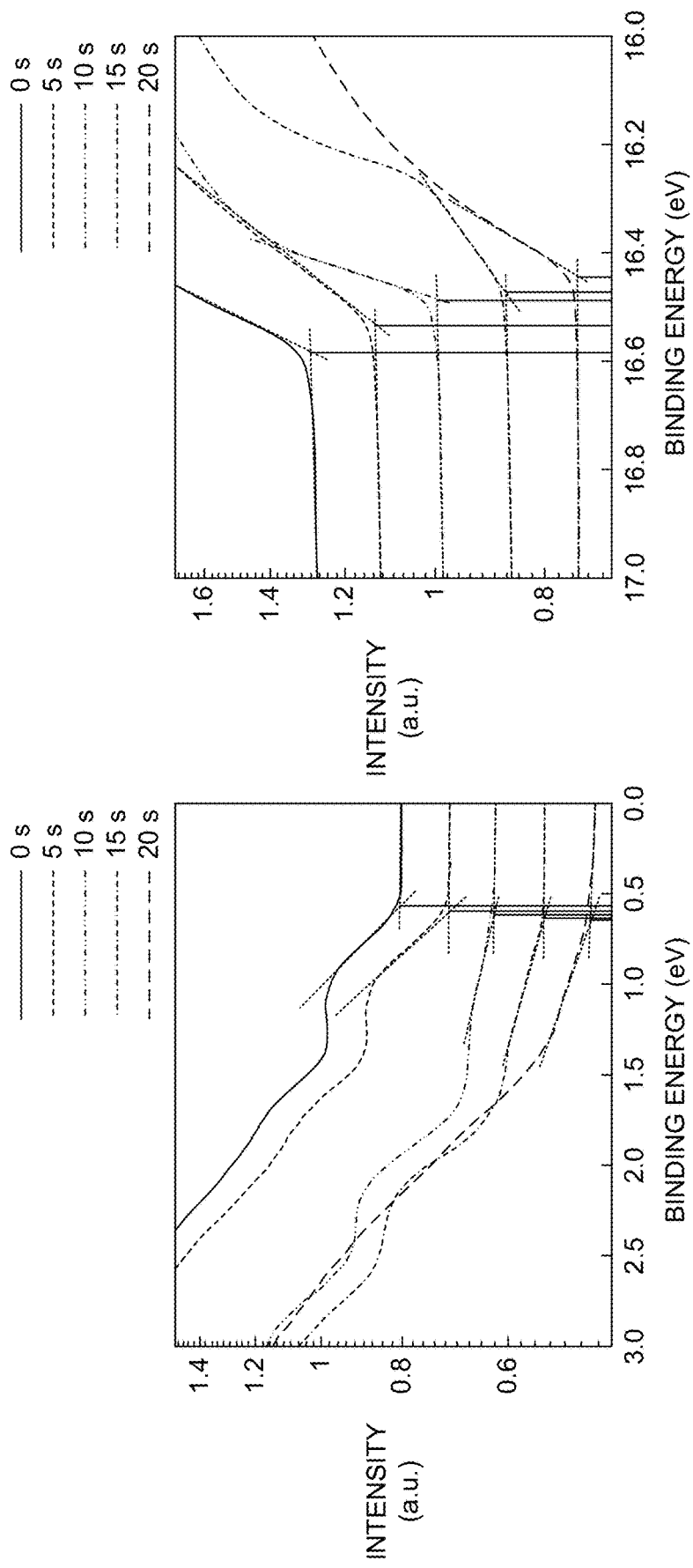
FIG. 25a shows semi-log plots of UPS measurements of the graded epitaxial single-crystal $MAPb_{0.5+x}Sn_{0.5-x}I_3$ for identifying the VBM position from the low binding energy cutoff (left) and the high binding energy cutoff (right)
Figure 25B:
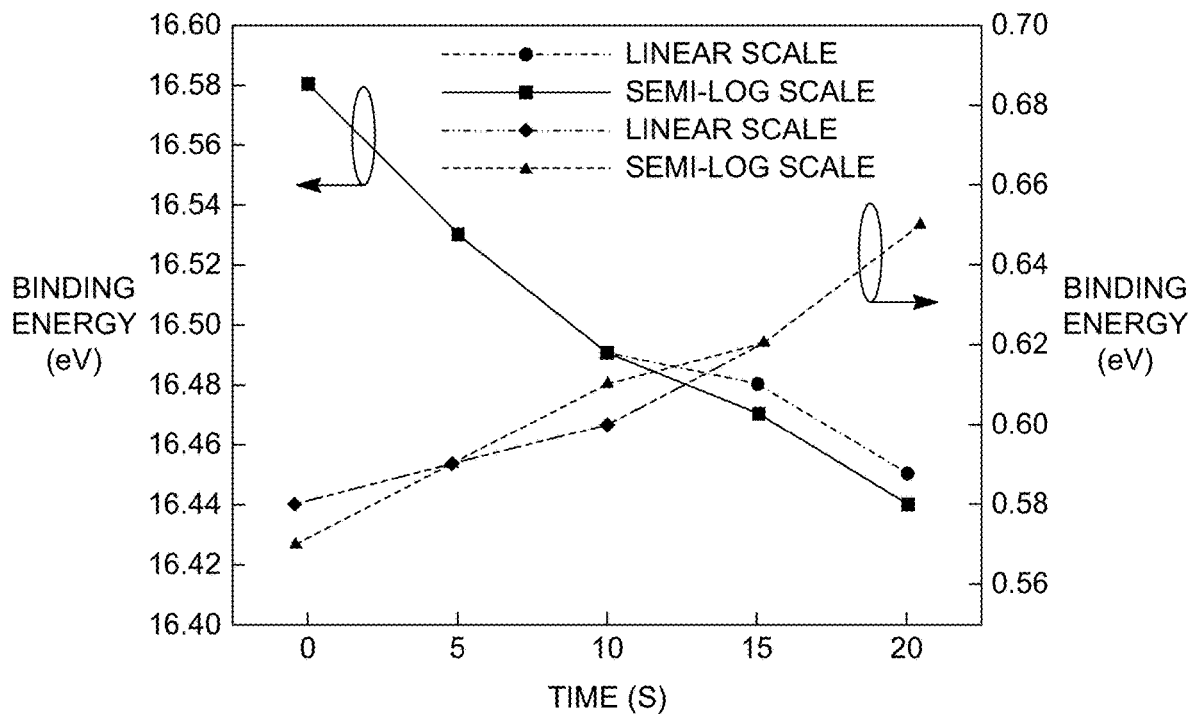
FIG. 25b compares binding energies from the linear scale plots and the semi-log scale plots.
Figure 25C:
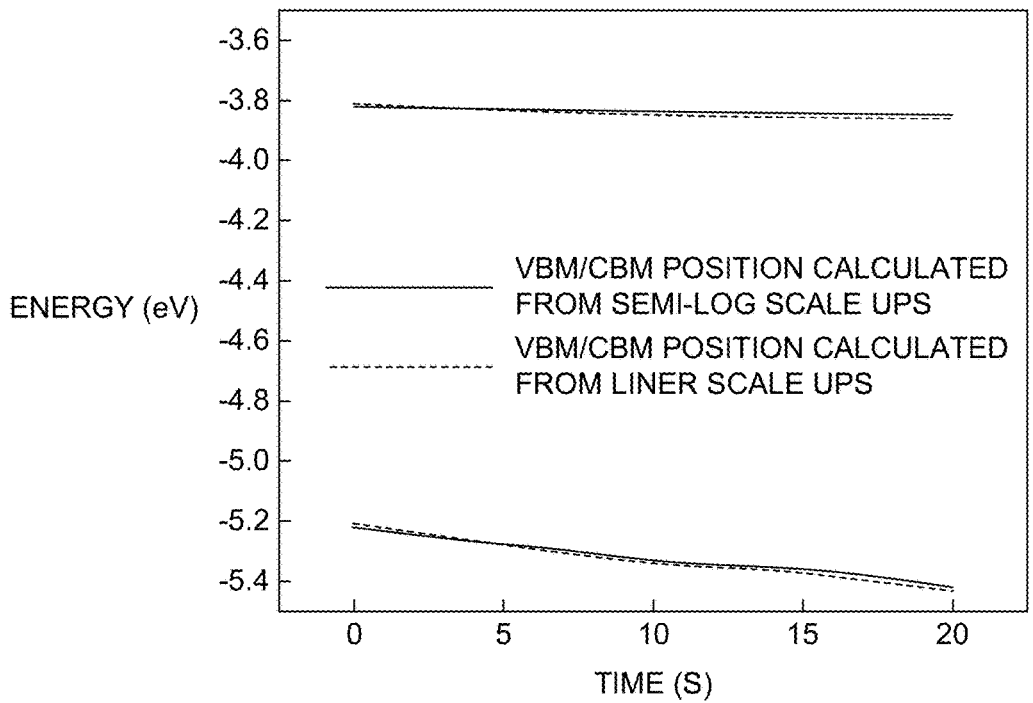
FIG. 25c shows summarized band diagrams calculated from the UPS data in both linear scale and semi-log scale.

In the UPS measurements, He I (21.22 eV) is used as the radiation source. The position of the electron affinity (Fermi level) versus vacuum is the difference between the high binding energy cutoff (FIG. 3b inset) and the He I radiation energy (21.22 eV). The position of VBM is the difference between the Fermi level and the low binding energy cutoff (FIG. 3b). Therefore, the location of the VBM can be calculated from the UPS measurements. Semi-log scale has also been plotted to double-check the cutting off positions, which can be seen in FIG. 25, which shows UPS measurements of the graded epitaxial single-crystal $MAPb_{0.5+x}Sn_{0.5-x}I_3$. In particular, FIG. 25a shows semi-log plots that are used to identify the VBM position from the low binding energy cutoff (left) and the high binding energy cutoff (right). FIG. 25b compares binding energies from the linear scale plots and the semi-log scale plots. The difference is considered to be negligible in this case. FIG. 25c shows summarized band diagrams calculated from the UPS data in both linear scale and semi-log scale. No obvious difference can be found. In the semi-log scale, there are no noticeable small intensities either, suggesting that the determination of the onset should be accurate. Additionally, we carefully measure the onset again to get accurate calculations of the VBM in the semi-log scale. We also compare the difference between the linear-scale and semi-log scale, and the difference between them in this case is negligible.

Figure 26A:
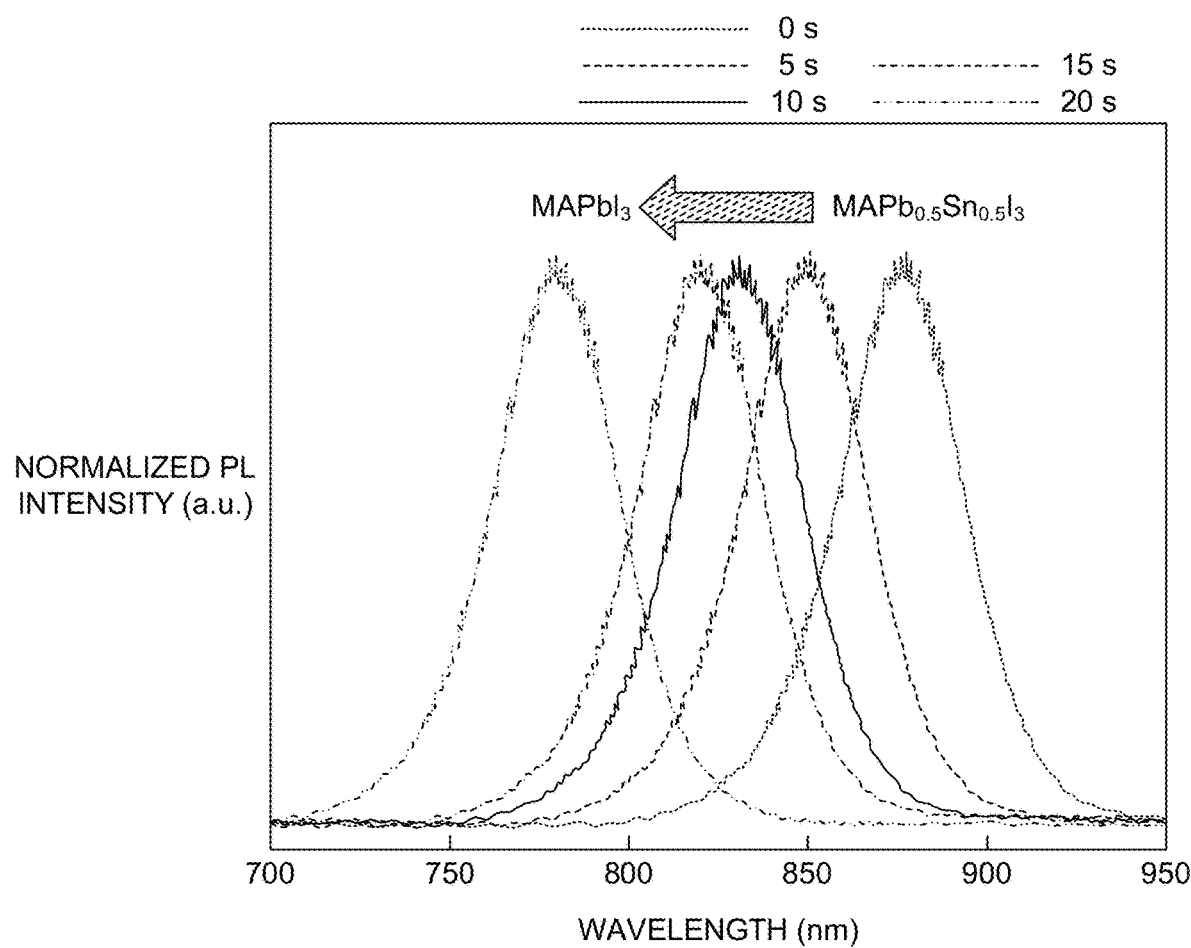
FIG. 26a shows PL measurements of graded single-crystal $MAPb_{0.5+x}Sn_{0.5-x}I_3$ at different growth time-stages.
Figure 26B:
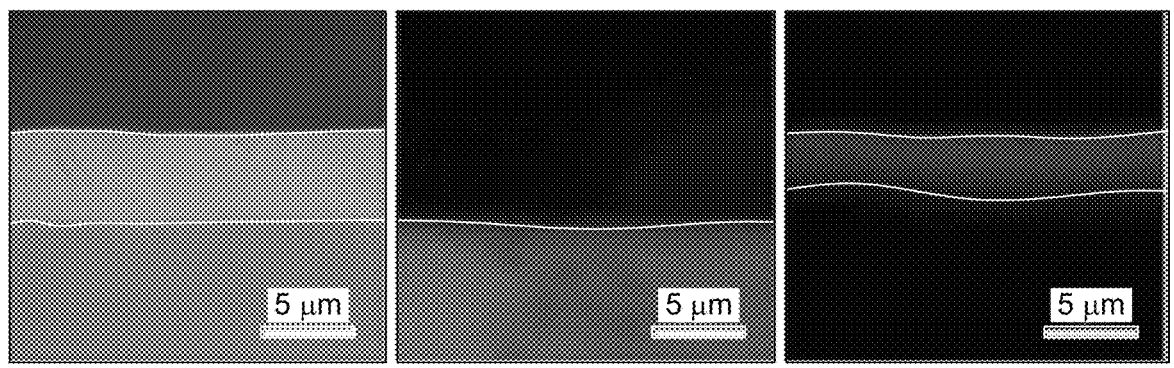
FIG. 26b shows an optical image (left) of the epitaxially grown graded single-crystal $MAPb_{0.5+x}Sn_{0.5-x}I_3$ on top of the single-crystal $MAPbBr_3$ substrate, a fluorescent image from $MAPbBr_3$ (middle) and a fluorescent image from Pb rich part in the graded single-crystal $MAPb_{0.5+x}Sn_{0.5-x}I_3$ (right).

To obtain the full band structure, the bandgap value also needs to be measured for calculating the CBM. The bandgap values are measured via UV-Vis in the reflection mode (FIG. 3c) and PL. FIG. 26a shows PL measurements of graded single-crystal $MAPb_{0.5+x}Sn_{0.5-x}I_3$ at different growth timestages. All samples are measured only at the top surface. A blue shift of the PL as time increases corresponds to an increased bandgap from the $MAPb_{0.5}Sn_{0.5}I_3$ side to the $MAPbI_3$ side. FIG. 26b shows an optical image (left) showing the epitaxially grown graded single-crystal $MAPb_{0.5+x}Sn_{0.5-x}I_3$ on top of the single-crystal $MAPbBr_3$ substrate. The middle fluorescent image is from $MAPbBr_3$ while the right fluorescent image is from Pb rich part in the graded single-crystal $MAPb_{0.5+x}Sn_{0.5-x}I_3$.

Since the UV-Vis light will penetrate deeper into the crystal than the He—I, the UV-Vis measurement represents an averaged bandgap of the different compositions within the penetration depth. To precisely measure the bandgap of a single composition in the graded structure, we use the growth solution, with the same composition as the surface of the crystal at a particular growth time, to grow a single composition epitaxial single-crystal thin film. The calculated entire band structure is presented in FIG. 3c.

First-Principles Density Functional Theory (DFT) Calculations

Structural and electronic properties of $MAPb_{0.5+x}Sn_{0.5-x}I_3$ are calculated using first-principles density functional theory (DFT). A 2×2×2 supercell of tetragonal $MAPbI_3$ are built to model Sn-doped $MAPbI_3$, which contains a total number of 384 atoms with 32 Pb atoms. The Pb atoms are substituted by Sn to build the $MAPb_{0.5+x}Sn_{0.5-x}I_3$ supercells with x decreasing from x=0.5 to x=0 in 0.125 decrements. This yields a total number of five structures. These structures are fully optimized and used to calculate the density of states (DOS) and electronic band structures.

DFT calculations are carried out using the Vienna Ab Initio Simulation Package (VASP). The core-valence interaction is described by the Projector-Augmented Wave (PAW) pseudopotential. The electron-electron exchange-correlation function is treated using the Generalized Gradient Approximation (GGA) parametrized by Perdew, Burke, and Ernzerhof (PBE). The wave functions are expanded in a plane-wave basis set with a cutoff energy of 400 eV. All structures are fully optimized until all components of the residual forces are smaller than 0.03 eV/Å. The convergence threshold for self-consistent-field iteration is set at $10^{-5}$ eV. The Brillouin zone of the 384-atom supercells is sampled by the F point for optimization. A denser k-point mesh of 2×2×1 is used for the static run. Electronic band structures are calculated along with the high-symmetrical points of body-centered tetragonal lattice.

Figure 27A:
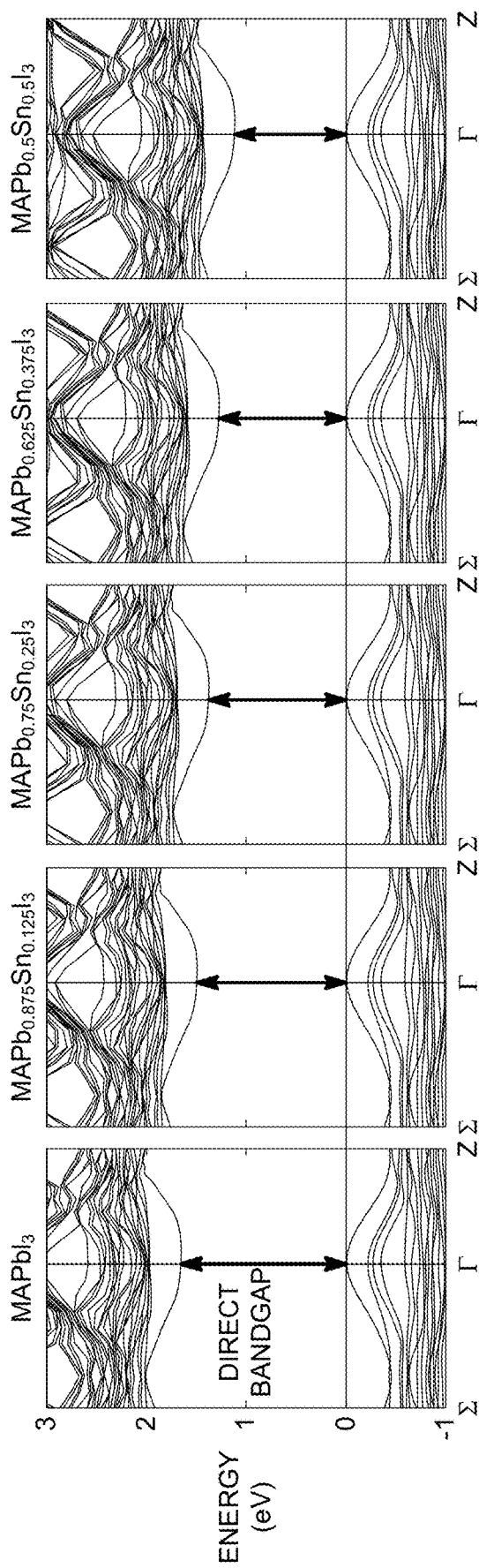
FIG. 27a shows the calculated electronic band structures for $MAPb_{0.5+x}Sn_{0.5-x}I_3$ with increasing the Sn composition.
Figure 27B:
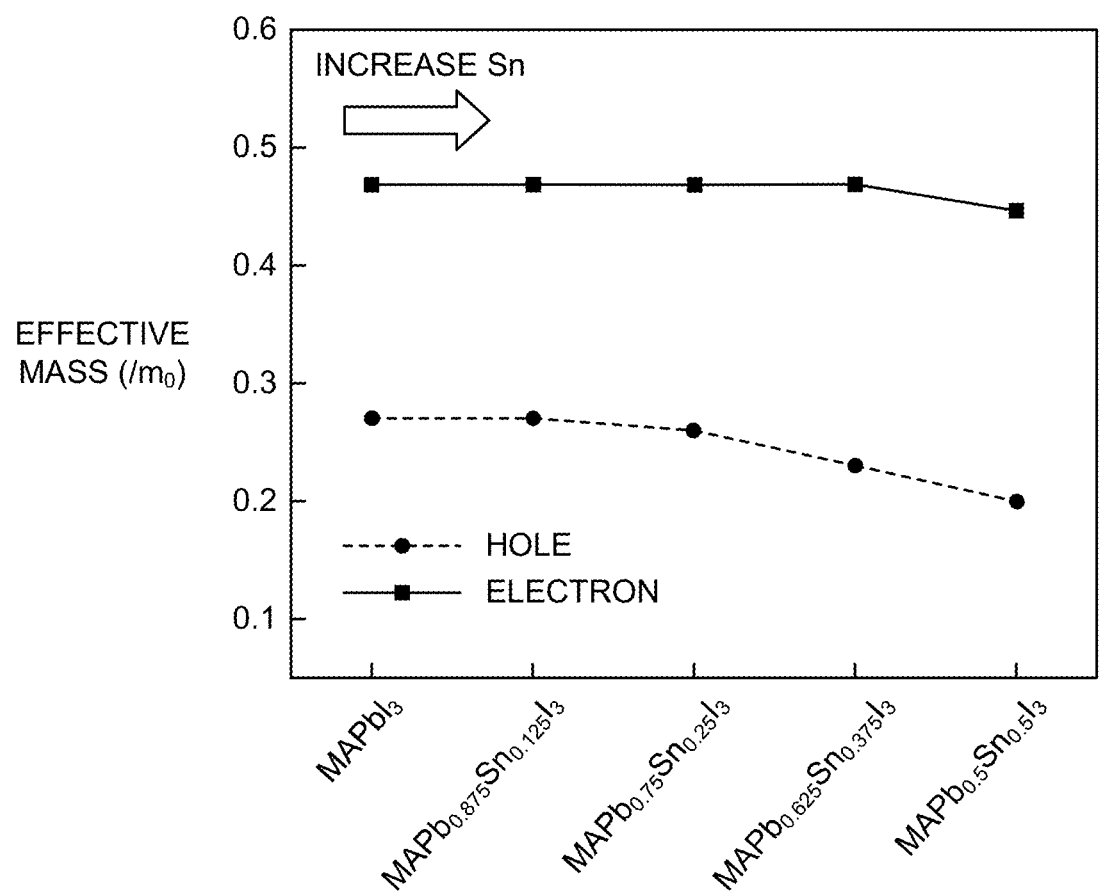
FIG. 27b shows the calculated effective masses for electrons and holes in the graded single-crystal $MAPb_{0.5+x}Sn_{0.5-x}I_3$ with increasing the Sn concentration.

With the Sn substitution, the Sn—I bonds are obviously shorter than the original Pb—I bonds. Therefore, the cell volume shrinks as Sn concentration increases. FIG. 27a shows the calculated electronic band structures for $MAPb_{0.5+x}Sn_{0.5-x}I_3$ with increasing the Sn composition. The VBM for each structure is normalized to zero point. All structures show direct bandgaps at the F point. The bandgap energies calculated with GGA decreases as the Sn composition increases. Although GGA is well-known to underestimate the bandgap energy, it correctly shows a trend (relative energy) among models with similar crystal structures and chemical compositions. Electron and hole effective masses are fitted near the band edges by:

$$\frac{1}{m_e^*} = \frac{1}{\hbar^2} \frac{\partial^2 E_C}{\partial k^2}$$

$$\frac{1}{m_h^*} = \frac{1}{\hbar^2} \frac{\partial^2 E_V}{\partial k^2}$$

where $m_e^*$ is the electron effective mass, $m_h^*$ is the hole effective mass, $\hbar$ is the reduced Planck constant, $E_C$ is the conduction band energy, $E_V$ is the valence band energy, and k is the wavevector. FIG. 27b shows the calculated effective masses for electrons and holes in the graded single-crystal $MAPb_{0.5+x}Sn_{0.5-x}I_3$ with increasing the Sn concentration. As shown, $m_e^*$ barely changes, while $m_h^*$ decreases as the Sn concentration increases. This trend is obvious where the valence band becomes more dispersive from x=0.5 to x=0. The results indicate a smaller hole mobility as the Sn concentration increases in $MAPb_{0.5+x}Sn_{0.5-x}I_3$.

Figure 27C:
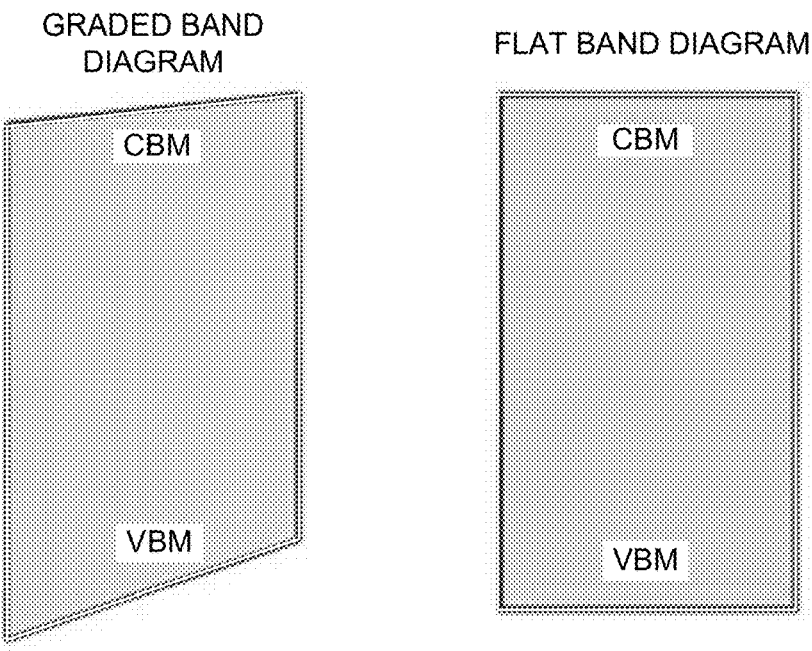
FIG. 27c shows graded single-crystal $MAPb_{0.5+x}Sn_{0.5-x}I_3$ (left) showing a graded bandgap in comparison with the flat bandgap of conventional $MAPbI_3$ (right).

Further, to analyze the changes of band edges as a function of the Sn composition, we align DOS for the five $MAPb_{0.5+x}Sn_{0.5-x}I_3$ structures to Hydrogen is state in MA molecules. Because the discrete energy level of the hydrogen atom in MA molecules is highly independent on the band edge-derived states, the Hydrogen is state in MA molecules can be used as an energy reference to determine relative positions of band edges. In this case, the VBM continuously increases while the CBM barely changes as the Sn concentration increases. This can be seen in FIG. 27c, which shows graded single-crystal $MAPb_{0.5+x}Sn_{0.5-x}I_3$ (left) showing a graded bandgap in comparison with the flat bandgap of conventional $MAPbI_3$ (right). This trend is in good agreement with our experimental results and indicates that the decrease of the bandgap as the Sn concentration increases is mainly induced by the increase of VBM.

Improved Performance by the Graded Band Structure

To explain possible reasons for the enhanced performance in bandgap-graded single-crystal $MAPb_{0.5+x}Sn_{0.5-x}I_3$ photovoltaics, several investigations were performed. The main reasons are found to be the enhanced $J_{SC}$ and relatively high $V_{OC}$.

The enhanced $J_{SC}$ is due to the Sn doping, which results in reduced bandgap and exciton binding energy in comparison with the $MAPbI_3$. Both the light absorption range and the excited carrier concentration in the $MAPb_{0.5+x}Sn_{0.5-x}I_3$ are enhanced, which leads to an enhanced output current. This phenomenon is reflected by the EBIC and EQE measurements. From the EBIC results, uniform current intensities exist in the $MAPbI_3$ and $MAPb_{0.5}Sn_{0.5}I_3$ while a gradient current intensity is measured in the $MAPb_{0.5+x}Sn_{0.5-x}I_3$. The reduced current in the Pb area is due to a broader bandgap and a higher exciton binding energy. The uniform current intensity distribution in the single-crystal $MAPbI_3$ and compositionally uniform $MAPb_{0.5}Sn_{0.5}I_3$ also serves as additional evidence for the absence of twins or small angle grain boundaries during the expanding/merging growth process. From the EQE measurements, the larger absorption range and higher current density of the $MAPb_{0.5+x}Sn_{0.5-x}I_3$ than the $MAPbI_3$ indicate that the Sn doping decreases the bandgap and therefore enhances the EQE.

Figure 28:
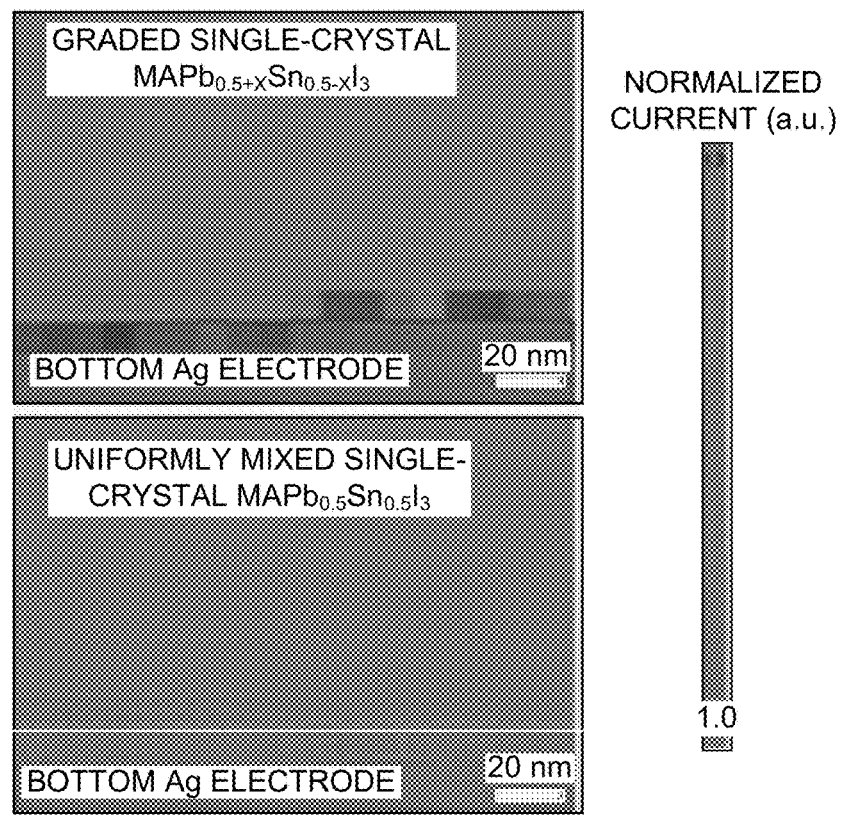
FIG. 28 shows EBIC mapping results as the interface of graded $MAPb_{0.5+x}Sn_{0.5-x}I_3$.

The relatively high $V_{OC}$ is related to the bandgap and the recombination in a particular photovoltaic structure. Sn doping normally largely decreases the $V_{OC}$ of the photovoltaics because of the decreased absorber bandgap. However, the $V_{OC}$ in the $MAPb_{0.5+x}Sn_{0.5-x}I_3$ photovoltaics is only slightly decreased from that of the $MAPbI_3$. To investigate the possible reason of the high $V_{OC}$ of $MAPb_{0.5+x}Sn_{0.5-x}I_3$, the carrier mobility and lifetime have been studied by ToF and TPV, respectively. For the carrier mobility, it's clear to see that the mobility of the $MAPb_{0.5+x}Sn_{0.5-x}I_3$ has been improved to as high as that of the $MAPb_{0.5}Sn_{0.5}I_3$ (FIG. 3f inset), which is because of the high intrinsic mobility in Sn-based hybrid perovskite. For the carrier lifetime, even though doping the Sn to Pb perovskite in a uniform composition single crystal normally largely decreases the lifetime, the graded Pb—Sn single crystal exhibits the highest lifetime among the three single crystals (FIG. 3f). Given the same (Au/single-crystal perovskite/ITO) device structure in the measurements, such a large carrier lifetime in the $MAPb_{0.5+x}Sn_{0.5-x}I_3$ is because of the self-tilted bandgap of the $MAPb_{0.5+x}Sn_{0.5-x}I_3$. In the EBIC mapping in FIG. 3d, the interfacial region of graded $MAPb_{0.5+x}Sn_{0.5-x}I_3$ (within about 20 nm from the interface with the substrate, whose composition is very close to $MAPb_{0.5}Sn_{0.5}I_3$, see FIG. 28, which shows EBIC mapping results as the interface of graded $MAPb_{0.5+x}Sn_{0.5-x}I_3$) always gives a higher current signal than the compositionally uniform $MAPb_{0.5}Sn_{0.5}I_3$, which also suggest a lower local recombination rate.

Compared with the typical absorber band structure, the self-tilted band structure can have a positive influence on the carrier transport: we can divide the self-tilted bandgap into innumerable individual bandgaps of an innumerable series of heterojunctions connected back to back. Each individual junction serves two functions: a light absorber and an ETL/HTL for its neighboring junctions. The latter function is absent in a typical single composition absorber. The recombination possibility of as-generated charge carriers in the absorber is largely suppressed, which leads to a relatively high $V_{OC}$ in the $MAPb_{0.5+x}Sn_{0.5}I_3$ photovoltaics.

Improved Bending Stability of the Single-Crystal Photovoltaics

Researchers have already studied the mechanical properties of perovskites in both polycrystalline and single-crystal structures. Even though both are considered to be brittle, the modulus in the polycrystalline perovskite is founded to be slightly higher than that in the single-crystal perovskite, which may be because of the anisotropic mechanical properties in single crystals. Therefore, single-crystals of perovskite with smaller modulus promises better integration with the human body for wearable applications.

So far, the stability issue has been considered to be the most critical factor in hindering applications of perovskite devices. Different from the polycrystalline structure in most of the current perovskite devices, the single-crystal structure has proved to have much better stability. In polycrystalline perovskites, $O_2$ and moisture can easily go through the entire thickness of the layer from the innumerable grain boundaries to react with the perovskite and degrade the device performance. Polycrystalline perovskite devices have been widely studied for years, but their intrinsic stability problems are still not solved. Grain boundaries also contribute to a higher defect density, a stronger carrier recombination, and an easier ion migration. In flexible devices, multiple-time bending can inevitably deteriorate the grain boundaries, potentially increasing the charge transfer barrier and carrier recombination, and accelerating material degradation. However, grain boundaries are absent in single-crystal perovskites, suggesting that flexible devices made of single-crystal perovskites may exhibit enhanced device lifetime and stability.

Figure 29A:
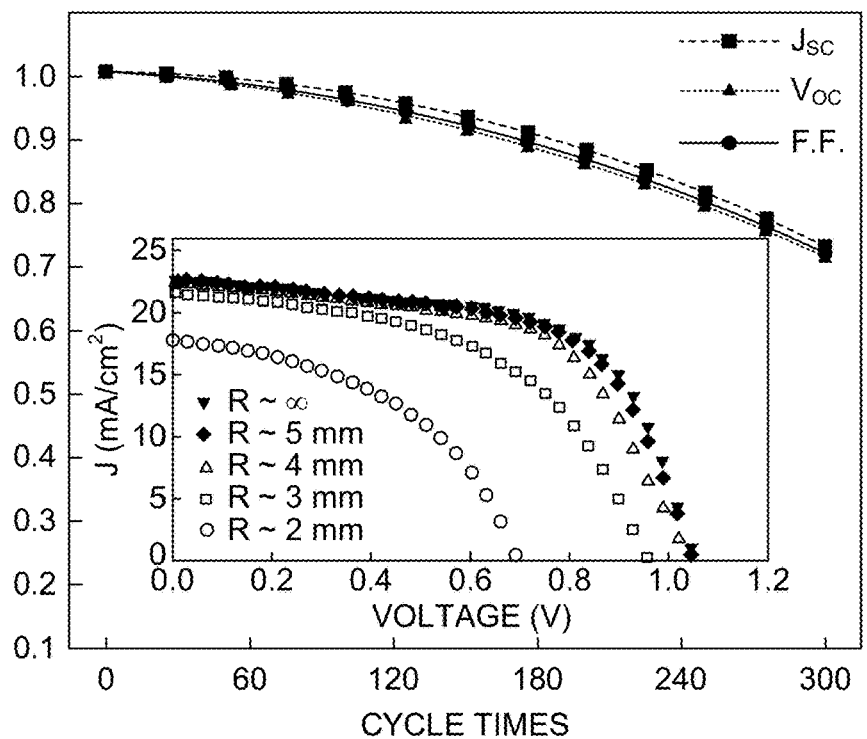
FIG. 29a shows cyclic flexibility tests of polycrystalline structures for polycrystalline $MAPbI_3$ and FIG. 29b shows cyclic flexibility tests of polycrystalline $MAPb_{0.5}Sn_{0.5}I_3$.
Figure 29B:
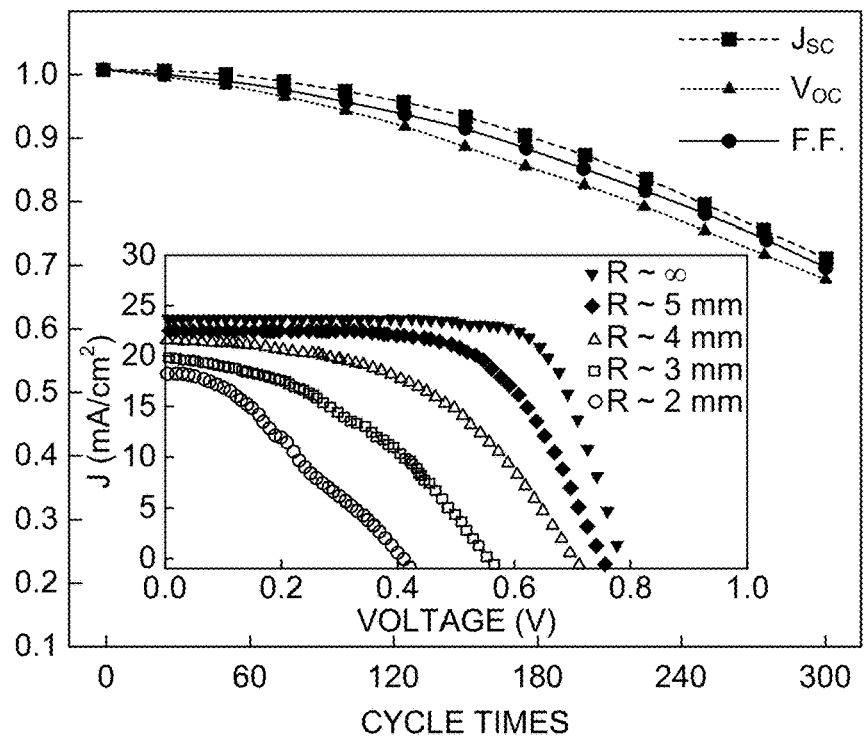

This hypothesis is tested and confirmed by experimental data. Polycrystalline photovoltaics show significant performance degradation under the same cyclic bending tests (see FIGS. 29, which shows cyclic flexibility tests of polycrystalline structures for polycrystalline $MAPbI_3$ in FIG. 29a and polycrystalline $MAPb_{0.5}Sn_{0.5}I_3$ in FIG. 29b), which may be caused by fast material and device degradation at the grain boundaries during bending. Single-crystal devices of the same device configuration exhibit much better stabilities under cyclic bending tests, indicating noticeable advantages of flexible devices based on single-crystal perovskites.

Figure 30A:
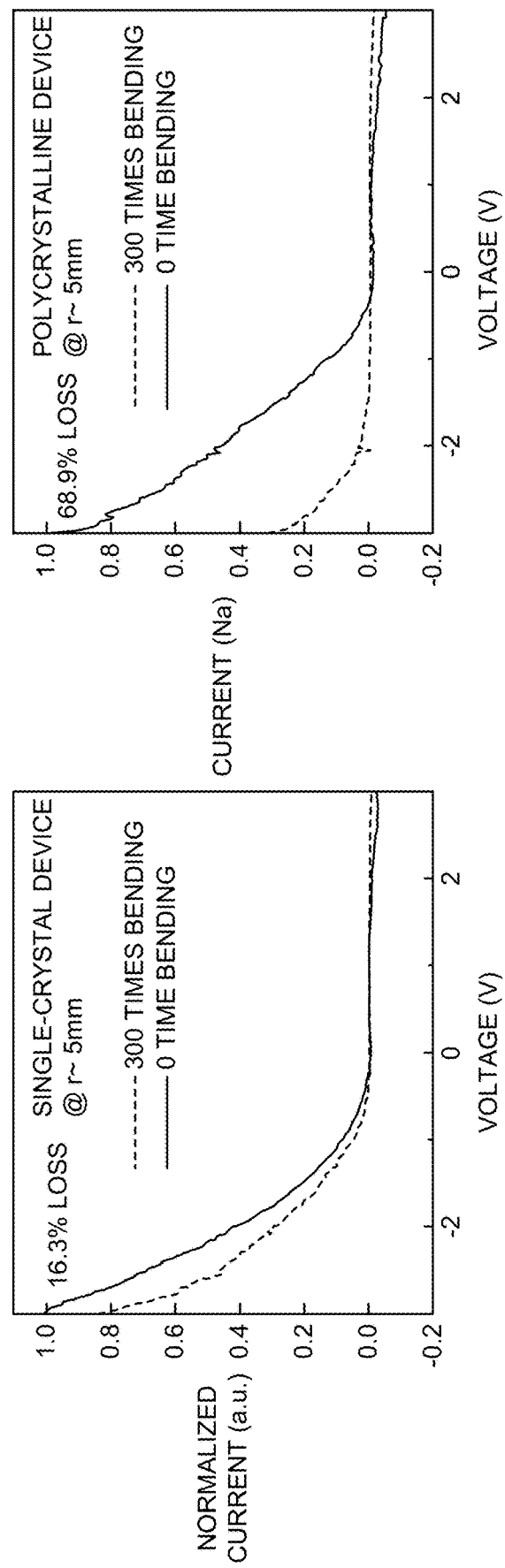
FIG. 30a shows IV measurement results of the single-crystal device (left) and the polycrystalline device (right) and FIG. 30b shows XRD ω scan measurement results of the single-crystal (left) and the polycrystalline (right)).
Figure 30B:
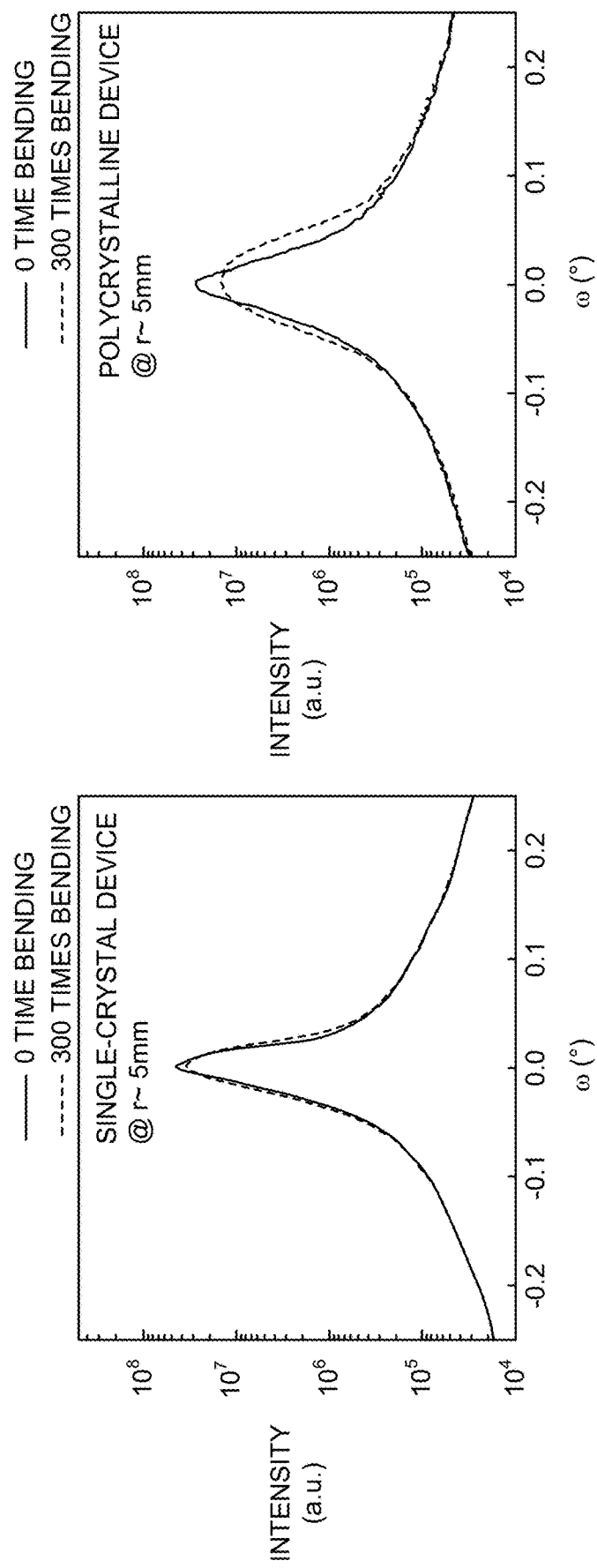
Figure 31A:
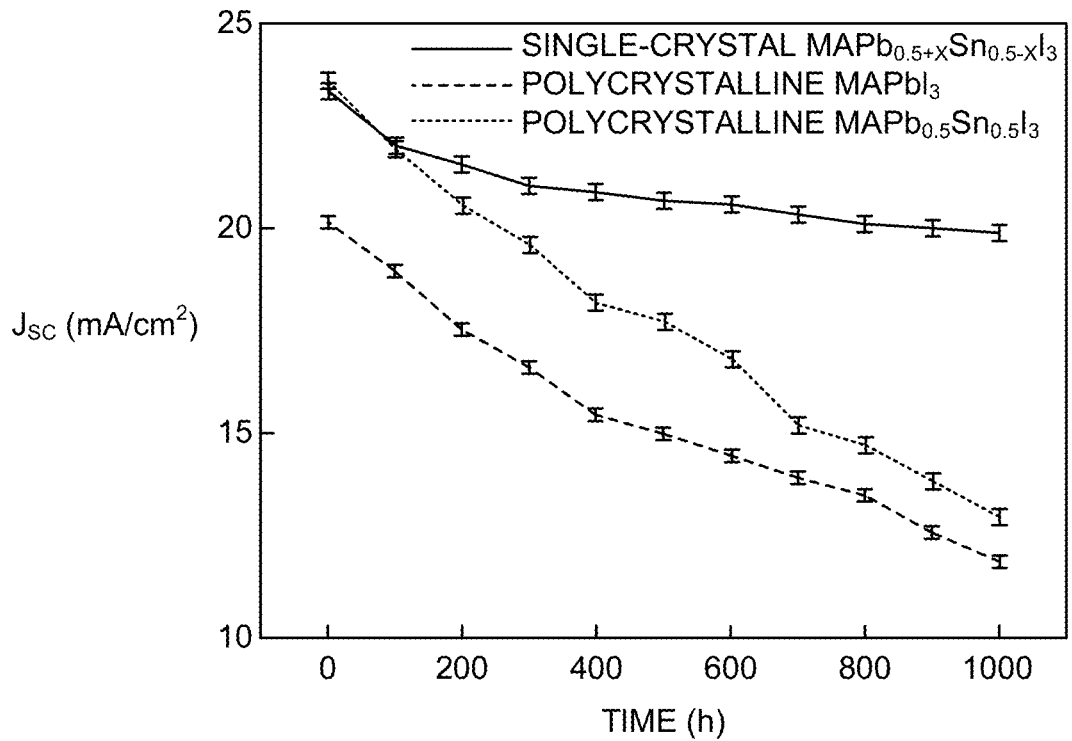
FIG. 31 shows summarized tracking results of $J_{SC}$, $V_{OC}$, F.F., and PCE in FIG. 31a, FIG. 31b, FIG. 31c, and FIG. 31d, respectively.
Figure 31B:
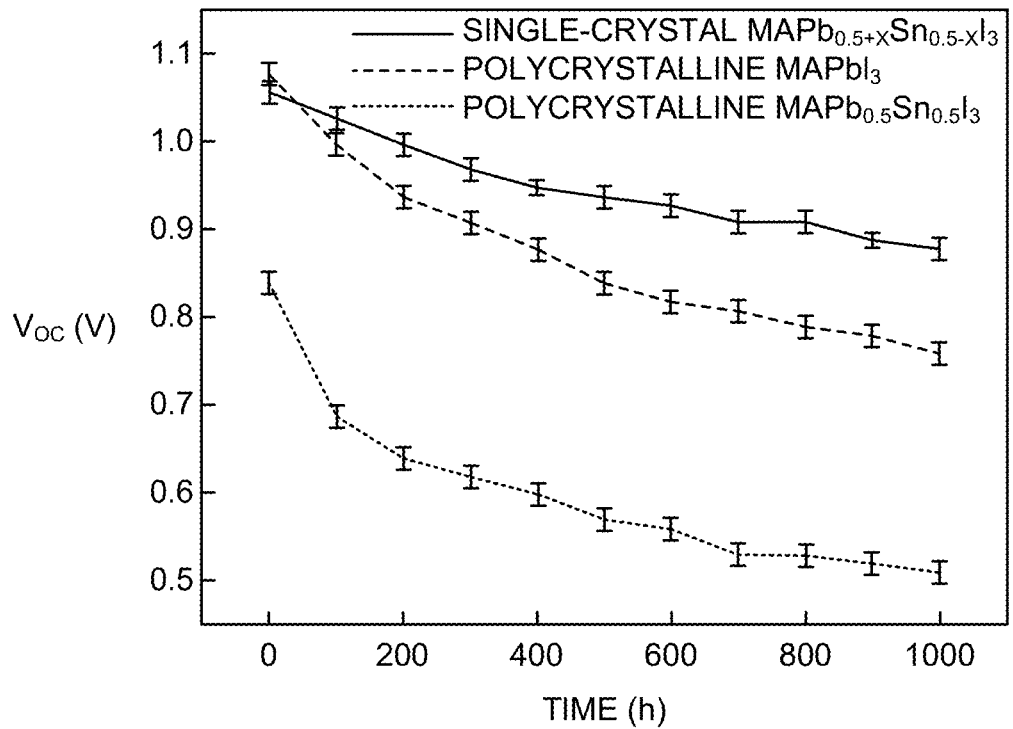
Figure 31C:
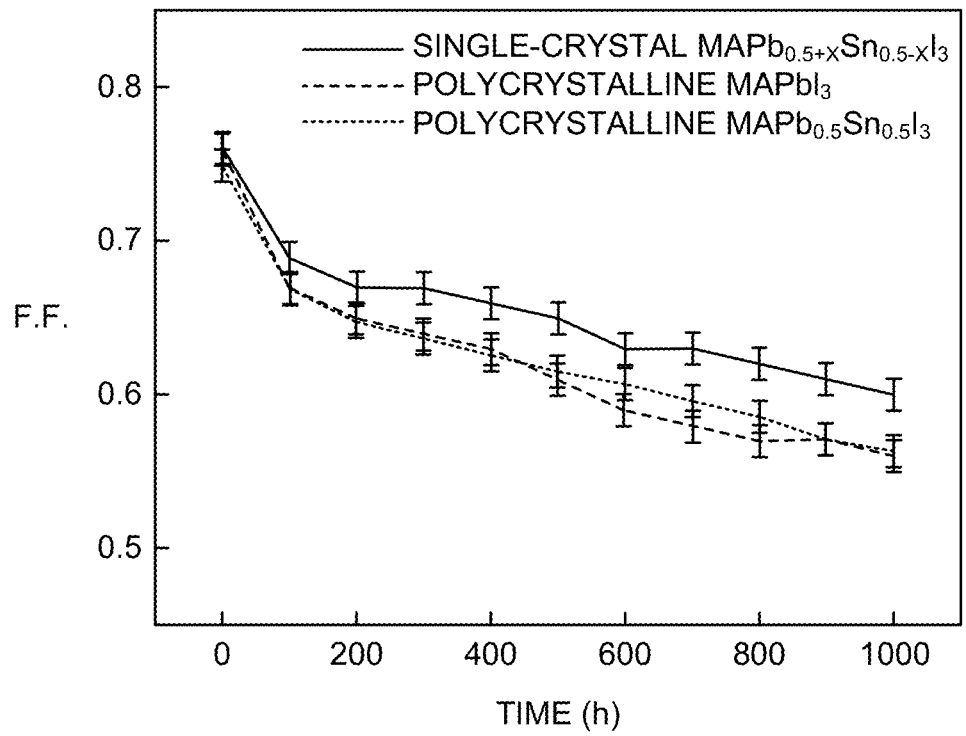
Figure 31D:
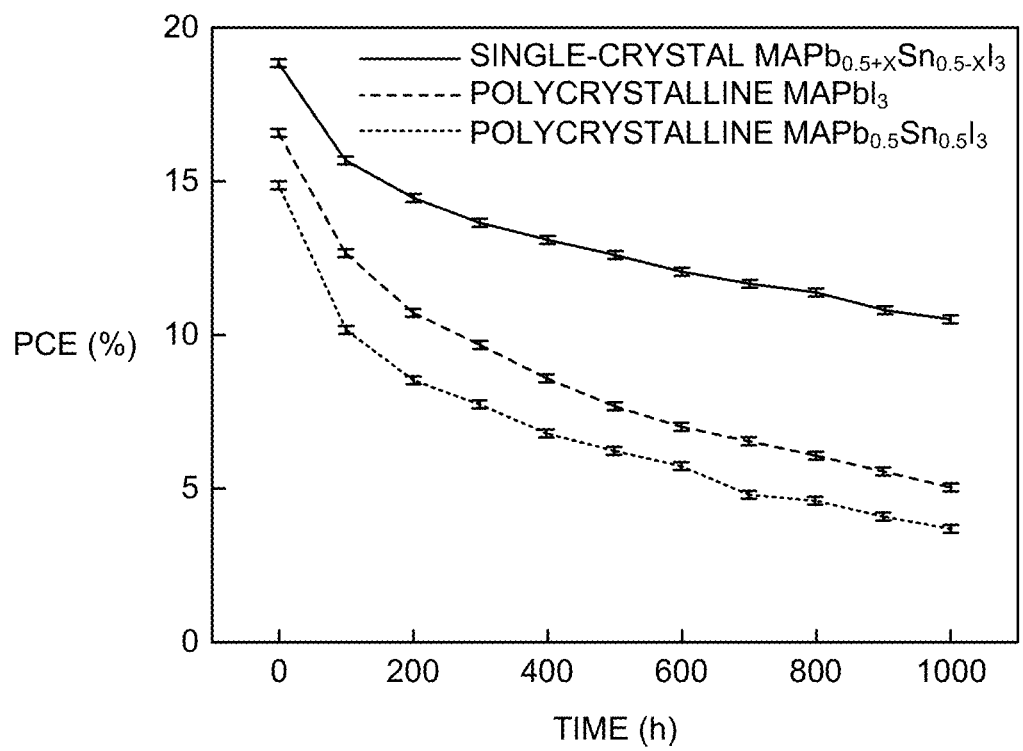

To further prove this conclusion, cycling-dependent material properties have been studied by using XRD ω scan and lateral I-V characterizations (see FIG. 30, which shows bending stability characterizations between single-crystal and polycrystalline structures, where FIG. 30a shows IV measurement results of the single-crystal device (left) and the polycrystalline device (right) and FIG. 30b shows XRD ω scan measurement results of the single-crystal (left) and the polycrystalline (right)). The size of polycrystalline and single-crystal films, and the two Au electrodes deposited by e-beam evaporation, are fixed to be the same for all devices. Lateral conductivity of the polycrystalline film after 300-time bending at a radius of 5 mm decreases to be only 31.1% of the intact one. In contrast, lateral conductivity of the single-crystal film still maintains 83.7% of the intact one, indicating a lower charge transfer barrier in the single-crystal film generated by the cyclic bending. XRD ω scan results support this conclusion. The FWHM of the polycrystalline film after bending becomes larger while the peaks from the single-crystal film does not change noticeably, which evidently indicates that single-crystal thin films are more resistant to fatigue. Consider the same operational conditions, such a difference is attributed to the deteriorated grain boundaries (increased series resistance) and the degraded materials (e.g., impurities, ion migration, and decomposition) in the polycrystalline thin film in comparison to the single-crystal film.

Considering the high intrinsic structural defects and the instability issue of polycrystalline perovskites, replacing polycrystalline films with single-crystal films for flexible devices may provide a way for better device performance and longer device lifetime.

Photovoltaic Device Performance Tests

Each single-crystal photovoltaic device (0.5 cm×0.5 cm) in the array is individually measured with a shadow mask. If not specified, all tests are using one $MAPb_{0.5+x}Sn_{0.5-x}I_3$ single-crystal photovoltaic device in the array without bending. The device in the center of a 5 by 5 array is selected for all of the measurements. The polycrystalline photovoltaic devices are also coated with SU8/PDMS top layers for fair comparisons. All tests (except the stress stability tests) are under constant 1-Sun from a standard solar simulator source with air mass 1.5 global filters. A 10 min light soaking is applied to all of the measurements. A small desktop fan is used to dissipate the heat generated by illumination.

In the stability comparison tests between the single-crystal and polycrystalline photovoltaics (FIGS. 4d-4f), two compositionally uniform polycrystalline films (i.e., $MAPbI_3$ and $MAPb_{0.5}Sn_{0.5}I_3$), and a graded Pb—Sn single-crystal film are used, because there is currently no method to deposit graded polycrystalline films. We adopt the same HTL/ETL contact interfaces for the polycrystalline photovoltaics as the graded single-crystal photovoltaics, because the interfaces are paramount in photovoltaic device performance and stability. For the thermal stability, the devices are all completed with PET and PDMS encapsulation. Then, the devices are placed into an oven for aging. Because all devices are encapsulated, the humidity condition should not be an influential factor. The aging time for the thermal tests is two hours. For the humidity tests, the devices are not encapsulated, and the aging time is 30 mins because otherwise the oxidation of $Sn^{2+}$ can rapidly dominate the degradation mechanism.

The humidity control can be realized by calculation from the water vapor pressure according to the thermodynamic equilibrium with condensed states, which can be controlled by adjusting the amount of water in the air in a sealed space. The saturated water vapor pressure look-up table is used to calculate the needed amount of water for different humidity at a certain temperature, which can be applied to control the relative humidity. A glass box is used as the confined space, where different amounts of water are added. Then, the box is placed into an oven to keep the temperature to be 30° C. until the water is fully evaporated. In this way, the relative humidity in the glass box can be designed accurately at different levels. For example, from the look-up table, the saturated vapor pressure of water under 30° C. can be found to be 0.0042 MPa, which means that at 30° C., 100% relative humidity refers to a partial pressure of water vapor of 0.0042 MPa. Therefore, the volume ratio of water vapor is 4.2%. If the relative humidity is 70%, the total volume of water vapor in a container of 1 $m^3$ size will be 4.2%×70%×1000=29.4 L, which is 21.0 g (according to the condition at 30° C.). In our study, we need to add 0.00265 g water (2.62 μl) into a 125 $cm^3$ glass box to achieve a 70% humidity. Similarly, if the relative humidity is 30%, the total volume of water in 1 $m^3$ container will be 4.2%×30%×1000=12.6 L, which is 9.0 g (according to the condition at 30° C.), and the amount of the water we need to add to a 125 $cm^3$ glass box will be 0.00114 g (1.12 μl). In the experiments, to avoid additional background humidity from the natural environment before the experiment, the glass box will be placed into an oven at 100° C. for overnight to create a dry environment. A portable commercial humidity sensor is attached to the internal wall of the glass box for calibration purposes.

For the long-time stability tests, all of the devices are stored in a dark dry box for monthly measurements.

Stability of the Single-Crystal Photovoltaics in Continuous JV Measurements

Maximum power point tracking under continuous 1-sun illumination has been performed to study the device stability. A small desktop fan is used to dissipate the heat generated by illumination. The results are summarized in FIG. 31, which shows summarized tracking results of $J_{SC}$, $V_{OC}$, F.F., and PCE in FIG. 31a, FIG. 31b, FIG. 31c, and FIG. 31d, respectively.

From the measurement results, all devices show a relatively rapid degradation during the first 100 hours, followed by steady degradation rates. In contrast to the shelf-stability in the FIG. 4f, where the single-crystal devices are much more stable than the polycrystalline devices, continuous illumination tests show similar degradation rates among these devices, even though the single-crystal structure has better material stability against moisture, heat, $O_2$, and strong light intensity, as illustrated by (FIGS. 4d, 4e, FIG. 32, and FIGS. 33, 34 and 35).

Figure 32:
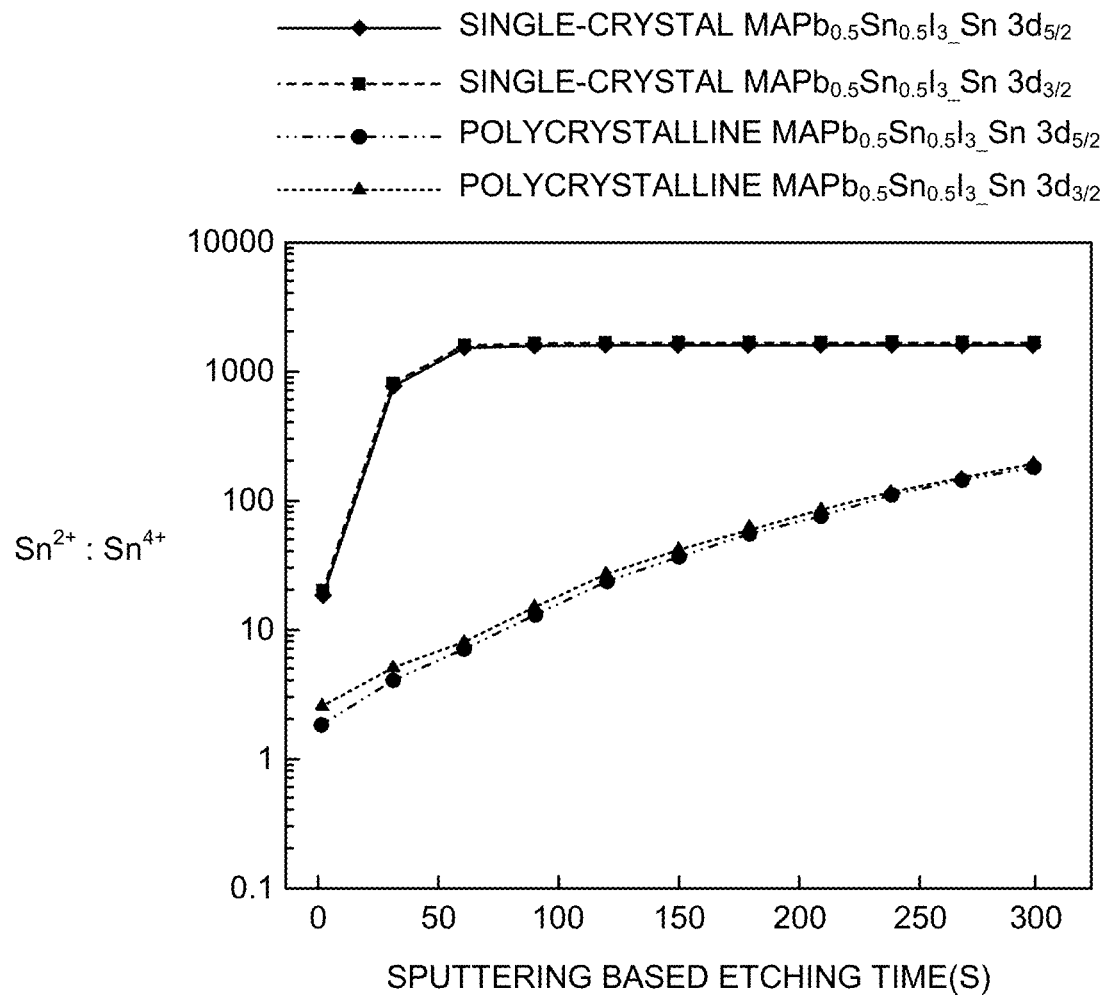
FIG. 32 shows in-situ XPS depth profile studies of different crystal structures.
Figure 33A:
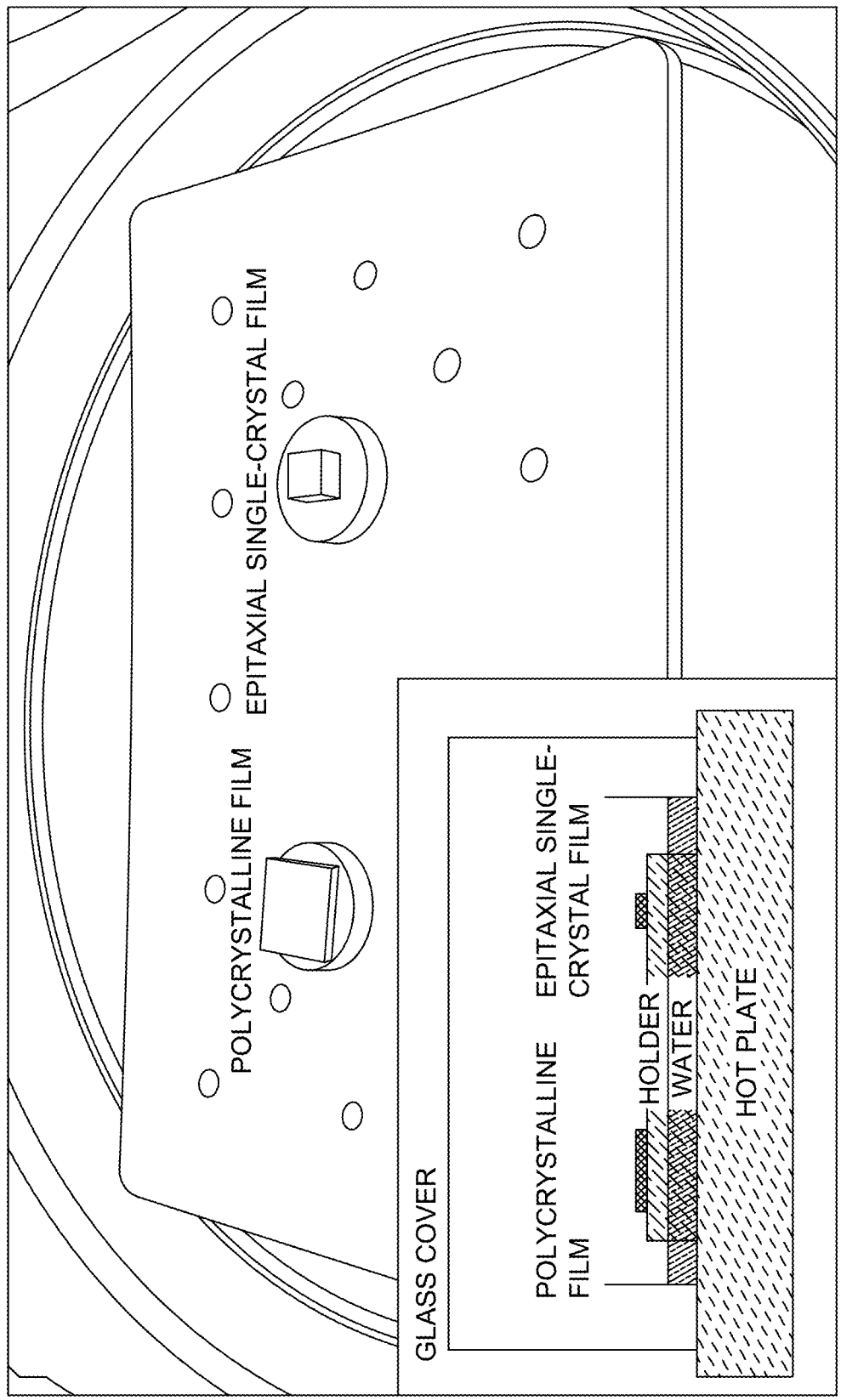
FIG. 33a shows an experimental arrangement for performing thermal and humidity tests. The hot plate temperature is set to be 100° C.
Figure 33B:
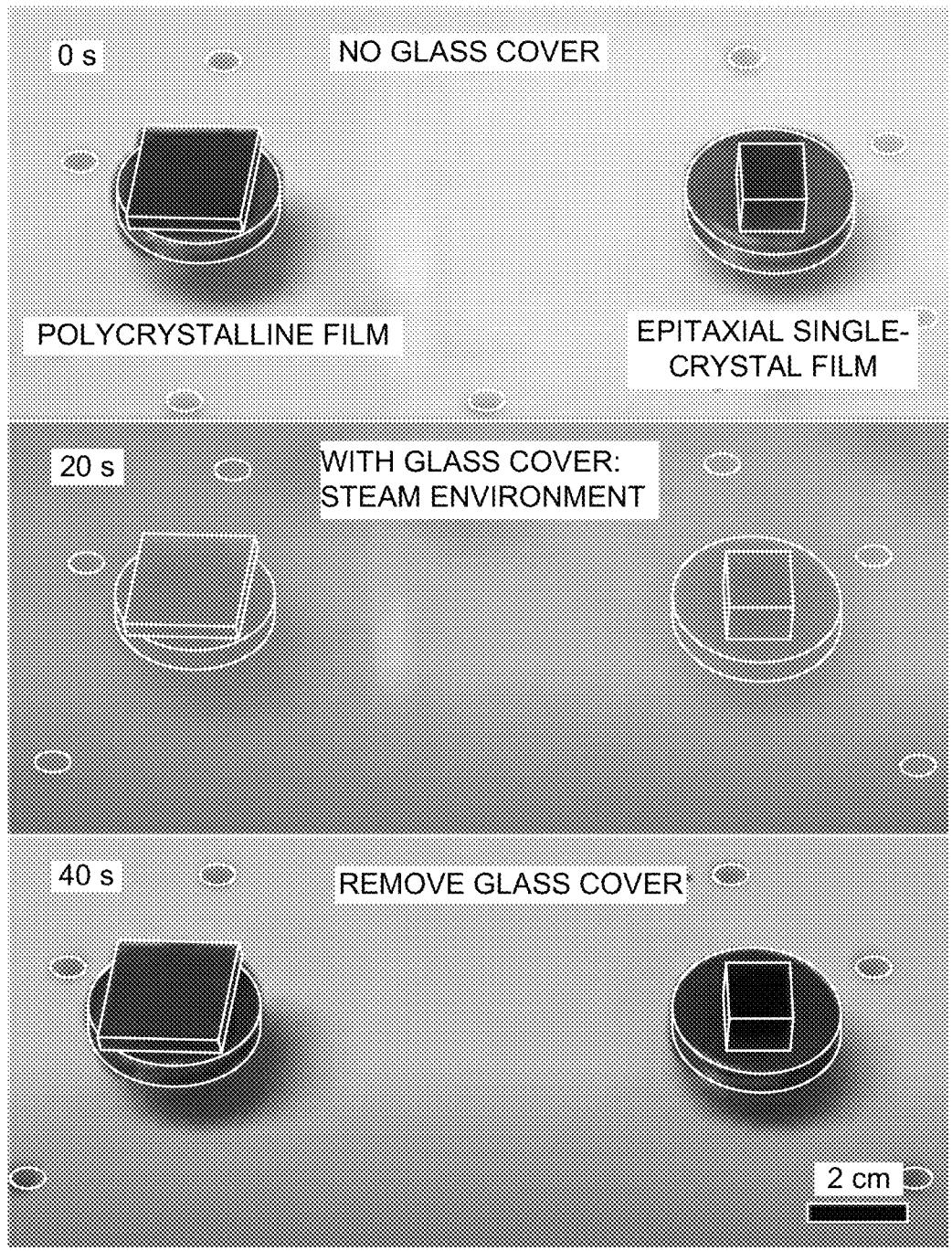
FIG. 33b shows that a polycrystalline $MAPb_{0.5}Sn_{0.5}I_3$ film exhibits rapid color change and phase transition while the single-crystal $MAPb_{0.5}Sn_{0.5}I_3$ film remains intact.
Figure 33C:
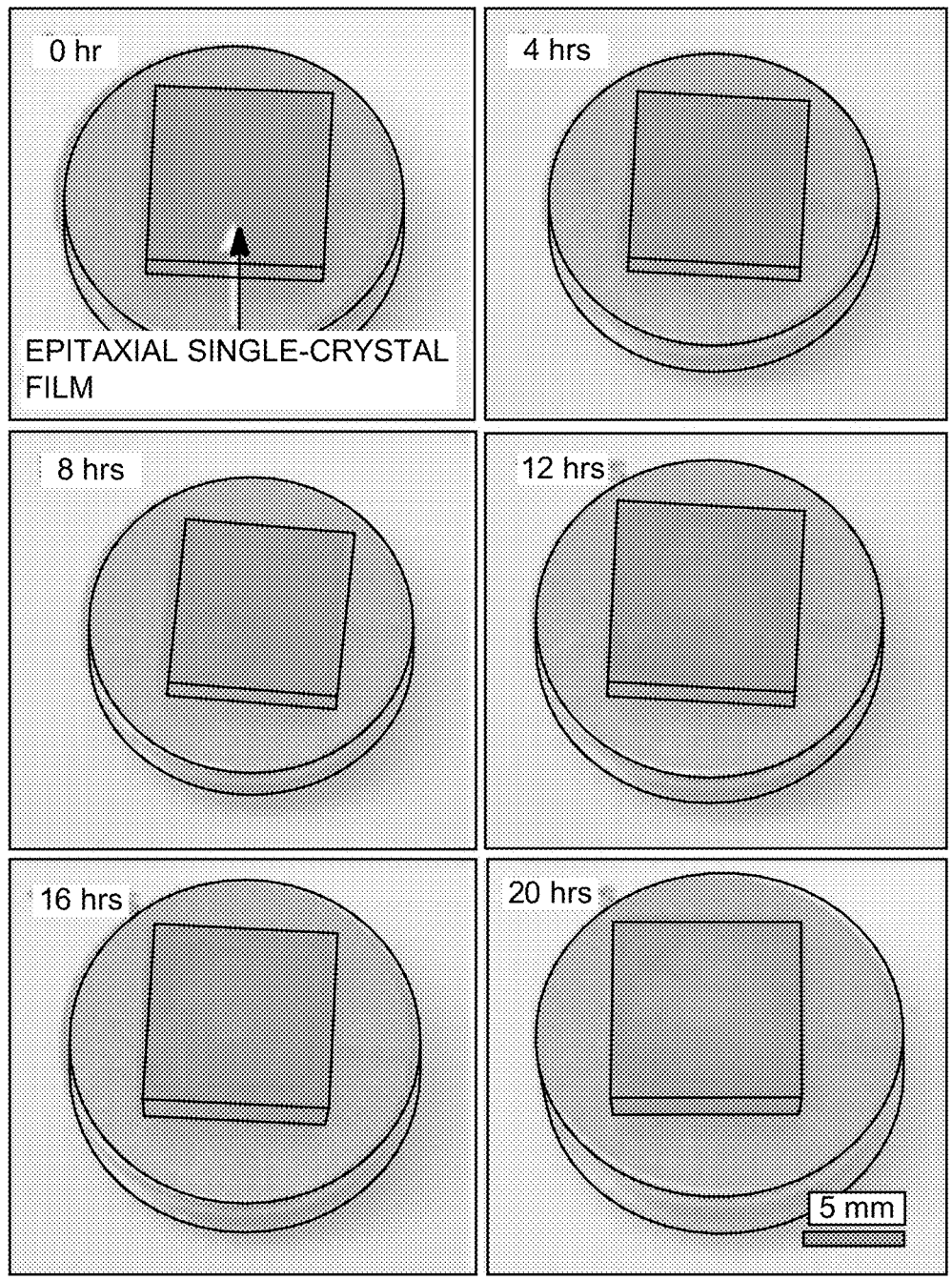
FIG. 33c shows extended monitoring of the single-crystal $MAPb_{0.5}Sn_{0.5}I_3$ film under the same conditions.
Figure 34:
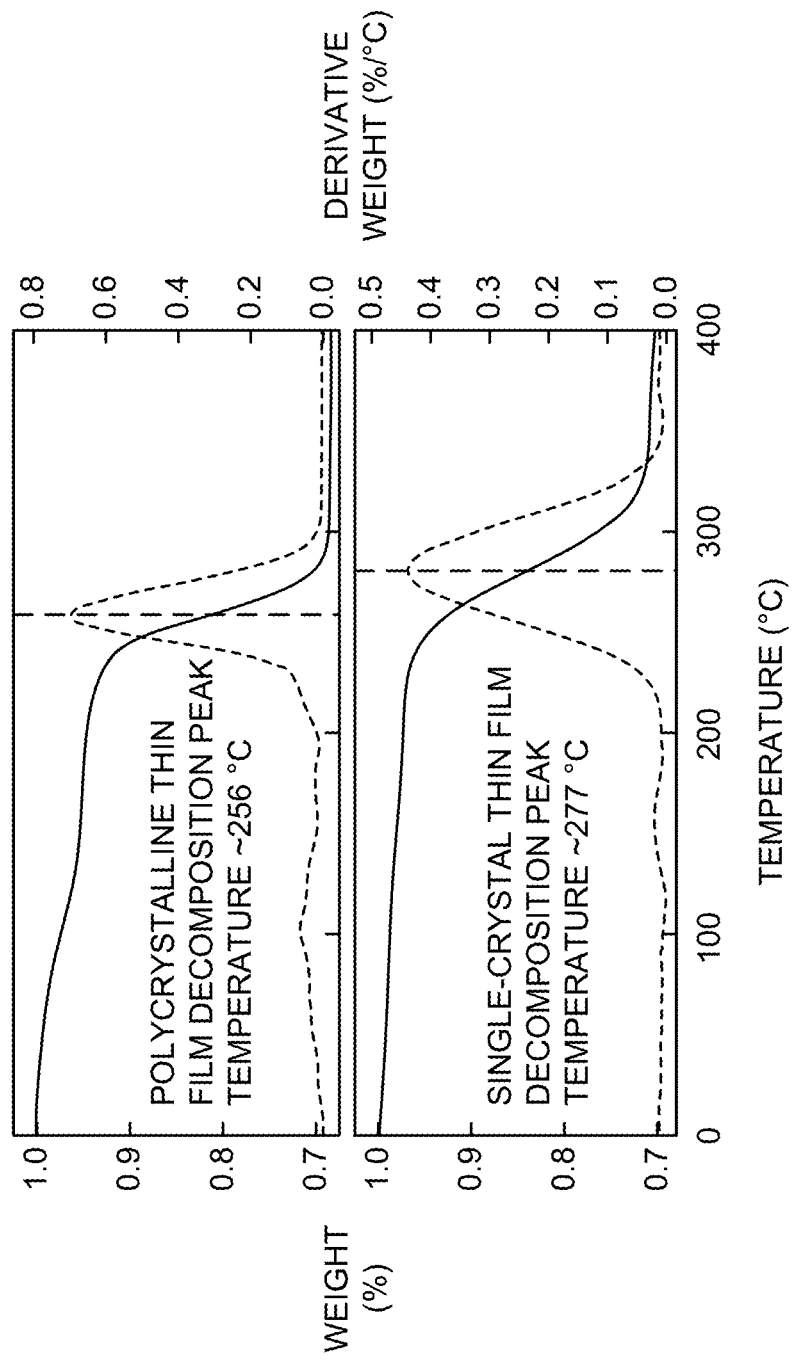
FIG. 34 shows TGA characterizations for the polycrystalline $MAPb_{0.5}Sn_{0.5}I_3$ and the graded single-crystal $MAPb_{0.5+x}Sn_{0.5-x}I_3$ films.
Figure 35A:
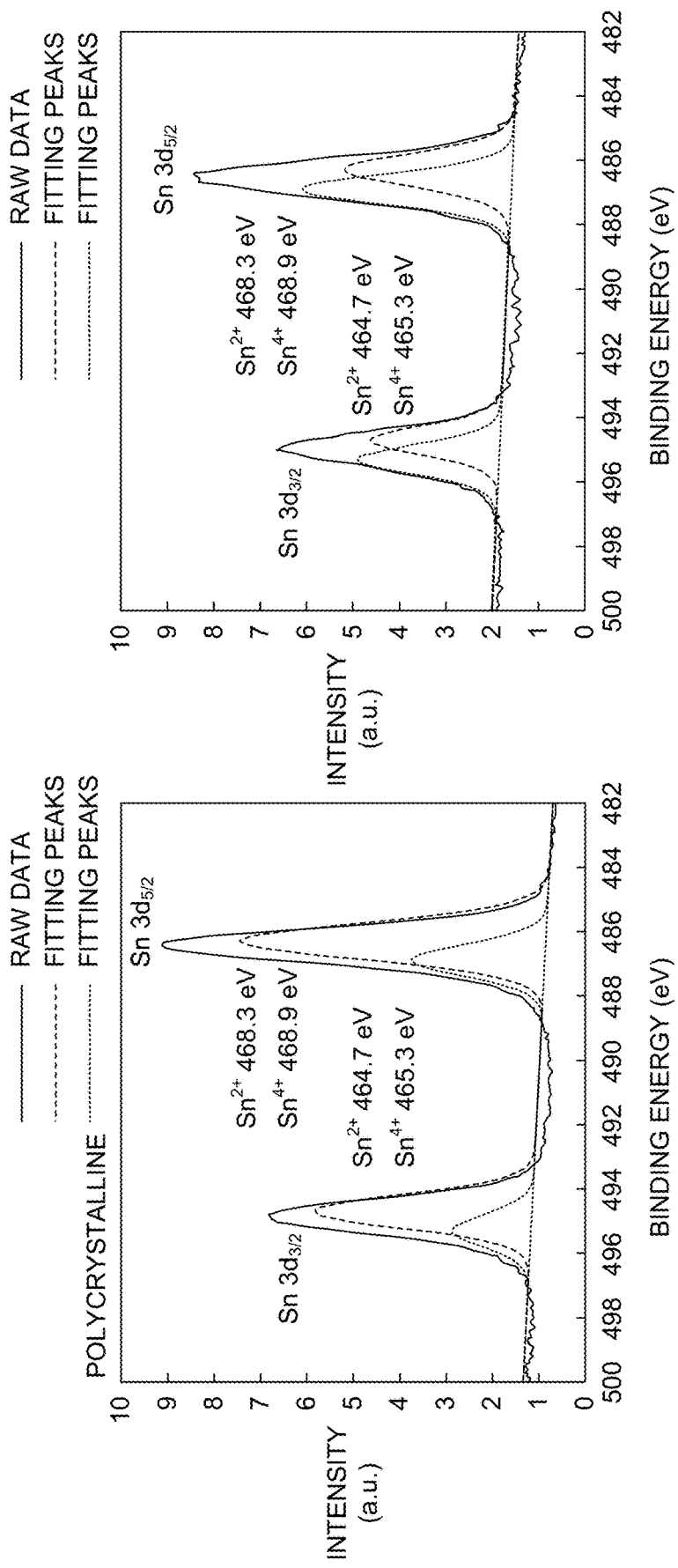
FIG. 35a shows XPS results of freshly prepared polycrystalline $MAPb_{0.5}Sn_{0.5}I_3$ (left) and aged polycrystalline $MAPb_{0.5}Sn_{0.5}I_3$ (right), where strong $Sn^{4+}$ peaks can be fitted.
Figure 35B:
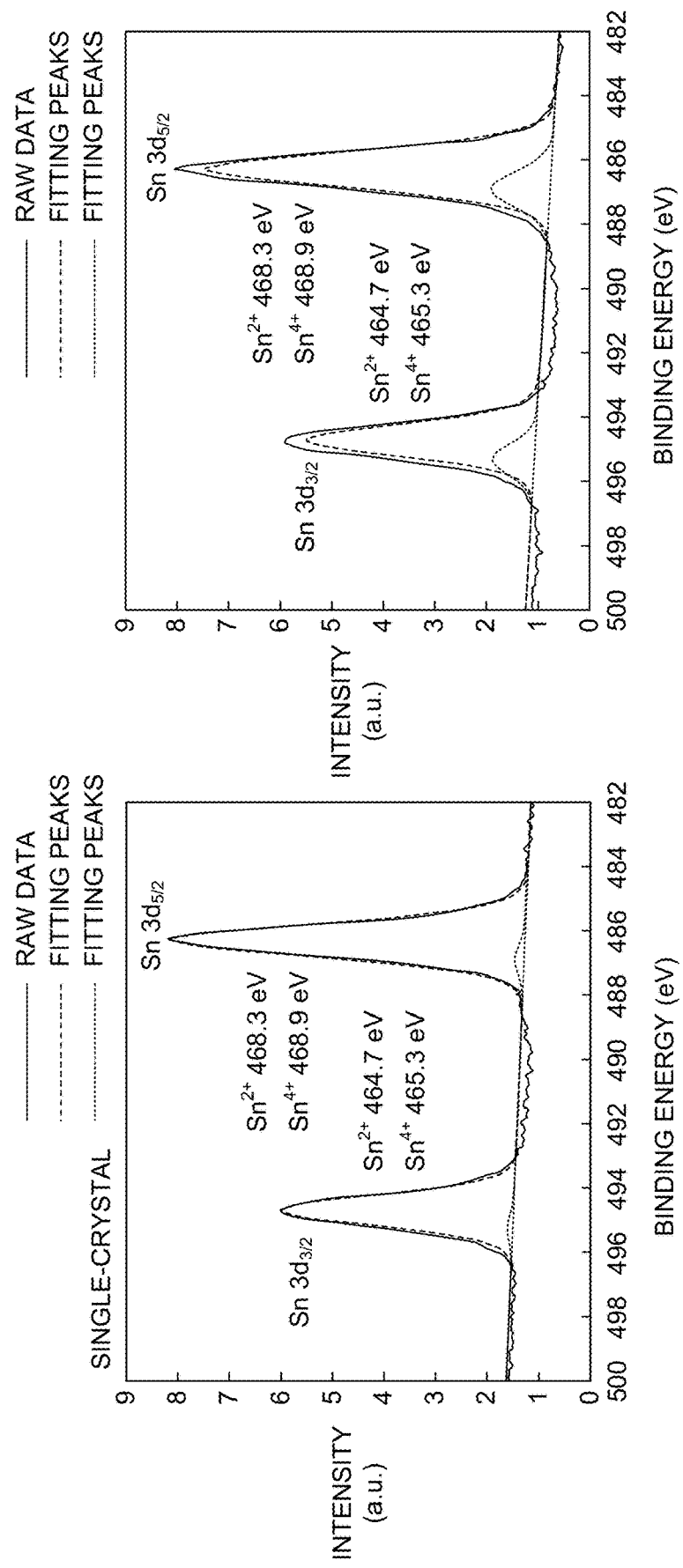
FIG. 35b shows XPS results of freshly prepared single-crystal $MAPb_{0.5}Sn_{0.5}I_3$ (left) and aged single-crystal $MAPb_{0.5}Sn_{0.5}I_3$ (right) under the same conditions

FIG. 32 shows in-situ XPS depth profile studies of different crystal structures. In the single-crystal sample, only the surface areas are easy to be oxidized, indicating the self-doping in deep areas away from the surface is relatively slow. In the polycrystalline sample, the oxidation is much faster in deep areas in comparison with the single-crystal samples, indicating the grain boundaries facilitate the oxidation process. FIG. 33a shows an experimental arrangement for performing thermal and humidity tests. The hot plate temperature is set to be 100° C. The inset schematics show the entire arrangement which gives a qualitative comparison between the polycrystalline $MAPb_{0.5}Sn_{0.5}I_3$ film and the single-crystal $MAPb_{0.5}Sn_{0.5}I_3$ film under hot and humid conditions. FIG. 33b shows that a polycrystalline $MAPb_{0.5}Sn_{0.5}I_3$ film exhibits rapid color change and phase transition while the single-crystal $MAPb_{0.5}Sn_{0.5}I_3$ film remains intact. FIG. 33c shows extended monitoring of the single-crystal $MAPb_{0.5}Sn_{0.5}I_3$ film under the same conditions. The degradation rate of the single crystal is much slower than that of the polycrystalline. FIG. 34 shows TGA characterizations for the polycrystalline $MAPb_{0.5}Sn_{0.5}I_3$ and the graded single-crystal $MAPb_{0.5+x}Sn_{0.5-x}I_3$ films. The results show a faster degradation of the polycrystalline film at a lower decomposition temperature than the single-crystal film. FIG. 35a shows XPS results of freshly prepared polycrystalline $MAPb_{0.5}Sn_{0.5}I_3$ (left) and aged polycrystalline $MAPb_{0.5}Sn_{0.5}I_3$ (right), where strong $Sn^{4+}$ peaks can be fitted. FIG. 35b shows XPS results of freshly prepared single-crystal $MAPb_{0.5}Sn_{0.5}I_3$ (left) and aged single-crystal $MAPb_{0.5}Sn_{0.5}I_3$ (right) under the same conditions, where the intensity of fitted $Sn^{4+}$ peaks are much weaker than those in the polycrystalline samples, indicating that the $Sn^{2+}$ oxidation rate is much slower in the single-crystal than in the polycrystalline.

Additionally, continuous illumination tests can easily degrade the device performance even within a short time by comparing it with the shelf-stability test (FIG. 4f). Therefore, the major degradation mechanism under continuous illumination may not be from the perovskite material, but from the Spiro HTL layer. Even though a small fan is used, the continuous illumination tests can still generate a lot of heat, which accelerates the degradation of the Spiro molecules with thermal and light instability. The Spiro material becomes the bottleneck for the device stability, rather than the perovskites.

Figure 36:
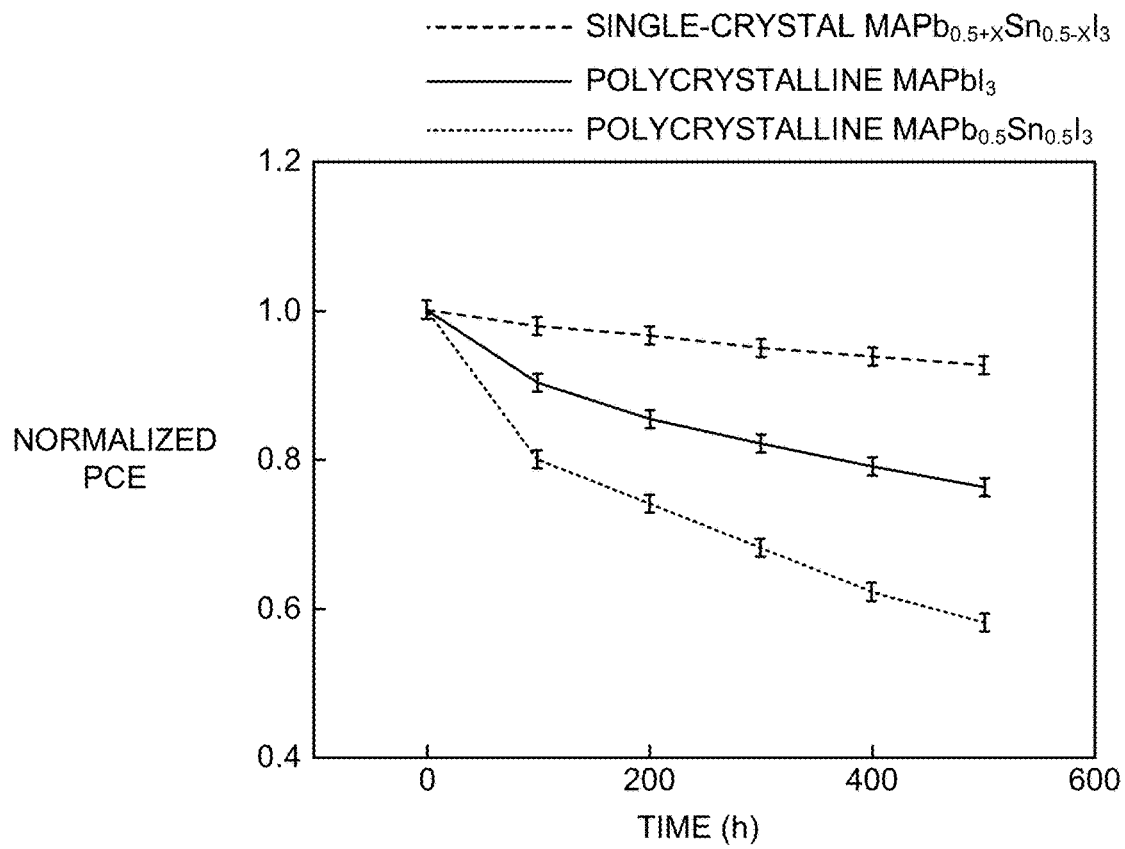
FIG. 36 shows long-time continuous illumination stability tests with PTAA as the HTL layer.

Therefore, the Spiro has been replaced with Poly[bis(4-phenyl)(2,4,6-trimethylphenyl)amine] (PTAA) for the continuous illumination tests again. Device performance using PTAA is not comparable with that using Spiro. Although the $V_{OC}$ is moderate (average ~1.01 V), the F.F. (average ~0.68) and the current density (average ~19-20 $mA/cm^2$) of PTAA based devices are always lower than those of Spiro based devices. Normalized PCE shows a fair comparison among these PTAA based devices. FIG. 36 shows long-time continuous illumination stability tests with the PTAA as the HTL layer. The PTAA-based devices exhibit better thermal and light stability under the continuous illumination condition than the Spiro-based devices. Therefore, the difference between the perovskite structures can be more easily revealed. The single-crystal devices exhibit better device stability than the polycrystalline counterparts.

After replacing the Spiro with PTAA, the differences among those curves are more pronounced, because the HTL becomes less of a bottleneck for the device stability. The single-crystal devices exhibit a much slower degradation rate than those of the polycrystalline devices, indicating that the single-crystal structure has a better stability than the polycrystalline structure. Given the same device structure and the same ETL/HTL, such differences in the stability between single-crystal and polycrystalline devices are considered to be from the reduced ion migration in single crystals. Unlike conventional photovoltaic materials, perovskites are appreciable ionic solids, which can be directly reflected by continuous IV or JV measurements. The ion migration has been shown to contribute to the degradation of perovskite photovoltaics, even though the exact mechanisms are still debatable. For example, reactions between HTL/ETL layers and migrating $I^-$ can cause barriers for carrier injection that quickly decreases the device performance. The ion migration can also lead to the formation of a local electric field in the perovskite material to deprotonate the organic cations. Theoretical calculations predict activation energies of between 0.08 and 0.58 eV for the migration of $I^-$, between 0.46 and 1.12 eV for $MA^+$, and between 0.8 and 2.31 eV for $Pb^{2+}$, respectively. Both anions ($I^-$) and cations ($MA^+$, $Pb^{2+}$) can migrate due to the presence of vacancies, interstitials, and anti-site substitutions. However, because levers of those defects are lower in the single-crystal perovskite than the polycrystalline perovskite, such ion migration and thus device degradation are largely suppressed.

Stability Differences Between Single-Crystal Pb—Sn Photovoltaics and Polycrystalline Pb—Sn Photovoltaics Usually, excessive Sn in Pb—Sn perovskite can significantly lowers the $V_{OC}$, switch the $Sn^{2+}$ oxidation routes, and decrease the decomposition enthalpies to accelerate the material degradation. The oxidative tendency of $Sn^{2+}$ to $Sn^{4+}$ in Sn-based perovskite can rapidly degrade the device as typically seen in the polycrystalline $MAPb_{0.5}Sn_{0.5}I_3$ devices. In this work, the single-crystal $MAPb_{0.5+x}Sn_{0.5-x}I_3$ devices show much better stability than the polycrystalline devices. Several possible reasons for the slower oxidation rate from $Sn^{2+}$ to $Sn^{4+}$ in the single crystal are discussed below.

1. Encapsulation

The device is fully encapsulated in the glove box by both top and bottom polymer layers (PET and PDMS/SU8). Those polymers serve as not only strain releasing layers for enhancing the flexibility, but also as encapsulation layers for keeping the material away from $O_2$ and moisture. The encapsulation may be the most important reason for inhibiting the $Sn^{2+}$ oxidation.

2. Mixed Pb—Sn System

In contrast to the pure Sn-based perovskite photovoltaics, replacing Sn with 50-85% of Pb produces PCEs ranging from 12 to 17% and moderate stability. Even though the exact mechanism is still not very clear, one possible explanation has recently been proposed: the oxidation mechanism in the Pb—Sn system is different from that in the pure Sn system. In pure Sn-based perovskites, the main oxidation product is $SnO_2$ and $SnI_4$. However, by incorporating Pb into Sn-based perovskites, the oxidation proceeds in a different route, and the main I-containing product becomes $I_2$ rather than $SnI_4$ in the case of the pure Sn system.

The formation of $SnI_4$ and $SnO_2$ involves the cooperative action of several Sn—I octahedra, where the I ions bonded to one Sn cation can be transferred onto adjacent Sn cations with which the I was shared. Pb, however, cannot be easily oxidized to $Pb^{4+}$ and is unlikely to form $PbI_4$. Hence, if many of the Sn sites are occupied by Pb, the cooperative mechanism is far less favorable. Instead, $I_2$ is formed, and this requires three times as many Sn—I bonds to be broken, which can be expected to be slow. Therefore, the surrounding Pb atoms can stabilize Sn' and slow down its oxidation. Such an effect will be more pronounced when the percentage of Pb atoms is higher.

Figure 37:
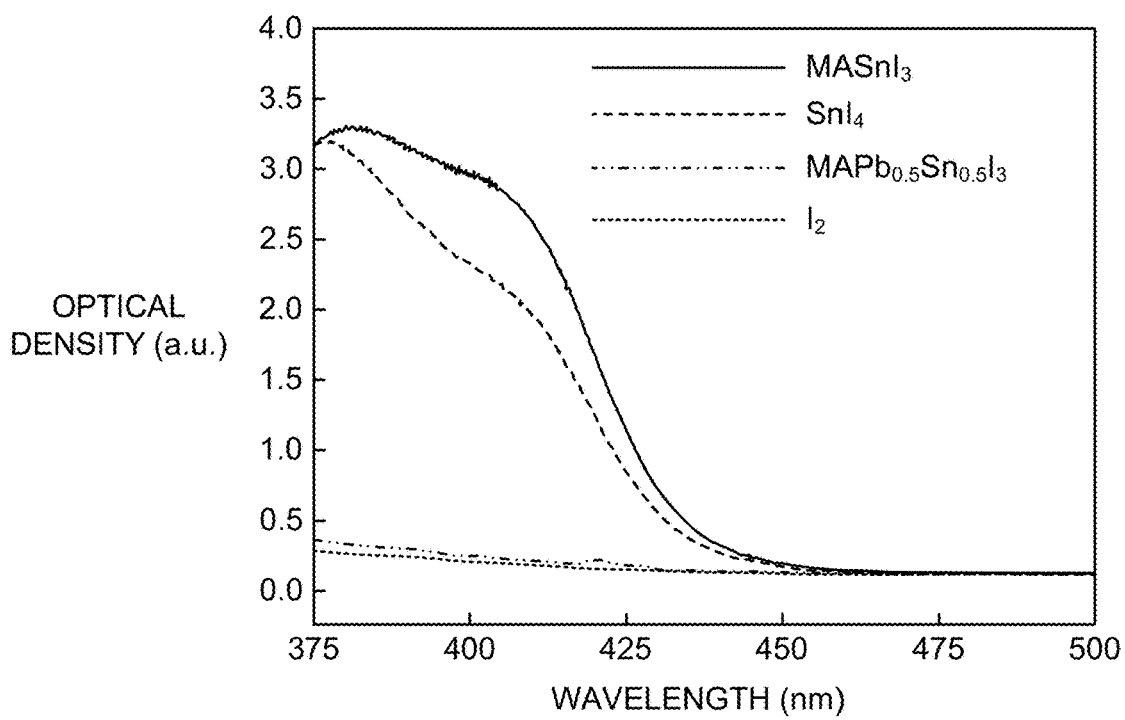
FIG. 37 shows absorption measurements on single-crystal perovskite solutions.

Both experimental and theoretical studies have been carried out to further understand the improved stability in Pb—Sn single-crystal perovskites. Absorption measurements on Pb—Sn based single-crystals and purely Sn-based single-crystals after one-day stress aging under 100° C. are used to understand the oxidation product as well as the chemical degradation route. The samples are dissolved into the GBL solution. The results are in FIG. 37, which shows absorption measurements on single-crystal perovskite solutions. Purely Sn-based single-crystal perovskite and Pb—Sn mixed single-crystal perovskite exhibit different absorption peaks, indicating that the major by-products resulted from oxidations are different. The degradation products for $MASnI_3$ and $MAPb_{0.5}Sn_{0.5}I_3$ are very different: the compound for purely Sn-based perovskite is $SnI_4$, while that of the lead-containing compound is $I_2$. The measured different oxidation products in those two perovskite systems can be explained by different oxidation reaction routes:

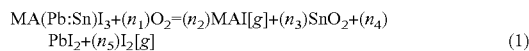

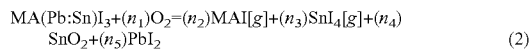

In the purely Sn-based perovskite, because of the strong $SnI_4$ signal in the absorption spectrum, the oxidation mechanism is more likely to be the reaction (2). The reaction (1) is considered to be the mechanism for the Pb—Sn perovskite.

Figure 38:
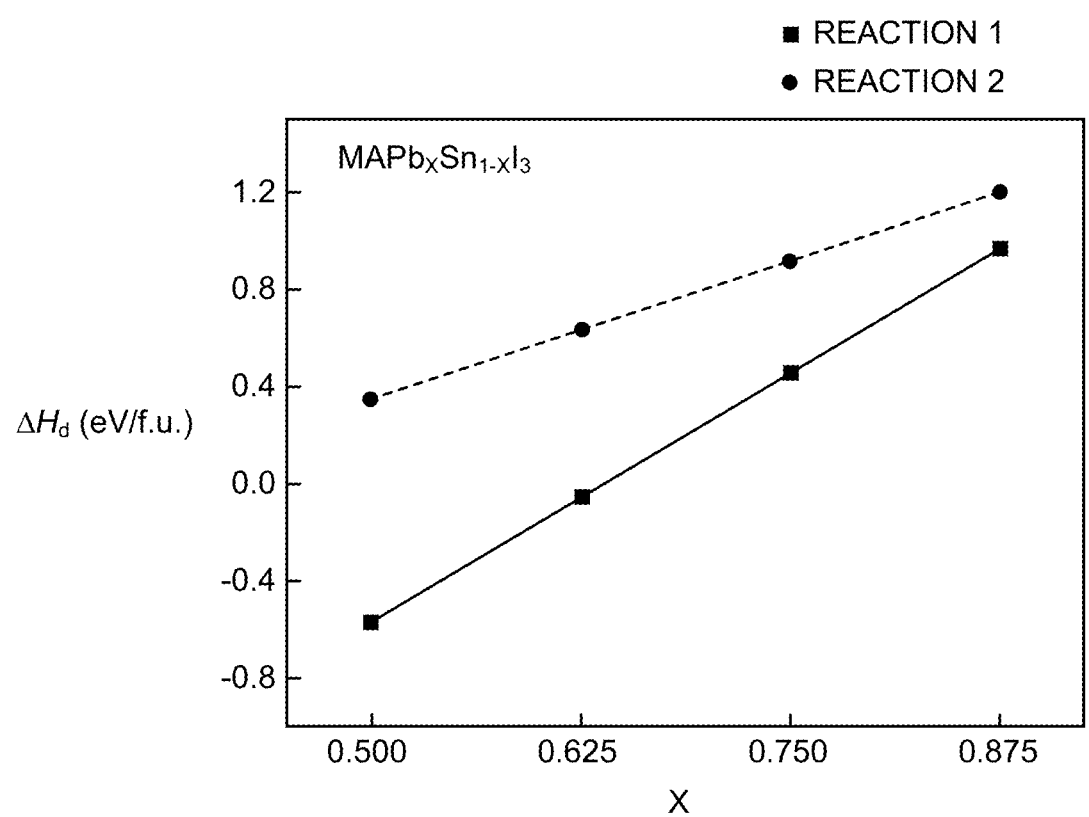
FIG. 38 shows simulation results of decomposition enthalpies of different Pb—Sn ratios.

To further confirm this conclusion, we also calculate the decomposition enthalpies in both reactions with different Pb to Sn ratios. From the calculation results (see FIG. 38, which shows simulation results of decomposition enthalpies of different Pb—Sn ratios), reaction (1) is energetically more favorable than reaction (2) for the Pb—Sn perovskite at any Pb to Sn ratios, indicating that the $Sn^{2+}$ oxidation naturally prefers to happen through reaction (1), where all of the Sn—I bonds need to be broken. Therefore, compared with the purely Sn perovskite, the breaking of Sn—I bonds in the Pb—Sn perovskite is much slower, suggesting that the Pb inclusion can make Sn' oxidation slower in the perovskite.

Figure 39A:
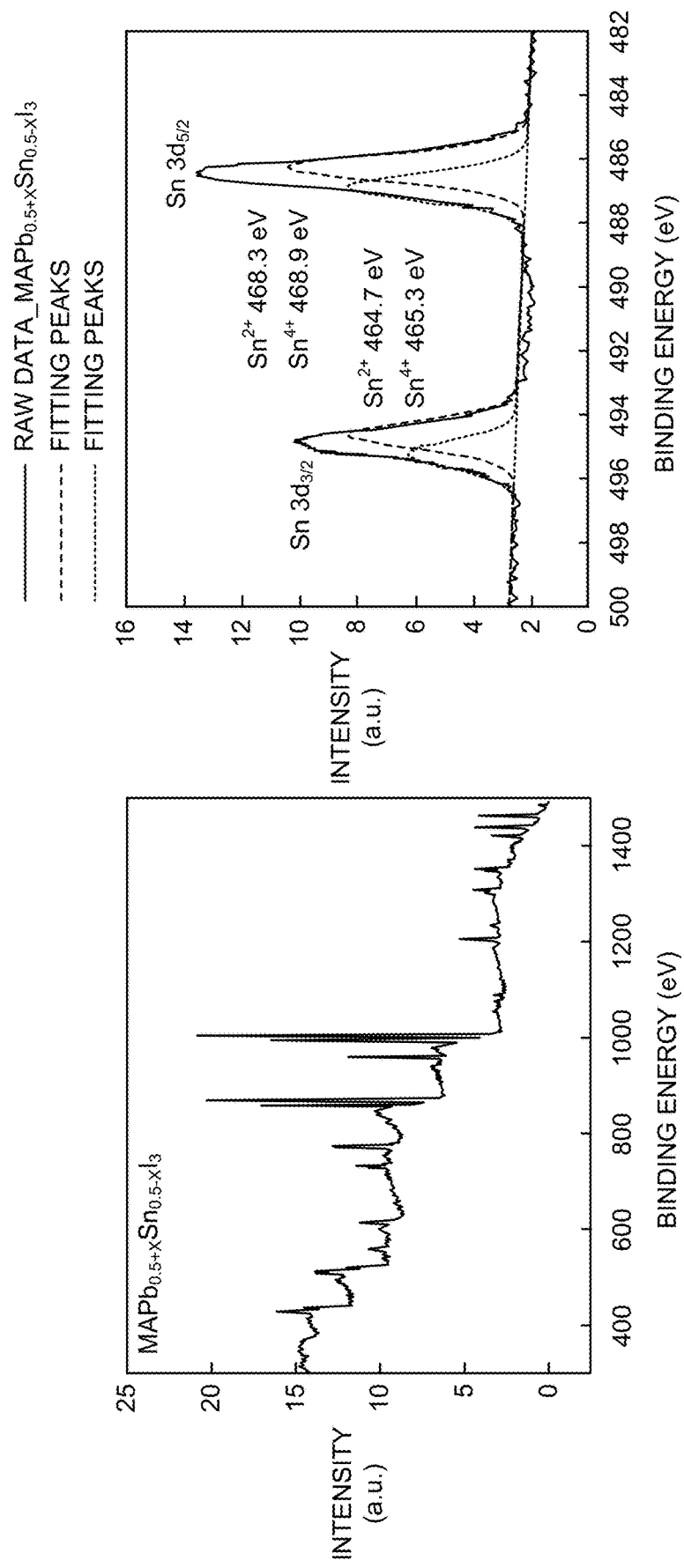
FIG. 39a shows an XPS spectrum measured for single-crystal $MAPb_{0.5+x}Sn_{0.5-x}I_3$ (left) and zoom-in spectrum for typical Sn peaks in single-crystal $MASnI_3$ (right)
Figure 39B:
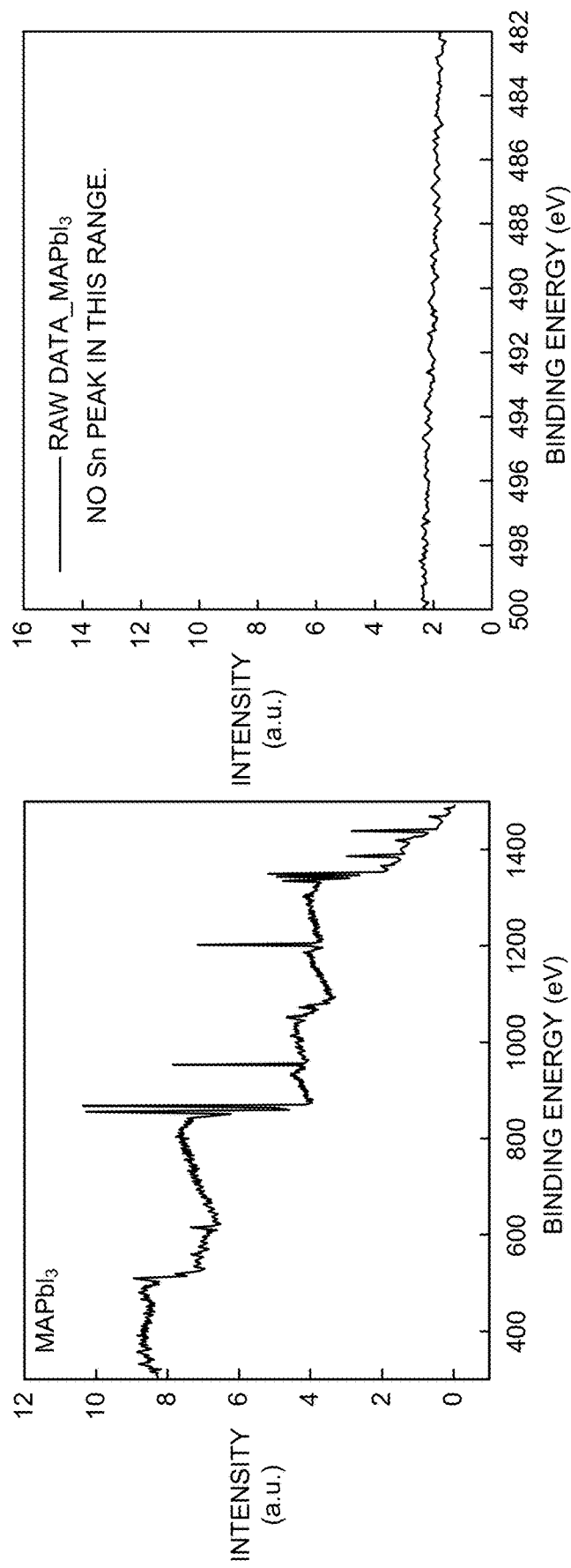
FIG. 39b shows an XPS spectrum measured for a control sample of single-crystal $MAPbI_3$ (left) and zoom-in spectrum for typical Sn peaks in single-crystal $MAPbI_3$ (right)
Figure 39C:
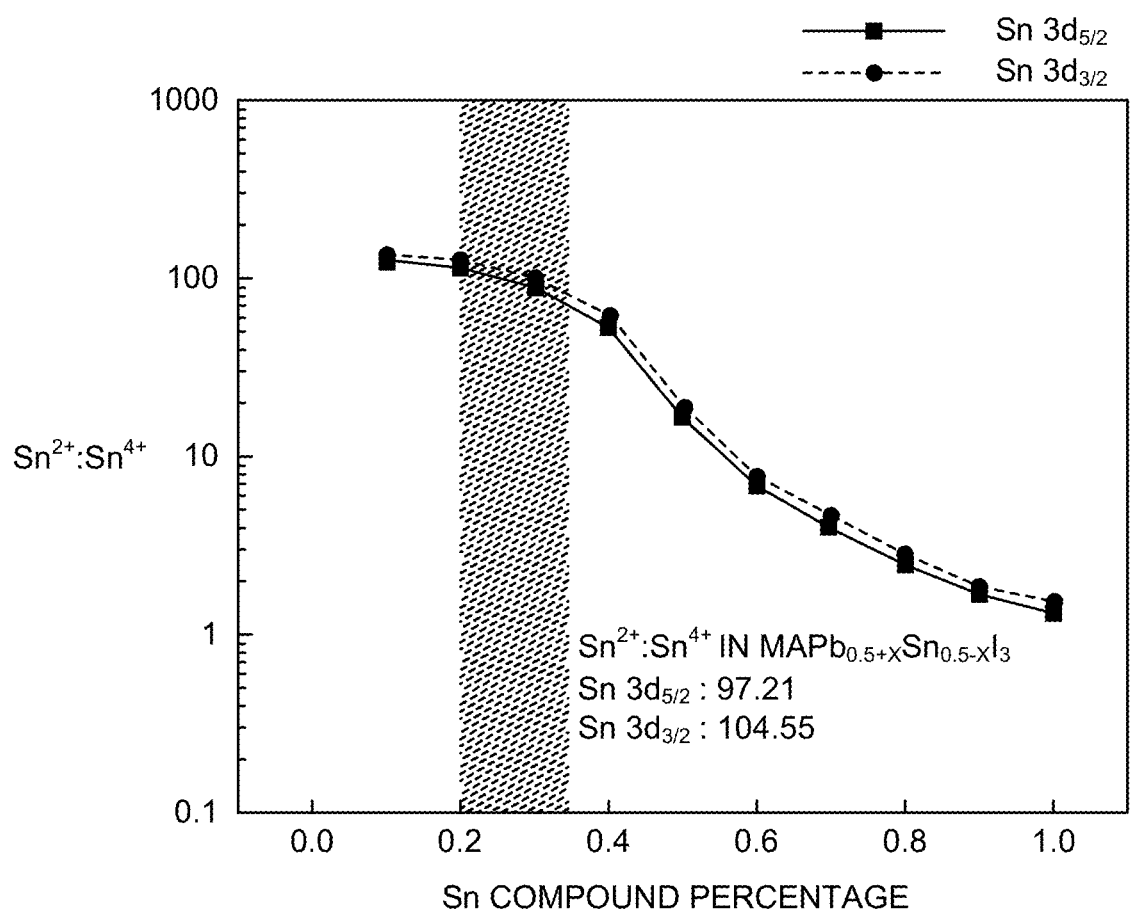
FIG. 39c shows estimated Sn ratios in the single-crystal $MAPb_{0.5+x}Sn_{0.5-x}I_3$.

To even further confirm the conclusion, XPS measurements have been used to study the $Sn^{2+}$ to $Sn^{4+}$ ratio in perovskites to qualify the oxidation speed of $Sn^{2+}$. FIG. 39a shows an XPS spectrum measured for single-crystal $MAPb_{0.5+x}Sn_{0.5-x}I_3$ (left) and zoom-in spectrum for typical Sn peaks in single-crystal $MASnI_3$ (right). Strong $Sn^{2+}$ and $Sn^{4+}$ peaks can be fitted. FIG. 39b shows an XPS spectrum measured for a control sample of single-crystal $MAPbI_3$ (left) and zoom-in spectrum for typical Sn peaks in single-crystal $MAPbI_3$ (right). No Sn peak can be found. FIG. 39c shows estimated Sn ratios in the single-crystal $MAPb_{0.5+x}Sn_{0.5-x}I_3$. The y-axis is the XPS peak ratio of $Sn^{2+}$ to $Sn^{2+}$. We prepared and characterized samples with different Pb—Sn ratios using XPS. Under the same condition (preparation environment, transfer loading time, etc), increasing the Pb ratio can slow down the oxidation rate of Sn'. The shaded region is the estimated real Sn ratio in the graded single-crystal $MAPb_{0.5+x}Sn_{0.5-x}I_3$.

Increasing Pb can dramatically inhibit the oxidation speed of $Sn^{2+}$ in the single-crystal perovskites, which serves as additional evidence for supporting the different oxidation mechanisms between purely Sn and Pb—Sn based perovskites. What's more, we dissolve $MAPb_{0.5+x}Sn_{0.5-x}I_3$ single crystals in GBL and use the solution to prepare the polycrystalline thin film to reveal its composition. By studying the $Sn^{2+}$ to $Sn^{4+}$ ratio using XPS, the Sn ratio should be between 0.2 to 0.3, where the oxidation speed is considered to be much slower than the purely Sn-based perovskite.

3. Single Crystal.

The single-crystal structure is also a major reason for the improved stability, which has been widely proved to have much better stability in solar cells and photodetectors. First, single-crystal perovskites have much lower defect densities than their polycrystalline structures. $I_2$ is believed to be the most critical by-product and will cause self-degradation. The formation of $I_2$ requires ion migration facilitated by structural defects. The well-align lattice structure of single crystals provide much lower possibilities for the formation of $I_2$.

Second, there is no grain boundary in single crystals, which indicates that the reaction routes are heavily inhibited. For the Sn-based polycrystalline perovskite, $O_2$ can relatively easily go through the entire layer via the innumerable grain boundaries. The degradation routes can not only come from the self-doping of $Sn^{4+}$, but also from the grain boundaries facilitated $Sn^{2+}$ oxidation in the entire layer. However, in the single-crystal structure, the $O_2$ can only react with the single crystal surface, and only the formed $Sn^{4+}$ and other impurities can further drive the degradation by self-doping from the surface to the bulk parts. Comparing these two oxidation approaches, we think the self-doping oxidation will be much slower than the direct reaction with $O_2$. Due to the cutoff of the $O_2$ oxidation route, the degradation rate in single-crystals is highly inhibited.

To test this hypothesis, both single-crystal $MAPb_{0.5}Sn_{0.5}I_3$ and polycrystalline $MAPb_{0.5}Sn_{0.5}I_3$ have been measured by XPS. The samples are all prepared in a glove box and are aged under the same environment outside the glove box. FIG. 35a shows XPS results of freshly prepared polycrystalline $MAPb_{0.5}Sn_{0.5}I_3$ (left) and aged polycrystalline $MAPb_{0.5}Sn_{0.5}I_3$ (right), where strong Sn' peaks can be fitted. FIG. 35b shows XPS results of freshly prepared single-crystal $MAPb_{0.5}Sn_{0.5}I_3$ (left) and aged single-crystal $MAPb_{0.5}Sn_{0.5}I_3$ (right) under the same conditions, where the intensity of fitted $Sn^{4+}$ peaks are much weaker than those in the polycrystalline samples, indicating the $Sn^{2+}$ oxidation rate is much slower in the single-crystal than in the polycrystalline. The measured results show that the fresh polycrystalline $MAPb_{0.5}Sn_{0.5}I_3$ exhibits strong $Sn^{4+}$ peaks. Oxidation may have happened during sample transfer and loading. On the other side, the single-crystal $MAPb_{0.5}Sn_{0.5}I_3$ sample shows negligible $Sn^{4+}$ peaks, indicating that the oxidation speed in the single-crystal sample is much slower than that in the polycrystalline. Therefore, the innumerable grain boundaries in the polycrystalline provide direct pathways for the $O_2$ to react with the $Sn^{2+}$. However, in the single-crystal, only the surface part can be oxidized by the $O_2$, and further oxidation of the bulk parts more depends on self-doping, which is much slower than the direct $O_2$ oxidation.

What's more, in-situ XPS depth profile studies by ion milling have also been carried out to further understand the difference between single-crystal $MAPb_{0.5}Sn_{0.5}I_3$ and polycrystalline $MAPb_{0.5}Sn_{0.5}I_3$ (FIG. 32). In the single-crystal sample, the $Sn^{4+}$ is mainly formed at the surface of the single crystal, and the deeper bulk parts still keep $Sn^{2+}$. However, in the polycrystalline, even though the $Sn^{4+}$ ratio in deeper bulk parts is reducing, the oxidation speed is much higher than that in the single-crystal.

To summarize, the rapid oxidation of $Sn^{2+}$ in polycrystalline perovskites is because of the existence of grain boundaries, which provide a direct pathway for the $O_2$ to diffuse through the entire material. Because of the high-quality crystal structure, single-crystal perovskites do not have those direct oxidation pathways, and the self-doping mechanism is determining the oxidation rate, which is much slower than reacting with the $O_2$.

Fabrication of Other Perovskites and Ionic Crystals

While the examples presented above has illustratively illustrated the fabrication techniques and methods described herein as fabricating certain organic-inorganic hybrid perovskite, the solution-based lithography-assisted-epitaxial-growth-transfer method may be used to fabricate not only other organic-inorganic hybrid perovskite, but other perovskites generally. For example, other perovskites that may be fabricated by these techniques and methods include, without limitation, any perovskites having an ABX3 crystal structure. For instance, in halide perovskites, A is a general cation that can be organic or inorganic, B is a metallic cation, and X is a halide anion. As some specific examples, common A-site cations include Cs+, Rb+, K+, methylammonium (MA+), formamidinium (FA+), dimethylammonium (DMA+), ethylammonium (EA+), guanidinium (GUA+), tetramethylammonium (TMA+), tetrabutylammonium (TBA+), and phenylethylammonium (PEA+). Common B-site metallic cations include $Pb^{2+}$, $Mg^{2+}$, $Ca^{2+}$, $Ba^{2+}$, $Mn^{2+}$, $Fe^{2+}$, $Ni^{2+}$, $Cu^{2+}$, $Zn^{2+}$, $Cd^{2+}$, $Ge^{2+}$, $Sn^{2+}$, $Eu^{2+}$, $Tm^{2+}$, and $Yb^{2+}$; Common X-site anions are $Cl^-$, $Br^-$, $I^-$, formate ($HCOO^-$), and $BH4^-$.

In addition to fabricating perovskites, the solution-based lithography-assisted-epitaxial-growth-transfer method described herein may be used to fabricate a wide variety of other ionic crystals. Such ionic crystals include, by way of example, II-VI materials (e.g., ZnO, CdSe, dS), III-V materials (e.g., GaN, GaAs, AlAs, AlGaAs), IV materials (e.g., C, Si, Ge), and metals (e.g., Au, Ag, Cu, Pt, Pd).

Those of ordinary skill will understand that suitable materials such as growth solutions, mask materials, substrates, re-adhesion materials and the like will vary depending on the particular ionic crystal to be fabricated and may be selected as appropriate for the particular ionic crystal. It is understood that the particular materials and fabrication parameters shown herein are presented for illustrative purposes only and that various modifications or changes in light thereof, including but not limited to the fabrication of other ionic crystals such as those described above, may be suggested to persons skilled in the art and are included within the spirit and purview of this application and scope of the appended claims.

The invention claimed is:

1. A method of fabricating an ionic crystal, comprising:
   providing a single crystal substrate of an ionic crystal material;
   applying a patterned mask over the single crystal substrate;
   introducing a growth solution over the single crystal substrate, the growth solution including precursors for epitaxial growth of the ionic crystal material on the single crystal substrate such that epitaxial crystals grow over time through pattern openings in the patterned mask into a crystal structure with one or more morphologies;
   removing from the growth solution the patterned mask and the crystal structure grown on the substrate as an assembled unit; and
   detaching the single crystal substrate from the patterned mask and the crystal structure so that a subassembly of the patterned mask and the crystal structure remains;
   applying an antisolvent to a surface of the second substrate or a surface of the crystal structure prior to transferring and
   transferring the subassembly onto a second substrate.

2. The method of claim 1 further comprising removing the patterned mask from the subassembly so that the crystal structure remains attached to the second substrate.

3. The method of claim 1 further comprising applying a layer of the growth solution onto a surface of the second substrate prior to the transferring.

4. The method of claim 3 further comprising heating the second substrate after the transferring to facilitate a secondary re-growth process of crystals from the growth solution.

5. The method of claim 1 further comprising changing a concentration of the precursors in the growth solution while the crystal structure is growing to thereby form a compositionally graded crystal structure.

6. The method of claim 5 wherein the concentration of the precursors is continuously changed during at least a portion of time that the crystal structure is growing.

7. The method of claim 1 wherein the ionic crystal material includes a perovskite.

8. The method of claim 7 wherein the perovskite includes an organic-inorganic hybrid perovskite.

9. The method of claim 1 further comprising adjusting a rate of growth of the crystals in different directions by adjusting a growth capping agent, growth temperature, and/or a concentration of the precursors.

10. The method of claim 1 wherein the growth solution is a supersaturated growth solution.

11. The method of claim 1 wherein the patterned mask is formed from a polymer or metal.

12. The method of claim 1 wherein the patterned mask is flexible.

13. The method of claim 1 wherein the patterned mask is rigid.

14. The method of claim 1 wherein the one or more morphologies of the crystal structure are selected from the group consisting of a thin film, a cubic structure and a pyramidal structure.

15. A method of fabricating an ionic crystal, comprising:
   providing a single crystal substrate of an ionic crystal material;
   applying a patterned mask over the single crystal substrate;
   introducing a growth solution over the single crystal substrate, the growth solution including precursors for epitaxial growth of the ionic crystal material on the single crystal substrate such that epitaxial crystals grow over time through pattern openings in the patterned mask into a crystal structure with one or more morphologies;
   changing a concentration of the precursors in the growth solution while the crystal structure is growing to thereby form a compositionally graded crystal structure; and removing from the growth solution the patterned mask and the crystal structure grown on the substrate as an assembled unit.

16. A method of fabricating an ionic crystal, comprising:

providing a single crystal substrate of an ionic crystal material;

applying a patterned mask over the single crystal substrate, wherein the patterned mask is rigid;

introducing a growth solution over the single crystal substrate, the growth solution including precursors for epitaxial growth of the ionic crystal material on the single crystal substrate such that epitaxial crystals grow over time through pattern openings in the patterned mask into a crystal structure with one or more morphologies; and removing from the growth solution the patterned mask and the crystal structure grown on the substrate as an assembled unit.

* * * * *